US008598305B2

(12) United States Patent
Facchetti et al.

(10) Patent No.: US 8,598,305 B2
(45) Date of Patent: Dec. 3, 2013

(54) CONJUGATED POLYMERS AND DEVICES INCORPORATING SAME

(75) Inventors: Antonio Facchetti, Chicago, IL (US); Tobin J. Marks, Evanston, IL (US); Hui Huang, Evanston, IL (US); Zhihua Chen, Skokie, IL (US)

(73) Assignees: Northwestern University, Evanston, IL (US); Polyera Corporation, Skokie, IL (US)

( * ) Notice: Subject to any disclaimer, the term of this patent is extended or adjusted under 35 U.S.C. 154(b) by 221 days.

(21) Appl. No.: 13/048,603

(22) Filed: Mar. 15, 2011

(65) Prior Publication Data
US 2011/0232764 A1 Sep. 29, 2011

Related U.S. Application Data

(60) Provisional application No. 61/317,607, filed on Mar. 25, 2010.

(51) Int. Cl.
*C08G 75/00* (2006.01)

(52) U.S. Cl.
USPC ............... 528/377; 528/380; 528/370; 528/9; 136/263; 526/256; 526/243; 257/40; 257/E51.025

(58) Field of Classification Search
USPC ............. 528/377, 380, 370, 9; 136/263; 526/256, 243; 257/40, E51.025
See application file for complete search history.

(56) References Cited

U.S. PATENT DOCUMENTS 5,162,473 A   11/1992 Jen et al.
2011/0108824 A1*  5/2011 Heun et al. ............ 257/40

OTHER PUBLICATIONS

Fu et al. (PMSE, 72, 315-316, 1995).*
He et al., "Poly(3,6-dihexyl-thieno[3,2-b]thiophene vinylene): Synthesis, Field-Effect Transistors, and Photovoltaic Properties," *Macromolecules*, 41:9760-9766 (2008).
Lim et al., "A New Poly(thienylenevinylene) Derivative with High Mobility and Oxidative Stability for Organic Thin-Film Transistors and Solar Cells," *Adv. Mater.*, 21:2808-2814 (2009).

* cited by examiner

*Primary Examiner* — Shane Fang
(74) *Attorney, Agent, or Firm* — Karen K. Chan

(57) ABSTRACT

Disclosed are conjugated polymers having desirable properties as semiconducting materials. Such polymers can exhibit desirable electronic properties and possess processing advantages including solution-processability and/or good stability.

20 Claims, 5 Drawing Sheets

CONJUGATED POLYMERS AND DEVICES INCORPORATING SAME

CROSS REFERENCE TO RELATED APPLICATIONS

This application claims priority to and the benefit of U.S. Provisional Patent Application Serial No. 61/317,607, filed on Mar. 25, 2010, the disclosure of which is incorporated by reference herein in its entirety.

STATEMENT REGARDING FEDERALLY SPONSORED RESEARCH OR DEVELOPMENT

This invention was made with government support under Grant No. FA9550-08-1-0331 awarded by the Air Force Office of Scientific Research. The government has certain rights in the invention.

BACKGROUND

A new generation of optoelectronic devices such as organic photovoltaic (OPV) devices, organic light emitting transistors (OLETs), organic light emitting diodes (OLEDs), organic thin film transistors (OTFTs), printable circuits, electrochemical capacitors, and sensors are built upon organic semiconductors as their active components. To enable high device efficiencies such as large charge carrier mobilities ($\mu$) needed for transistor/circuit operations, or efficient exciton formation/splitting that is necessary for OLED/OPV operations, it is desirable that both p-type and n-type organic semiconductor materials are available. Furthermore, these organic semiconductor-based devices should exhibit satisfactory stability in ambient conditions and should be processable in a cost-effective manner. For example, a benchmark polymer, regioregular poly(3-hexylthiophene) (rr-P3HT), can provide hole mobilities of about 0.1 $cm^2/Vs$ and current modulation of about $10^5$ or greater, which is close to amorphous silicon. For OPV devices based on rr-P3HT, power conversion efficiencies (PCEs) as high as about 4% have been reported. However, such impressive performances are achieved only under strict device processing conditions.

Accordingly, the art desires new organic semiconductor materials, particularly those that can have good charge transport characteristics, tunable energy level, processing properties, and stability in ambient conditions.

SUMMARY

In light of the foregoing, the present teachings provide organic semiconductor materials that are prepared from polymeric compounds that include 1,2-dialkoxyethenyl moieties. Also provided are associated devices and related methods for the preparation and use of these compounds. The present compounds can exhibit properties such as excellent charge transport characteristics in ambient conditions, chemical stability, low-temperature processability, large solubility in common solvents, and processing versatility (e.g., via various solution processes). As a result, organic photovoltaic devices based on these materials can exhibit excellent performance properties, such as large PCEs, large open circuit voltage ($V_{oc}$), large short circuit current ($J_{sc}$), and chemical stability. Furthermore, field effect devices such as thin film transistors that incorporate one or more of the present compounds as the semiconductor layer can exhibit high performance in ambient conditions, for example, demonstrating one or more of large charge carrier mobilities, low threshold voltages, and high current on-off ratios. Similarly, other organic semiconductor-based devices such as OLETs, and OLEDs can be fabricated efficiently using the organic semiconductor materials described herein.

The present teachings also provide methods of preparing such compounds and semiconductor materials, as well as various compositions, composites, and devices that incorporate the compounds and semiconductor materials disclosed herein.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

DETAILED DESCRIPTION

Figure 1:
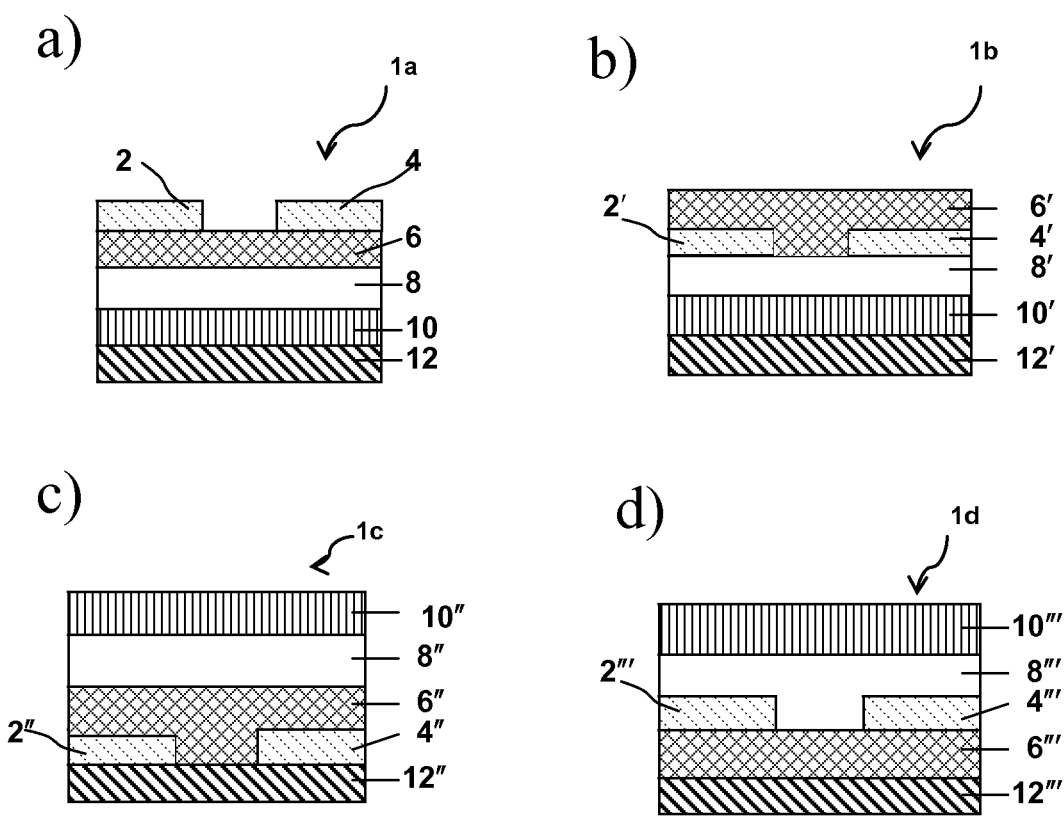
FIG. 1 illustrates four different configurations of thin film transistors: bottom-gate top contact (*a*), bottom-gate bottom-contact (*b*), top-gate bottom-contact (*c*), and top-gate top-contact (*d*); each of which can be used to incorporate compounds of the present teachings.

The present teachings provide organic semiconductor materials that are prepared from polymeric compounds having 1,2-dialkoxyethenyl moieties. Compounds of the present teachings can exhibit semiconductor behavior such as high carrier mobility and/or good current modulation characteristics in a field-effect device, light absorption/charge separation in a photovoltaic device, and/or charge transport/recombination/light emission in a light-emitting device. In addition, the present compounds can possess certain processing advantages such as solution-processability and/or good stability (for example, air stability) in ambient conditions. The compounds of the present teachings can be used to prepare either p-type or n-type semiconductor materials, which in turn can be used to fabricate various organic electronic articles, structures and devices, including field-effect transistors, unipolar circuitries, complementary circuitries, photovoltaic devices, and light emitting devices.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "polymeric compound" (or "polymer") refers to a molecule including a plurality of one or more repeating units connected by covalent chemical bonds. As used herein, a repeating unit in a polymer must repeat itself at least twice (as specified by its degree of polymerization) in the polymer. A polymer can be represented by the general formula:

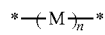

wherein M is the repeating unit or monomer. The degree of polymerization (n) can range from 2 to greater than 10,000, typically in the range from 5 to about 10,000. The polymer can have only one type of repeating unit as well as two or more types of different repeating units. When a polymer has only one type of repeating unit, it can be referred to as a homopolymer. When a polymer has two or more types of different repeating units, the term "copolymer" can be used instead. The polymer can be linear or branched. Branched polymers can include dendritic polymers, such as dendronized polymers, hyperbranched polymers, brush polymers (also called bottle-brushes), and the like. Unless specified otherwise, the assembly of the repeating units in a copolymer can be head-to-tail, head-to-head, or tail-to-tail. In addition, unless specified otherwise, the copolymer can be a random copolymer, an alternating copolymer, or a block copolymer. For example, the general formula:

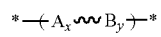

can be used to represent a copolymer of A and B having x mole fraction of A and y mole fraction of B in the copolymer, where the manner in which comonomers A and B is repeated can be alternating, random, regiorandom, regioregular, or in blocks.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and can be optionally substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which can be optionally substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which can be optionally substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and can include polycyclic aromatic hydrocarbons such as rylenes (or analogs thereof containing one or more heteroatoms) having the formula:

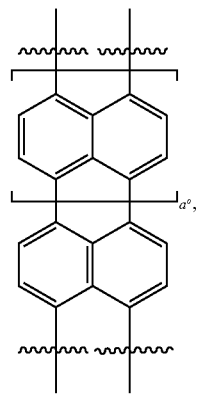

where a° can be an integer in the range of 0-3; coronenes (or analogs thereof containing one or more heteroatoms) having the formula:

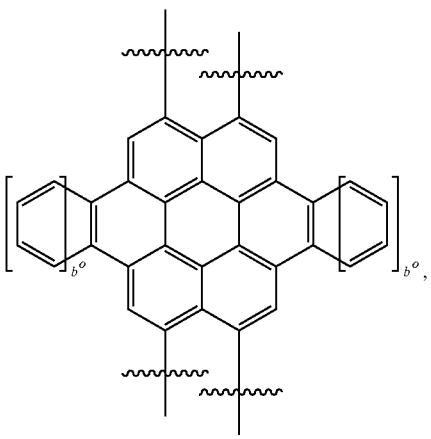

where b° can be an integer in the range of 0-3; and linear acenes (or analogs thereof containing one or more heteroatoms) having the formula:

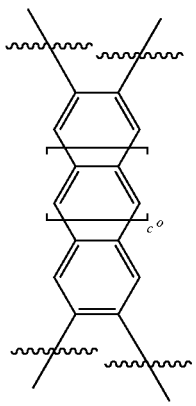

where c° can be an integer in the range of 0-4. The fused ring moiety can be optionally substituted as described herein.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tent-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tent-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula —$C_sH_{2s+1-t}X°_t$, where $X°$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxy, hexoxy groups, and the like. The alkyl group in the —O-alkyl group can be substituted as described herein. For example, an —O-haloalkyl group is considered within the definition of "alkoxy" as used herein.

As used herein, "alkylthio" refers to an —S-alkyl group (which, in some cases, can be expressed as —$S(O)_w$-alkyl, wherein w is 0). Examples of alkylthio groups include, but are not limited to, methylthio, ethylthio, propylthio (e.g., n-propylthio and isopropylthio), t-butylthio, pentylthio, hexylthio groups, and the like. The alkyl group in the —S—alkyl group can be substituted as described herein.

As used herein, "arylalkyl" refers to an -alkyl-aryl group, where the arylalkyl group is covalently linked to the defined chemical structure via the alkyl group. An arylalkyl group is within the definition of a —Y—$C_{6-14}$ aryl group, where Y is defined as a divalent alky group that can be optionally substituted as described herein. An example of an arylalkyl group is a benzyl group (—$CH_2$—$C_6H_5$). An arylalkyl group can be optionally substituted, i.e., the aryl group and/or the alkyl group, can be substituted as disclosed herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

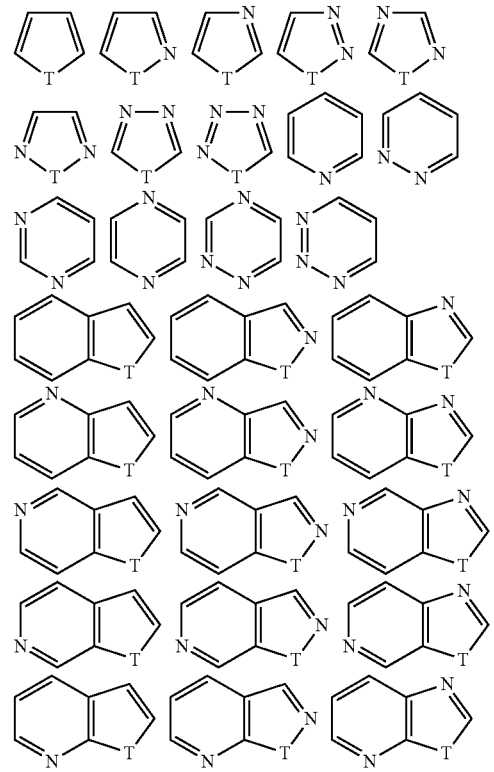

where T is O, S, NH, N-alkyl, N-aryl, N-(arylalkyl) (e.g., N-benzyl), $SiH_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group). a divalent $C_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

The electron-donating or electron-withdrawing properties of several hundred of the most common substituents, reflecting all common classes of substituents have been determined, quantified, and published. The most common quantification of electron-donating and electron-withdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electron-acceptor" refers to a functional group that draws electrons to itself more than a hydrogen atom would if it occupied the same position in a molecule. Examples of electron-withdrawing groups include, but are not limited to, halogen or halo (e.g., F, Cl, Br, I), —$NO_2$,— CN, —NC, —$S(R^0)_2{}^+$, —$N(R^0)_3{}^+$, —$SO_3H$, —$SO_2R^0$, —$SO_3R^0$, —$SO_2NHR^0$, —$SO_2N(R^0)_2$, —COOH, —$COR^0$, —$COOR^0$, —$CONHR^0$, —$CON(R^0)_2$, $C_{1-40}$ haloalkyl groups, $C_{6-14}$ aryl groups, and 5-14 membered electron-poor heteroaryl groups; where $R^0$ is a $C_{1-20}$ alkyl group, a $C_{2-20}$ alkenyl group, a $C_{2-20}$ alkynyl group, a $C_{1-20}$ haloalkyl group, a $C_{1-20}$ alkoxy group, a $C_{6-14}$ aryl group, a $C_{3-14}$ cycloalkyl group, a 3-14 membered cycloheteroalkyl group, and a 5-14 membered heteroaryl group, each of which can be optionally substituted as described herein. For example, each of the $C_{1-20}$ alkyl group, the $C_{2-20}$ alkenyl group, the $C_{2-20}$ alkynyl group, the $C_{1-20}$ haloalkyl group, the $C_{1-20}$ alkoxy group, the $C_{6-14}$ aryl group, the $C_{3-14}$ cycloalkyl group, the 3-14 membered cycloheteroalkyl group, and the 5-14 membered heteroaryl group can be optionally substituted with 1-5 small electron-withdrawing groups such as F, Cl, Br, —$NO_2$, —CN,)) —NC, —$S(R^0)_2{}^+$, —$N(R^0)_3{}^+$, —$SO_3H$, —$SO_2R^0$, —$SO_3R^0$, —$SO_2NHR^0$, —$SO_2N(R^0)_2$, —COOH, —$COR^0$, —$COOR^0$, —$CONHR^0$, and —$CON(R^0)_2$.

It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include —OH, —$OR^0$, —$NH_2$, —$NHR^0$, —$N(R^0)_2$, and 5-14 membered electron-rich heteroaryl groups, where $R^0$ is a $C_{1-20}$ alkyl group, a $C_{2-20}$ alkenyl group, a $C_{2-20}$ alkynyl group, a $C_{6-14}$ aryl group, or a $C_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine. Mixed heteroaromatic rings can belong to either class depending on the type, number, and position of the one or more heteroatom(s) in the ring. See Katritzky, A. R and Lagowski, J. M., *Heterocyclic Chemistry* (John Wiley & Sons, New York, 1960).

At various places in the present specification, substituents are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Compounds described herein can contain an asymmetric atom (also referred as a chiral center) and some of the compounds can contain two or more asymmetric atoms or centers, which can thus give rise to optical isomers (enantiomers) and diastereomers (geometric isomers). The present teachings include such optical isomers and diastereomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of compounds containing alkenyl moieties (e.g., alkenes, azo, and imines). It also should be understood that the compounds of the present teachings encompass all possible regioisomers in pure form and mixtures thereof. In some embodiments, the preparation of the present compounds can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide ($N_3$), thiocyanate (SCN), nitro ($NO_2$), cyanate (CN), water ($H_2O$), ammonia ($NH_3$), and sulfonate groups (e.g., $OSO_2$—R, wherein R can be a $C_{1-10}$ alkyl group or a $C_{6-14}$ aryl group each optionally substituted with 1-4 groups independently selected from a $C_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

As used herein, a "p-type semiconductor material" or a "p-type semiconductor" refers to a semiconductor material having holes as the majority current or charge carriers. In some embodiments, when a p-type semiconductor material is deposited on a substrate, it can provide a hole mobility in excess of about $10^{-5}$ $cm^2/Vs$. In the case of field-effect devices, a p-type semiconductor can also exhibit a current on/off ratio of greater than about 10.

As used herein, an "n-type semiconductor material" or an "n-type semiconductor" refers to a semiconductor material having electrons as the majority current or charge carriers. In some embodiments, when an n-type semiconductor material is deposited on a substrate, it can provide an electron mobility in excess of about $10^{-5}$ $cm^2/Vs$. In the case of field-effect devices, an n-type semiconductor can also exhibit a current on/off ratio of greater than about 10.

As used herein, "mobility" refers to a measure of the velocity with which charge carriers, for example, holes (or units of positive charge) in the case of a p-type semiconductor material and electrons in the case of an n-type semiconductor material, move through the material under the influence of an electric field. This parameter, which depends on the device architecture, can be measured using a field-effect device or space-charge limited current measurements.

As used herein, fill factor (FF) is the ratio (given as a percentage) of the actual maximum obtainable power, ($P_m$ or $V_{mp}*J_{mp}$), to the theoretical (not actually obtainable) power, ($J_{sc} \times V_{oc}$). Accordingly, FF can be determined using the equation:

$$FF = (V_{mp}*J_{mp})/(J_{sc}*V_{oc})$$

where $J_{mp}$ and $V_{mp}$ represent the current density and voltage at the maximum power point ($P_m$), respectively, this point being obtained by varying the resistance in the circuit until J*V is at its greatest value; and $J_{sc}$ and $V_{oc}$ represent the short circuit current and the open circuit voltage, respectively. Fill factor is a key parameter in evaluating the performance of solar cells. Commercial solar cells typically have a fill factor of about 0.60% or greater.

As used herein, the open-circuit voltage ($V_{oc}$) is the difference in the electrical potentials between the anode and the cathode of a device when there is no external load connected.

As used herein, the power conversion efficiency (PCE) of a solar cell is the percentage of power converted from absorbed light to electrical energy. The PCE of a solar cell can be calculated by dividing the maximum power point ($P_m$) by the input light irradiance (E, in $W/m^2$) under standard test conditions (STC) and the surface area of the solar cell ($A_c$ in $m^2$). STC typically refers to a temperature of 25° C. and an irradiance of 1000 $W/m^2$ with an air mass 1.5 (AM 1.5) spectrum.

As used herein, a component (such as a thin film layer) can be considered "photoactive" if it contains one or more compounds that can absorb photons to produce excitons for the generation of a photocurrent.

Throughout the specification, structures may or may not be presented with chemical names. Where any question arises as to nomenclature, the structure prevails.

In one aspect, the present teachings relate to polymeric semiconducting compounds, as well as the use of these compounds in electronic, optoelectronic, or optical devices. The polymeric compounds according to the present teachings generally include at least one repeating unit that includes a 1,2-dialkoxyethenyl moiety in the polymer backbone. For example, such polymeric compounds typically include a repeating unit $M^1$ having the formula:

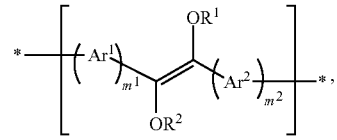

wherein:
$R^1$ and $R^2$, independently can be a $C_{1-20}$ alkyl group or a $C_{1-20}$ haloalkyl group;
$Ar^1$ and $Ar^2$, independently can be an optionally substituted conjugated cyclic moiety; and
$m^1$ and $m^2$, independently can be 1, 2, 3 or 4.

While conjugated polymers including ethenyl linker groups have been used as semiconducting materials, attempts to functionalize the ethenyl groups (for example, with one or more alkyl groups) often result in steric hindrance and lead to undesirable twisting about the ethylenic double bond. Surprisingly, the inventors have discovered that where the ethenyl group is trans-substituted with two alkoxy groups, the repeating unit $M^1$

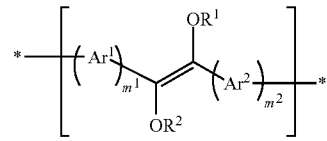

has a substantially planar structure. Without wishing to be bound to any particular theory, it is believed that the planarity of the repeating unit $M^1$ helps improve the electronic properties and air stability of the polymer as a whole, thus providing a device incorporating the polymer with better optoelectrical characteristics.

In addition, the present polymeric compounds can have a degree of polymerization (n) in the range of 3 to 10,000. For example, n can be an integer in the range of 4 to 10,000, 5 to 10,000, 6 to 10,000, 7 to 10,000, 8 to 10,000, 9 to 10,000, or 10 to 10,000. In certain embodiments, n can be an integer in the range of 4 to 10,000. In some embodiments, n can be an integer in the range of 5 to 10,000. In particular embodiments, n can be an integer in the range of 8 to 10,000.

To illustrate, each of $R^1$ and $R^2$ independently can be a linear or branched $C_{1-40}$ alkyl groups such as methyl, ethyl, n-propyl, isopropyl, n-butyl, iso-butyl, sec-butyl, tert-butyl, n-pentyl, iso-pentyl, neo-pentyl, n-hexyl, n-dodecyl,

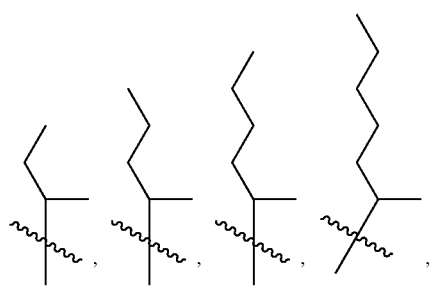

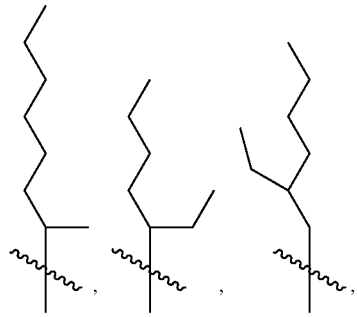

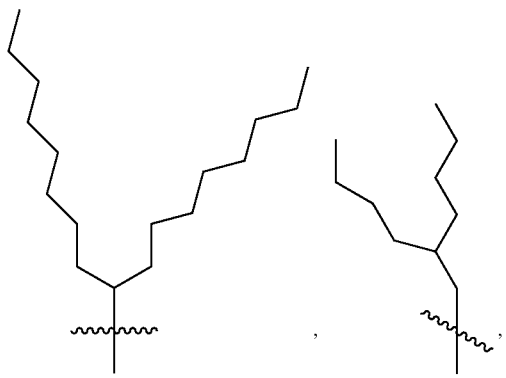

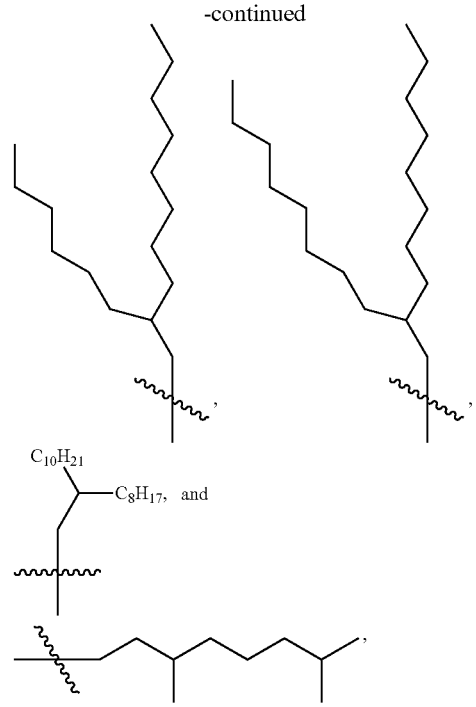

or a linear or branched $C_{1-40}$ haloalkyl groups where one or more hydrogen atoms in, for example, the $C_{1-40}$ alkyl groups shown above, are replaced by a halogen such as F.

Accordingly, in certain embodiments, the repeating unit $M^1$ can be represented by the formula:

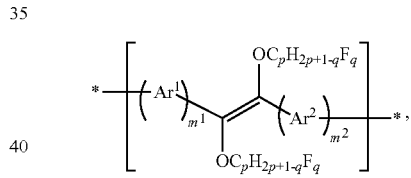

where p is 1, 2, 3, 4, 5, 6, 7, 8, 9 or 10; q is an integer in the range of 1 to 21, provided that q is less than or equal to 2p+1; and $Ar^1$, $Ar^2$, $m^1$, and $m^2$ are as defined herein. For example, each of $C_pH_{2p+1-q}F_q$ independently can be selected from $OC_2H_5$, $OCF_2CH_3$, $OCH_2CF_3$, and $OC_2F_5$.

In particular embodiments, polymeric compounds according to the present teachings can include at least one repeating unit $M^1$ having the formula:

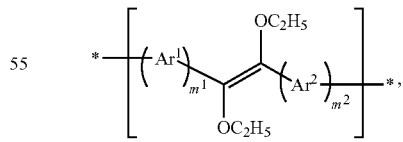

where $Ar^1$, $Ar^2$, $m^1$, and $m^2$ are as defined herein.

Examples of $Ar^1$ and $Ar^2$ include various conjugated monocyclic and polycyclic moieties which can be optionally substituted as described herein. For example, such conjugated cyclic moieties can include optionally substituted $C_{6-24}$ aryl groups and/or optionally substituted 5-24-membered heteroaryl groups. In certain embodiments, $Ar^1$ and $Ar^2$, at each occurrence, independently can be a monocyclic or polycyclic 5-14-membered (hetero)aryl group (including $C_{6-14}$ aryl groups and 5-14-membered heteroaryl groups), which can be optionally substituted with 1-6 $R^d$ groups, where $R^d$, at each occurrence, independently is selected from a) halogen, b) —CN, c) —NO$_2$, d) —N(R$^e$)$_2$, e) oxo, f) —OH, g) =C(R$^f$)$_2$, h) —C(O)R$^e$, i) —C(O)OR$^e$, j) —C(O)N(R$^e$)$_2$, k) —SH, l) —S(O)$_2$—R$^e$, m) —S(O)$_2$OR$^e$, n) —(OCH$_2$CH$_2$)$_t$OR$^e$, o) —(OCF$_2$CF$_2$)$_t$OR$^e$, p) —(OCH$_2$CF$_2$)$_t$OR$^e$, q) —(OCF$_2$CH$_2$)$_t$OR$^e$, r) —(CH$_2$CH$_2$O)$_t$R$^e$, s) —(CF$_2$CF$_2$O)$_t$R$^e$, t) —(CH$_2$CF$_2$O)$_t$R$^e$, u) —(CF$_2$CH$_2$O)$_t$R$^e$, v) a $C_{1-40}$ alkyl group, w) a $C_{2-40}$ alkenyl group, x) a $C_{2-40}$ alkynyl group, y) a $C_{1-40}$ alkoxy group, z) a $C_{1-40}$ alkylthio group, aa) a $C_{1-40}$ haloalkyl group, ab) a —Y—$C_{3-10}$ cycloalkyl group, ac) a —Y—$C_{6-14}$ aryl group, ad) a —Y—$C_{6-14}$ haloaryl group, ae) a —Y-3-12 membered cycloheteroalkyl group, and af) a —Y-5-14 membered heteroaryl group, wherein each of the $C_{1-40}$ alkyl group, the $C_{2-40}$ alkenyl group, the $C_{2-40}$ alkynyl group, the $C_{1-40}$ alkoxy group, the $C_{1-40}$ alkylthio group, the $C_{1-40}$ haloalkyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group is optionally substituted with 1-4 $R^f$ groups;

$R^e$, at each occurrence, independently is selected from H, a $C_{1-40}$ alkyl group, a $C_{1-40}$ haloalkyl group, and a —Y—$C_{6-14}$ aryl group;

$R^f$, at each occurrence, independently is selected from a) halogen, b) —CN, c) —NO$_2$, d) oxo, e) —OH, f) —NH$_2$, g) —NH(C$_{1-20}$ alkyl), h) —N(C$_{1-20}$ alkyl)$_2$, i) —N(C$_{1-20}$ alkyl)-C$_{6-14}$ aryl, j) —N(C$_{6-14}$ aryl)$_2$, k) —S(O)$_w$H, l) —S(O)$_w$—C$_{1-20}$ alkyl, m) —S(O)$_2$OH, n) —S(O)$_2$—OC$_{1-20}$ alkyl, o) —S(O)$_2$—OC$_{6-14}$ aryl, p) —CHO, q) —C(O)—C$_{1-20}$ alkyl, r) —C(O)—C$_{6-14}$ aryl, s) —C(O)OH, t) —C(O)—OC$_{1-20}$ alkyl, u) —C(O)—OC$_{6-14}$ aryl, v) —C(O)NH$_2$, w) —C(O)NH—C$_{1-20}$ alkyl, x) —C(O)N(C$_{1-20}$ alkyl)$_2$, y) —C(O)NH—C$_{6-14}$ aryl, z) —C(O)N(C$_{1-20}$ alkyl)—C$_{6-14}$ aryl, aa) —C(O)N(C$_{6-14}$ aryl)$_2$, ab) —C(S)NH$_2$, ac) —C(S)NH—C$_{1-20}$ alkyl, ad) —C(S)N(C$_{1-20}$ alkyl)$_2$, ae) —C(S)N(C$_{6-14}$ aryl)$_2$, af) —C(S)N(C$_{1-20}$ alkyl)—C$_{6-14}$ aryl, ag) —C(S)NH—C$_{6-14}$ aryl, ah) —S(O)$_w$NH$_2$, ai) —S(O)$_w$NH(C$_{1-20}$ alkyl), aj) —S(O)$_w$N(C$_{1-20}$ alkyl)$_2$, ak) —S(O)$_w$NH(C$_{6-14}$ aryl), al) —S(O)$_w$N(C$_{1-20}$ alkyl)-C$_{6-14}$ aryl, am) —S(O)$_w$N(C$_{6-14}$ aryl)$_2$, an) —SiH$_3$, ao) —SiH(C$_{1-20}$ alkyl)$_2$, ap) —SiH$_2$(C$_{1-20}$ alkyl), aq) —Si(C$_{1-20}$ alkyl)$_3$, ar) a C$_{1-20}$ alkyl group, as) a C$_{2-20}$ alkenyl group, at) a C$_{2-20}$ alkynyl group, au) a C$_{1-20}$ alkoxy group, av) a C$_{1-20}$ alkylthio group, aw) a C$_{1-20}$ haloalkyl group, ax) a C$_{3-10}$ cycloalkyl group, ay) a C$_{6-14}$ aryl group, az) a C$_{6-14}$ haloaryl group, ba) a 3-12 membered cycloheteroalkyl group, or bb) a 5-14 membered heteroaryl group;

Y, at each occurrence, independently is selected from a divalent $C_{1-10}$ alkyl group, a divalent $C_{1-10}$ haloalkyl group, and a covalent bond;

t is 1, 2, 3, 4, 5, 6, 7, 8, 9 or 10; and w, at each occurrence, independently is 0, 1, or 2.

Examples of monocyclic (hetero)aryl groups include a phenyl group or a 5- or 6-membered heteroaryl group such as a pyrrolyl group, a furyl group, a thienyl group, a pyridyl group, a pyrimidyl group, a pyridazinyl group, a pyrazinyl group, a triazolyl group, a tetrazolyl grop, a pyrazolyl group, an imidazolyl group, an isothiazolyl group, a thiazolyl group, and a thiadiazolyl group. For example, at least one of the Ar$^1$ and/or the Ar$^e$ groups can include at least one 5-membered heteroaryl group that includes at least one sulfur ring atom.

Examples of such sulfur-containing 5-membered heteroaryl group include a thienyl group, a thiazolyl group, an isothiazolyl group, and a thiadiazolyl group, each of which optionally can be substituted with 1-4 $R^3$ groups, where $R^3$, at each occurrence, independently can be selected from a halogen, CN, oxo, =C(CN)$_2$, a $C_{1-40}$ alkyl group, a $C_{1-40}$ haloalkyl group, a $C_{1-40}$ alkoxy group, and a $C_{1-40}$ alkylthio group.

Examples of bicyclic 8-14 membered (hetero)aryl groups include a naphthyl group and various bicyclic (e.g., 5-5 or 5-6) heteroaryl moieties that include at least one sulfur ring atom. Examples of such sulfur-containing bicyclic heteroaryl moieties include a thienothiophenyl group (e.g., a thieno[3,2-b]thiophenyl group or a thieno[2,3-b]thiophenyl group), a benzothienyl group, a benzothiazolyl group, a benzisothiazolyl group, and a benzothiadiazolyl group, each of which optionally can be substituted with 1-4 $R^3$ groups, where $R^3$, at each occurrence, independently can be selected from a halogen, CN, oxo, =C(CN)$_2$, a $C_{1-40}$ alkyl group, a $C_{1-40}$ haloalkyl group, a $C_{1-40}$ alkoxy group, and a $C_{1-40}$ alkylthio group.

By way of example, Ar$^1$ and Ar$^2$, at each occurrence, independently can be selected from:

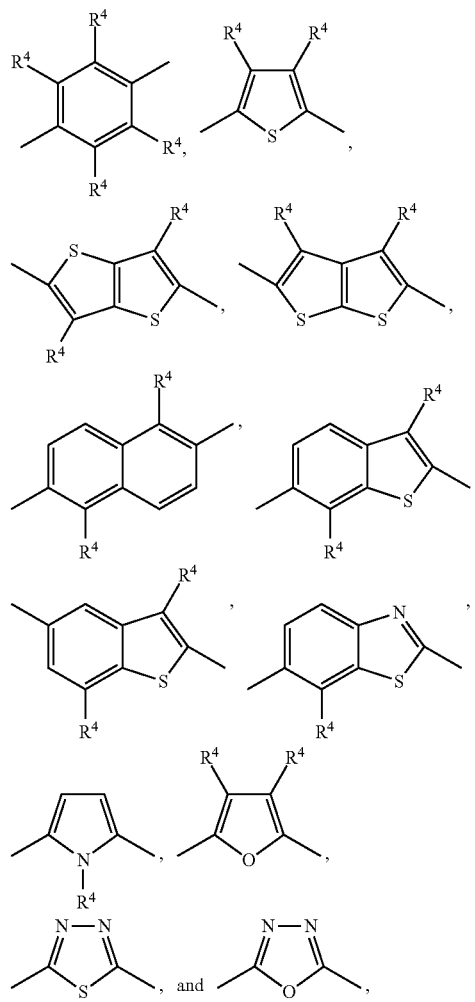

where $R^4$, at each occurrence, independently can be H or $R^3$, and $R^3$ can be selected from a halogen, CN, oxo, =C(CN)$_2$, a $C_{1-40}$ alkyl group, a $C_{1-40}$ haloalkyl group, a $C_{1-40}$ alkoxy group, and a $C_{1-40}$ alkylthio group.

In certain embodiments, the present compounds can include at least one repeating unit having the formula:

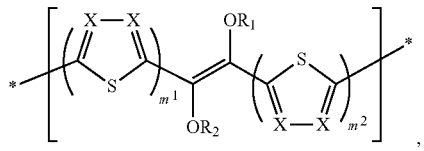

where X, at each occurrence, independently can be $CR^4$ or N; $R^4$, at each occurrence, independently can be selected from H, a halogen, a $C_{1-20}$ alkyl group, a $C_{1-20}$ haloalkyl group, a $C_{1-20}$ alkoxy group, and a $C_{1-20}$ alkylthio group; and $R^1$, $R^2$, $m^1$, and $m^2$ are as defined herein. Alternatively, two adjacent X groups can be $CR^4$, where the two $R^4$ groups, together with the carbon atom to which each $R^4$ group is bonded, can form an optionally substituted phenyl group or an optionally substituted thienyl group.

For example, the compounds described herein can include a repeating unit having the formula:

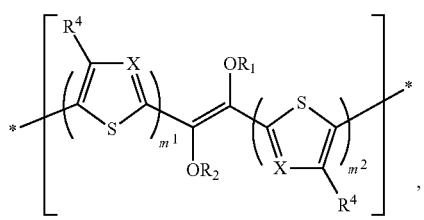

where X and $R^4$ in the moiety

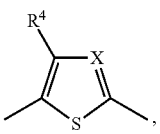

at each occurrence, are defined independently as described herein. In embodiments where $m^1$ and/or $m^2$ are greater than 1, the assembly of the moieties

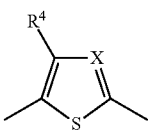

can be head-to-tail, head-to-head, or tail-to-tail, or regioregular or regiorandom. In particular embodiments, each of $Ar^1$ and $Ar^e$ independently can include at least one optionally substituted thienyl group.

By way of example, the compounds described herein can include one or more repeating units selected from:

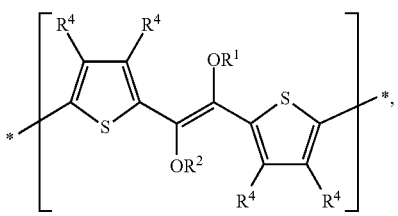 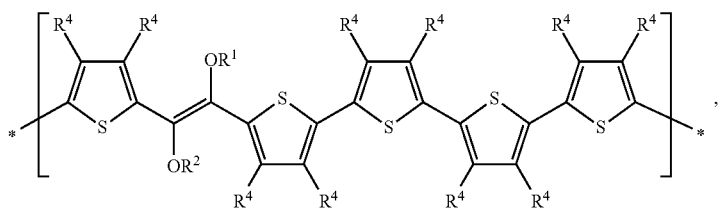

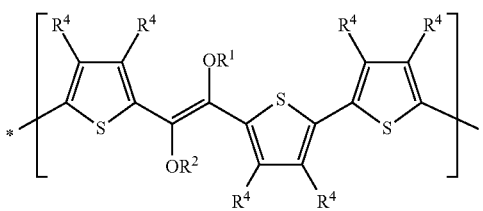 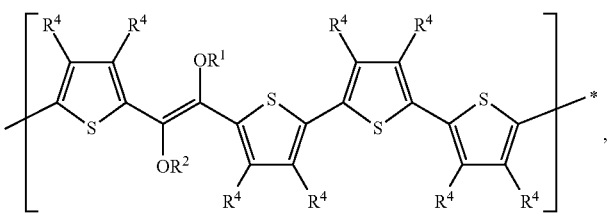

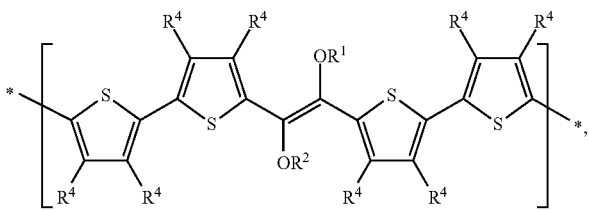

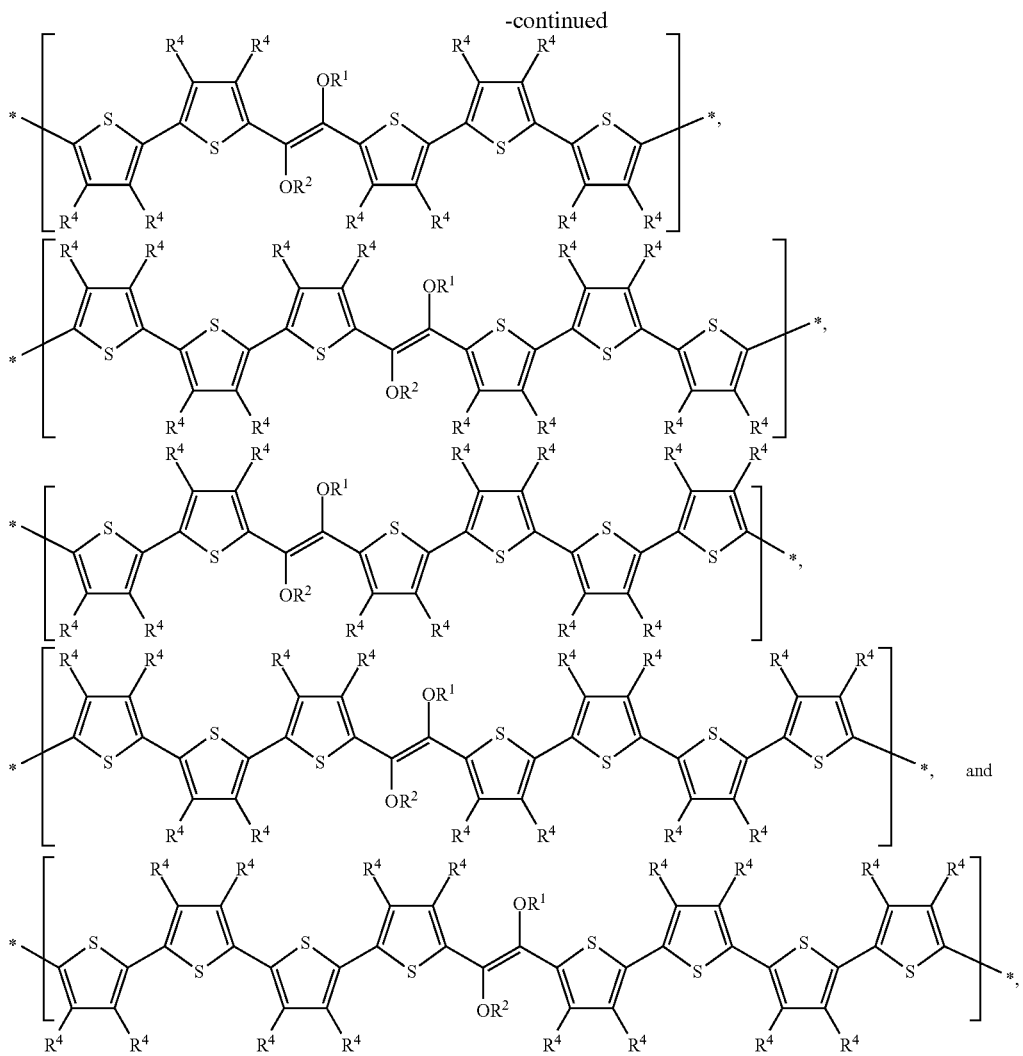
where $R^4$, at each occurrence, independently can be selected from H, a halogen, a $C_{1-20}$ alkyl group, a $C_{1-20}$ haloalkyl group, a $C_{1-20}$ alkoxy group, and a $C_{1-20}$ alkylthio group; and $R^1$ and $R^2$ are as defined herein.
As further examples, the compounds described herein can include at least one repeating unit selected from:
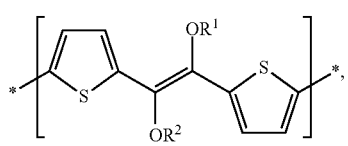
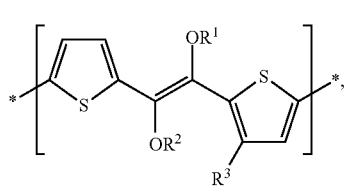
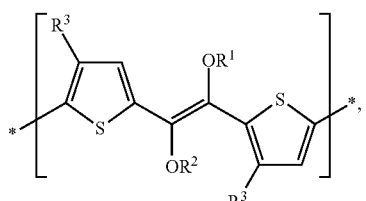
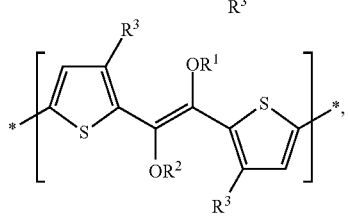

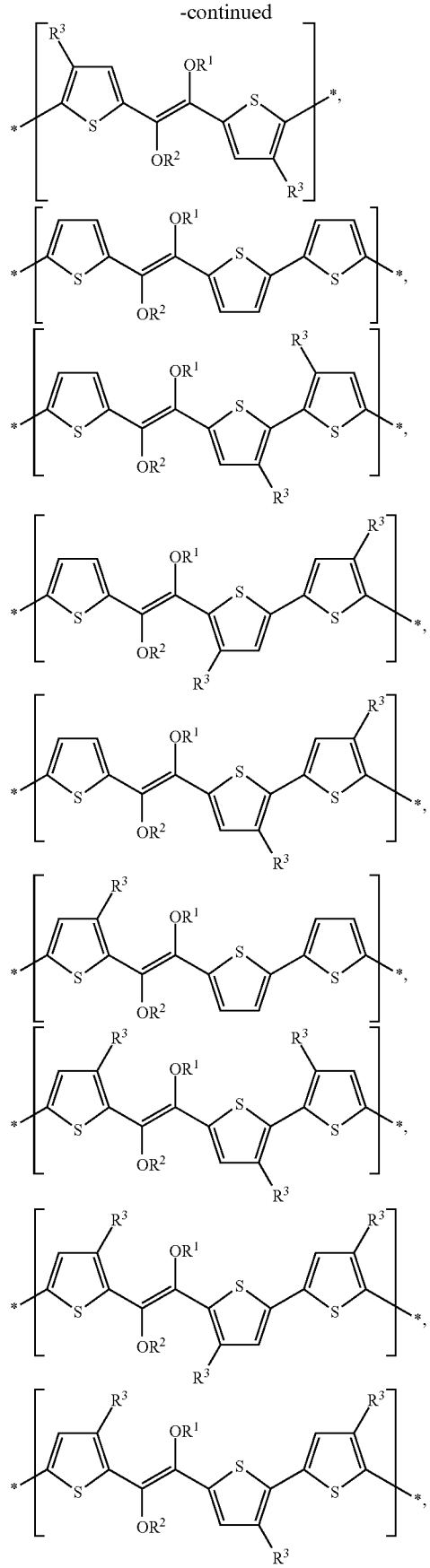
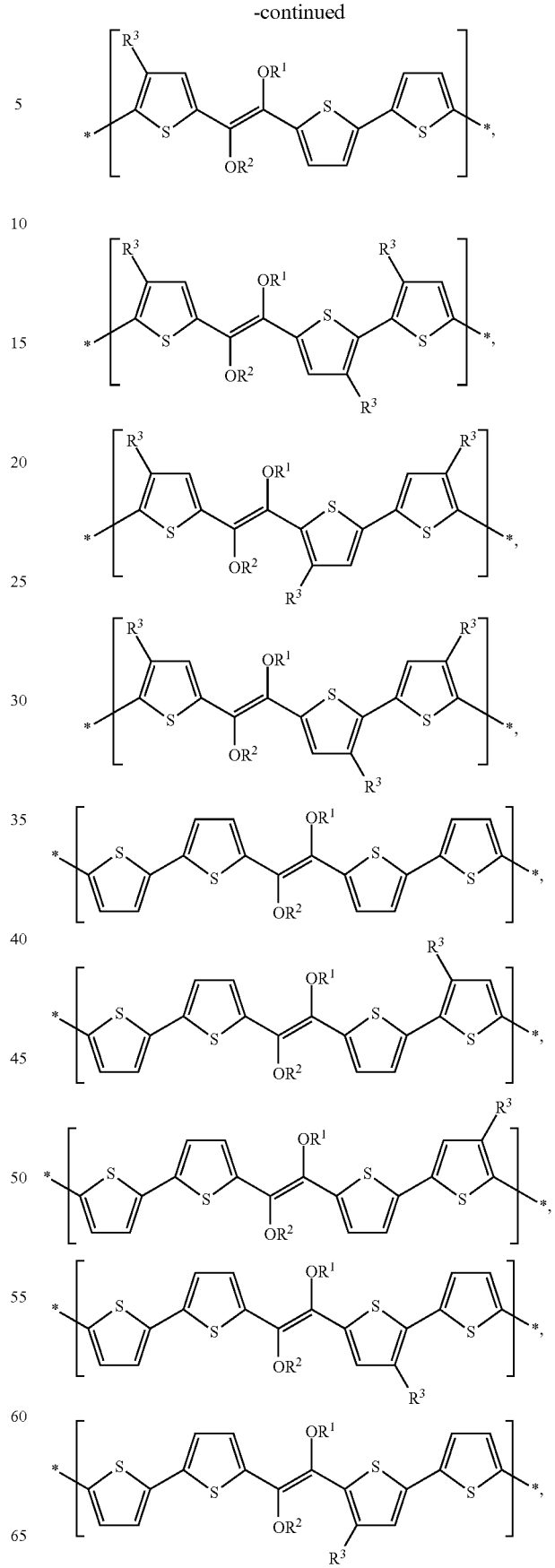

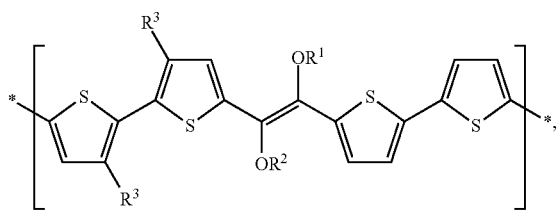
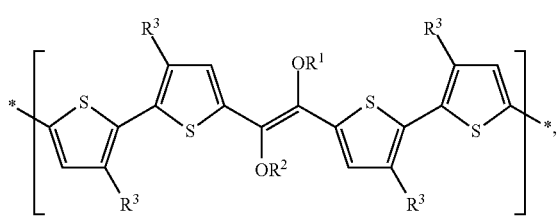
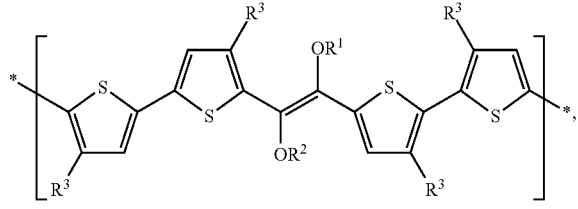
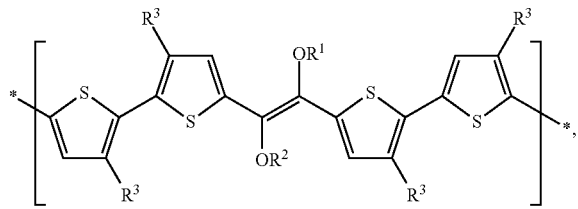
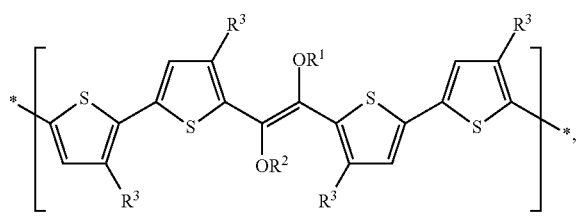
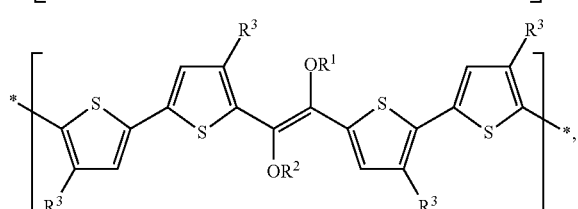
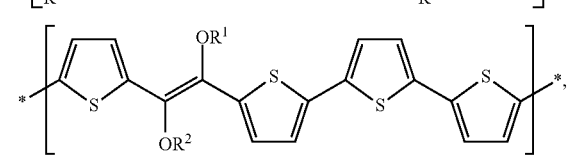
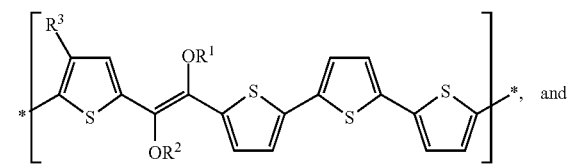 and

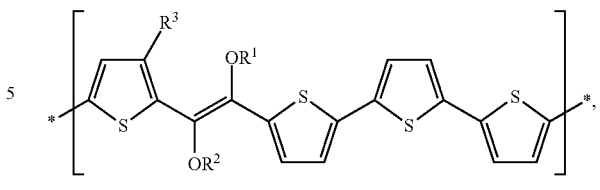

where $R^3$, at each occurrence, independently can be selected from a halogen, a $C_{1-20}$ alkyl group, a $C_{1-20}$ haloalkyl group, a $C_{1-20}$ alkoxy group, and a $C_{1-20}$ alkylthio group; and $R^1$ and $R^2$ are as defined herein. For example, each of $R^1$ and $R^2$ can be a $C_{1-10}$ alkyl group.

In certain embodiments, the compounds described herein can include a repeating unit having the formula:

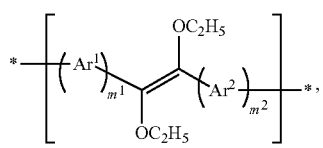

where $Ar^1$, $Ar^2$, $m^1$ and $m^2$ are as defined herein.

For example, the compounds described herein can include a repeating unit having the formula:

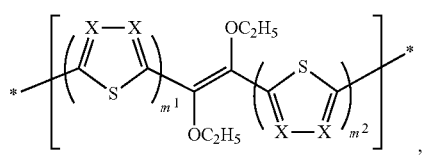

where X, at each occurrence, independently can be $CR^4$ or N; $R^4$, at each occurrence, independently can be selected from H, a halogen, a $C_{1-20}$ alkyl group, a $C_{1-20}$ haloalkyl group, a $C_{1-20}$ alkoxy group, and a $C_{1-20}$ alkylthio group; and R', $R^2$, $m^1$, and $m^2$ are as defined herein. Alternatively, two adjacent X groups can be $CR^4$, where the two $R^4$ groups, together with the carbon atom to which each $R^4$ group is bonded, can form an optionally substituted phenyl group or an optionally substituted thienyl group. In embodiments where $m^1$ and/or $m^2$ are greater than 1, the assembly of the moieties

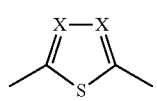

can be head-to-tail, head-to-head, or tail-to-tail, or regioregular or regiorandom. In particular embodiments, each of $Ar^1$ and $Ar^e$ independently can include at least one optionally substituted thienyl group.

By way of example, the compounds described herein can include one or more repeating units selected from:
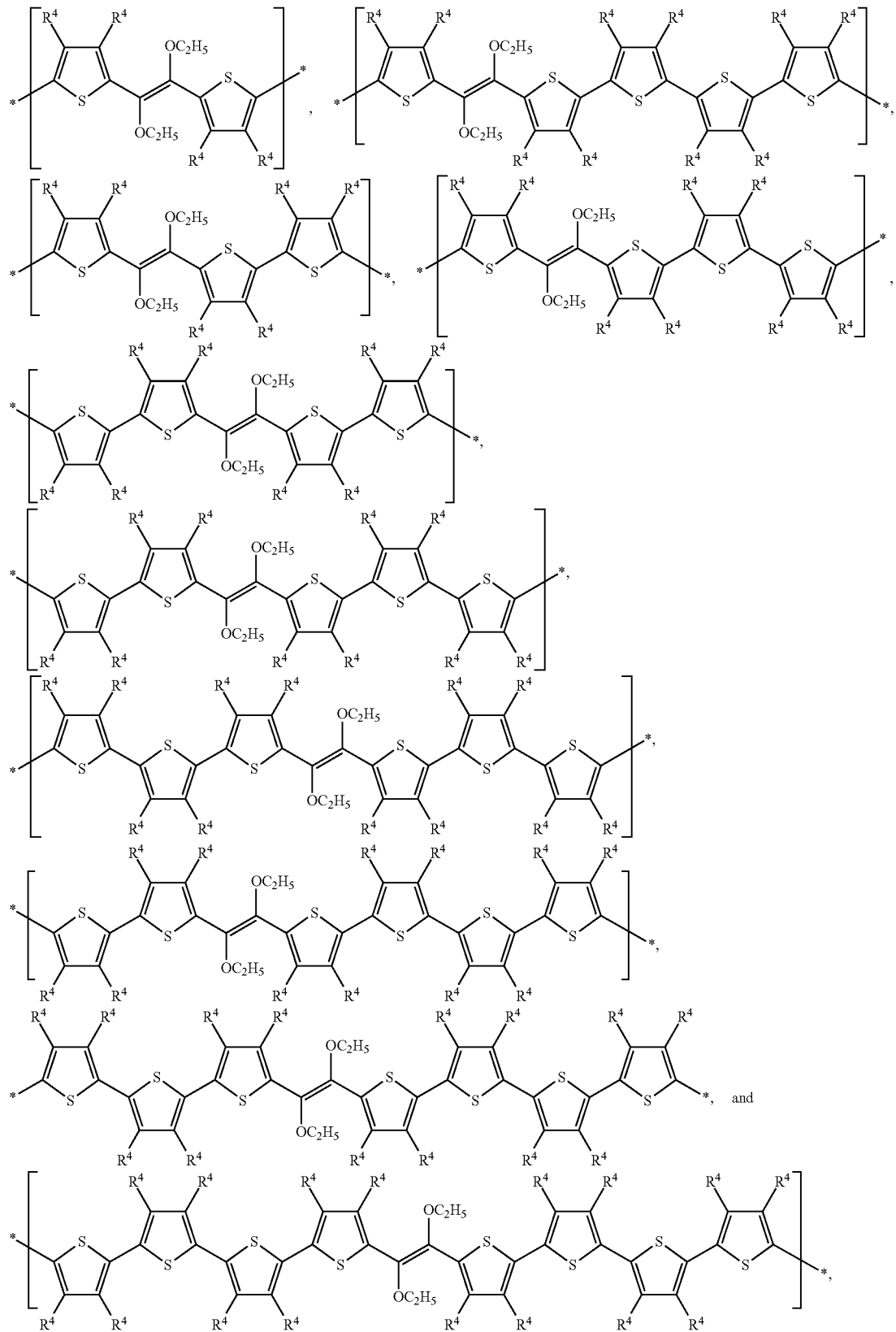

where $R^4$, at each occurrence, independently can be selected from H, a halogen, a $C_{1-20}$ alkyl group, a $C_{1-20}$ haloalkyl group, a $C_{1-20}$ alkoxy group, and a $C_{1-20}$ alkylthio group; and $R^1$ and $R^2$ are as defined herein.
As further examples, the compounds described herein can include at least one repeating unit selected from:
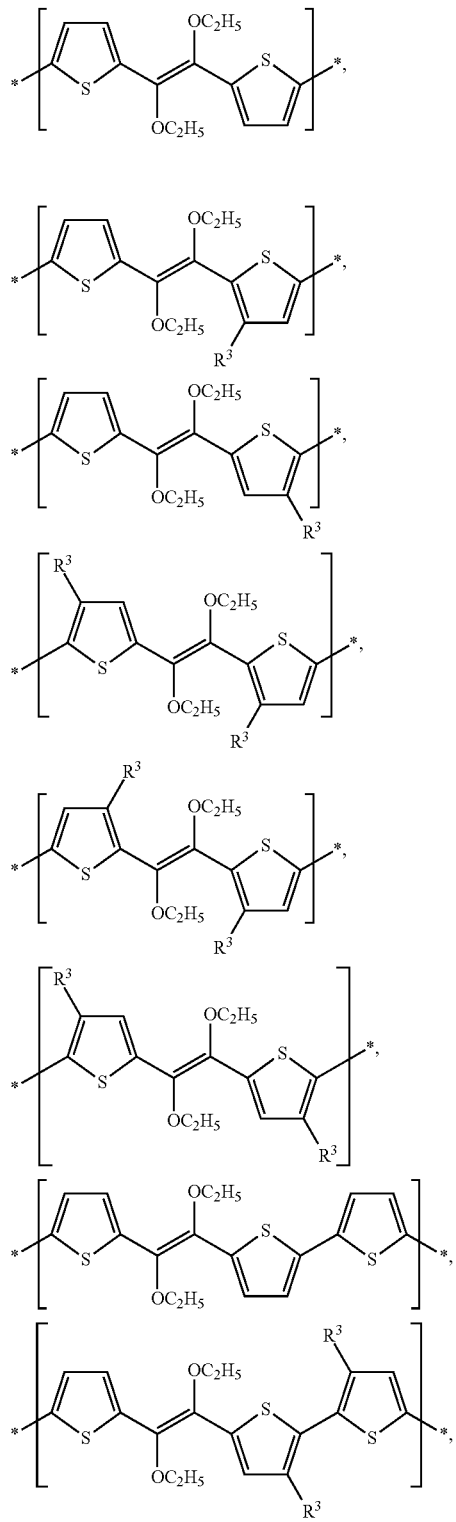
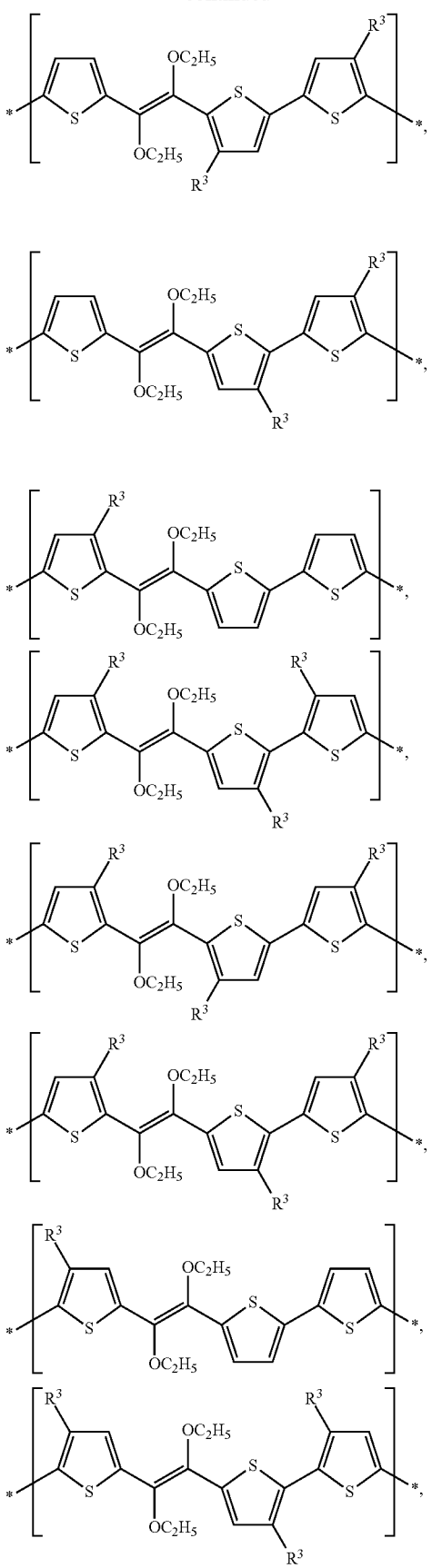

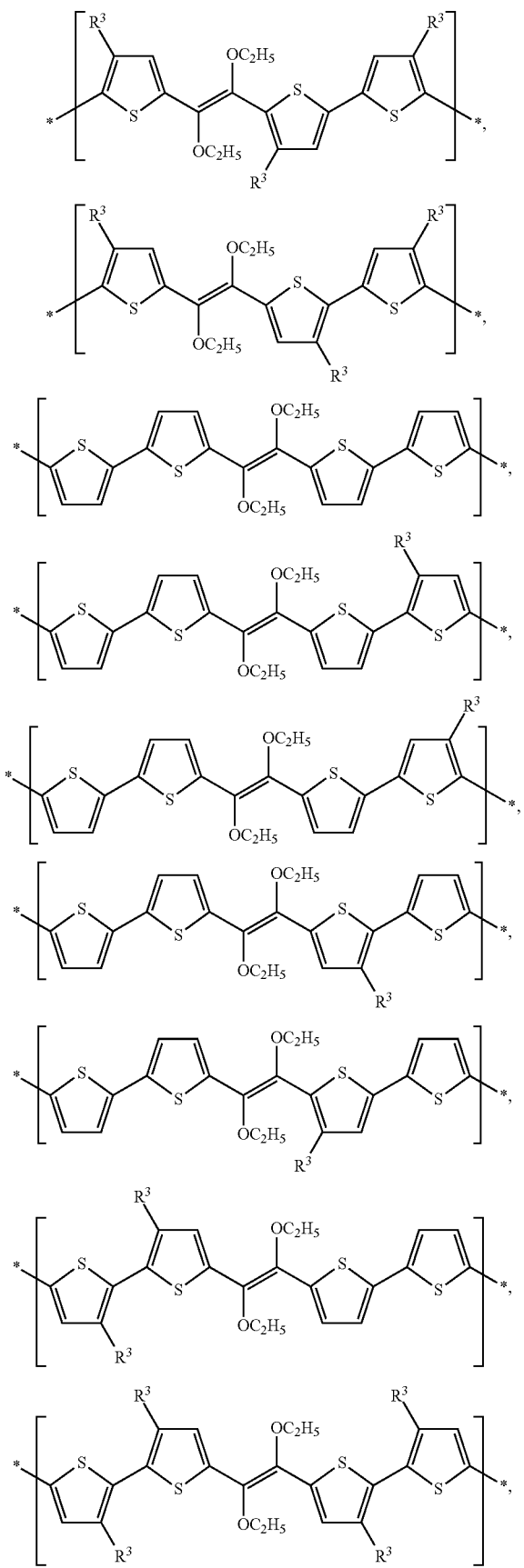
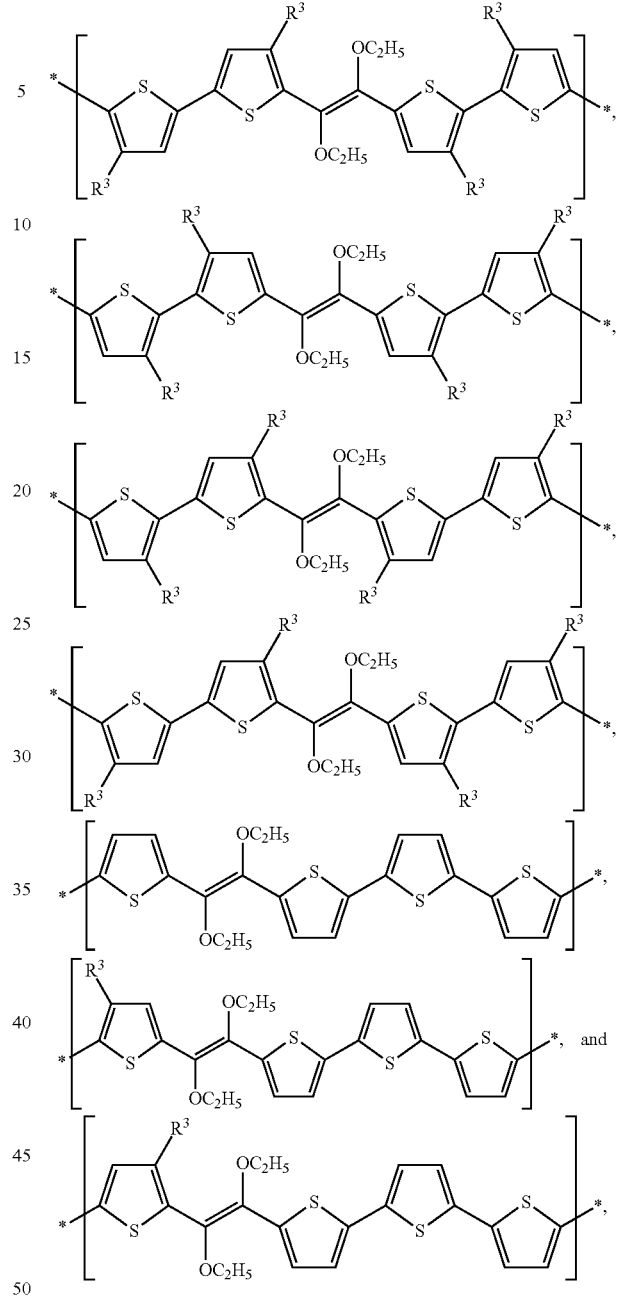

where R³, at each occurrence, independently can be selected from a halogen, a $C_{1-20}$ alkyl group, a $C_{1-20}$ haloalkyl group, a $C_{1-20}$ alkoxy group, and a $C_{1-20}$ alkylthio group; and R¹ and R² are as defined herein. For example, each of R¹ and R² can be a $C_{1-10}$ alkyl group.

In certain embodiments, the compounds described herein can be a homopolymer of identical repeating units M¹, where M¹ is as described herein. In certain embodiments, the compounds described herein can be a copolymer of different repeating units M¹, where M¹ is as described herein. For example, Ar¹ and Ar² in such different repeating units M¹ can have different definitions, and/or m¹ and m² in such different repeating units M¹ can have different definitions. In certain embodiments, R¹ and R² in such different repeating units M¹ can have identical or different definitions. For example, certain embodiments of the present compounds can be a copolymer including repeating units of

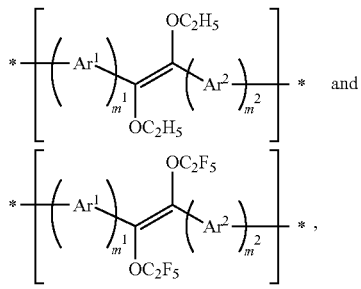

where $Ar^1$, $Ar^2$, $m^1$, and $m^2$ in each repeating unit can have identical or different definitions.

In addition to repeating unit(s) $M^1$, certain embodiments of the present polymeric compounds can include at least one other repeating unit, where such other repeating units do not include a dialkoxyethenyl moiety. Such other repeating units and $M^1$ can be repeated in a regular (e.g., alternating) or random manner. If either unit includes substituted moieties, the copolymers can be regioregular or regiorandom in terms of the orientation of the various units relative to each other.

For example, certain compounds according to the present teachings can be a copolymer of repeating units $M^1$ and $M^2$, and can be represented by the formula:

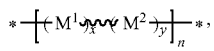

where $M^1$ is as defined above; x represents the mole fraction of $M^1$ in the polymeric compound; $M^2$ represents a repeating unit that does not include a 1,2-dialkoxyethenyl moiety; and y represents the mole fraction of each $M^2$ in the polymeric compound; wherein $0 < x \leq 1$, $0 \leq y < 1$, and the sum of x and y is about 1, and n is an integer in the range of 3 to 10,000. The repeating units $M^1$ and $M^2$ can provide a random polymer, a regioregular polymer, a regiorandom polymer, or an alternating polymer. Alternating copolymers of $M^1$ and $M^2$ according to the present teachings can be represented by the formula:

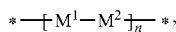

where n is an integer in the range of 5 to 10,000, and $M^1$ and $M^2$ are as defined herein.

To illustrate, $M^2$ in the formula

can represent a repeating unit that includes at least one conjugated cyclic moiety, at least one conjugated linear linker (which includes one or more unsaturated bonds), or in some embodiments, at least one conjugated cyclic moiety and at least one conjugated linear linker. The conjugated cyclic moiety can be carbocyclic or heterocyclic, further optionally substituted or functionalized with one or more electron-withdrawing or electron-donating groups. The pairing of $M^1$ and $M^2$ (and any optional additional co-monomers) will be determined by the application of the polymeric compounds. For example, for electronic, optical, and optoelectronic devices, the composition of the polymeric compounds can be affected by one or more of the following considerations: 1) the electron-withdrawing capability for semiconductor processing in air and stable charge transport operation; 2) modulation of the majority carrier type depending on the electronic structure of the monomers; 3) regiochemistry of the polymerization possibly affording regioregular polymers; 4) the core planarity and linearity of the polymer chain; 5) the capability of additional functionalization of the π-conjugated core; 6) the potential for increased solubility of the polymer for solution processing; 7) the achievement of strong π-π interactions/intermolecular electronic coupling; and 8) bandgap modulation via electron donor-acceptor coupling of electron-poor (acceptor) and electron-rich (donor) A-B or B-A repeating units.

For example, $M^2$, at each occurrence, independently can be selected from:

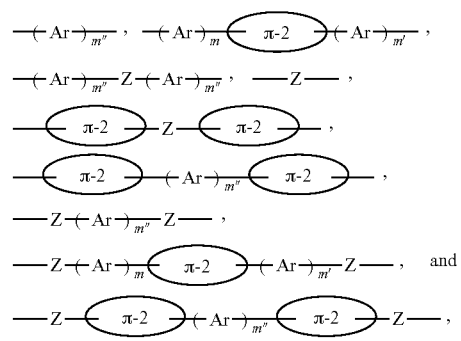

wherein:

π-2, at each occurrence, independently can be a conjugated polycyclic moiety optionally substituted with 1-6 $R^d$ groups;

Ar, at each occurrence, independently can be a conjugated monocyclic moiety 5- or 6-membered aryl or heteroaryl group, wherein each of these groups optionally is substituted with 1-6 $R^d$ groups; wherein:

$R^d$, at each occurrence, independently is selected from a) halogen, b) —CN, c) —$NO_2$, d) —$N(R^e)_2$, e) oxo, f) —OH, g) =$C(R^f)_2$, h) —$C(O)R^e$, i) —$C(O)OR^e$, j) —$C(O)N(R^e)_2$, k) —SH, l) —$S(O)_2$—$R^e$, m) —$S(O)_2$ $OR^e$, n) —$(OCH_2CH_2)_tOR^e$, o) —$(OCF_2CF_2)_tOR^e$, p) —$(OCH_2CF_2)_tOR^e$, q) —$(OCF_2CH_2)_tOR^e$, r) —$(CH_2CH_2O)_tR^e$, s) —$(CF_2CF_2O)_tR^e$, t) —$(CH_2CF_2O)_tR^e$, u) —$(CF_2CH_2O)_tR^e$, v) a $C_{1-40}$ alkyl group, w) a $C_{2-40}$ alkenyl group, x) a $C_{2-40}$ alkynyl group, y) a $C_{1-40}$ alkoxy group, z) a $C_{1-40}$ alkylthio group, aa) a $C_{1-40}$ haloalkyl group, ab) a —Y—$C_{3-10}$ cycloalkyl group, ac) a —Y—$C_{6-14}$ aryl group, ad) a —Y—$C_{6-14}$ haloaryl group, ae) a —Y—3-12 membered cycloheteroalkyl group, and af) a —Y—5-14 membered heteroaryl group, wherein each of the $C_{1-40}$ alkyl group, the $C_{2-40}$ alkenyl group, the $C_{2-40}$ alkynyl group, the $C_{12-40}$ alkoxy group, the $C_{1-40}$ alkylthio group, the $C_{12-40}$ haloalkyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group is optionally substituted with 1-4 $R^f$ groups;

$R^e$, at each occurrence, independently is selected from H, a $C_{1-40}$ alkyl group, a $C_{1-40}$ haloalkyl group, and a —Y—$C_{6-14}$ aryl group;

R$^f$, at each occurrence, independently is selected from a) halogen, b) —CN, c) —NO$_2$, d) oxo, e) —OH, f) —NH$_2$, g) —NH(C$_{1-20}$ alkyl), h) —N(C$_{1-20}$ alkyl)$_2$, i) —N(C$_{1-20}$ alkyl)—C$_{6-14}$ aryl, j) —N(C$_{6-14}$ aryl)$_2$, k) —S(O)$_w$H, l) —S(O)$_w$—C$_{1-20}$ alkyl, m) —S(O)$_2$OH, n) —S(O)$_2$—OC$_{1-20}$ alkyl, o) —S(O)$_2$—OC$_{6-14}$ aryl, p) —CHO, q) —C(O)-C$_{1-20}$ alkyl, r) —C(O)—C$_{6-14}$ aryl, s) —C(O)OH, t) —C(O)—OC$_{1-20}$ alkyl, u) —C(O)—OC$_{6-14}$ aryl, v) —C(O)NH$_2$, w) —C(O)NH—C$_{1-20}$ alkyl, x) —C(O)N(C$_{1-20}$ alkyl)$_2$, y) —C(O)NH—C$_{6-14}$ aryl, z) —C(O)N(C$_{1-20}$ alkyl)-C$_{6-14}$ aryl, aa) —C(O)N (C$_{6-14}$ aryl)$_2$, ab) —C(S)NH$_2$, ac) —C(S)NH—C$_{1-20}$ alkyl, ad) —C(S)N(C$_{1-20}$ alkyl)$_2$, ae) —C(S)N(C$_{6-14}$ aryl)$_2$, af) —C(S)N(C$_{1-20}$ alkyl)-C$_{6-14}$ aryl, ag) —C(S) NH—C$_{6-14}$ aryl, ah) —S(O)$_w$NH$_2$, ai) —S(O)$_w$NH (C$_{1-20}$ alkyl), aj) —S(O)$_w$N(C$_{1-20}$ alkyl)$_2$, ak) —S(O)$_w$ NH(C$_{6-14}$ aryl), al) —S(O)$_w$N(C$_{1-20}$ alkyl)—C$_{6-14}$ aryl, am) —S(O)$_w$N(C$_{6-14}$ aryl)$_2$, an) —SiH$_3$, ao) —SiH (C$_{1-20}$ alkyl)$_2$, ap) —SiH$_2$(C$_{1-20}$ alkyl), aq) —Si(C$_{1-20}$ alkyl)$_3$, ar) a C$_{1-20}$ alkyl group, as) a C$_{2-20}$ alkenyl group, at) a C$_{2-20}$ alkynyl group, au) a C$_{1-20}$ alkoxy group, av) a C$_{1-20}$ alkylthio group, aw) a C$_{1-20}$ haloalkyl group, ax) a C$_{3-10}$ cycloalkyl group, ay) a C$_{6-14}$ aryl group, az) a C$_{6-14}$ haloaryl group, ba) a 3-12 membered cycloheteroalkyl group, or bb) a 5-14 membered heteroaryl group;

Y, at each occurrence, independently is selected from a divalent C$_{1-10}$ alkyl group, a divalent C$_{1-10}$ haloalkyl group, and a covalent bond; and t is 1, 2, 3, 4, 5, 6, 7, 8, 9 or 10;

w, at each occurrence, independently is 0, 1, or 2;

Z is a conjugated linear linker;

m and m' independently are 0, 1, 2, 3, or 4; and m" is 1, 2, 3, or 4.

In some embodiments, π-2 can be a polycyclic C$_{8-24}$ aryl group or a polycyclic 8-24 membered heteroaryl group, wherein each of these groups can be optionally substituted with 1-6 R$^d$ groups, where R$^d$ is as defined herein. For example, π-2 can have a planar and highly conjugated cyclic core which can be optionally substituted as disclosed herein. Examples of suitable cyclic cores include naphthalene, anthracene, tetracene, pentacene, perylene, pyrene, coronene, fluorene, indacene, indenofluorene, and tetraphenylene, as well as their analogs in which one or more carbon atoms can be replaced with a heteroatom such as O, S, Si, Se, N, or P. In certain embodiments, _90 -2 can include at least one electron-withdrawing group. In certain embodiments, π-2 can include one or more solubilizing groups. For example, π-2 can include one or more solubilizing groups selected from a C$_{1-40}$ alkyl group, a C$_{1-40}$ alkoxy group, a C$_{1-40}$ alkylthio group, a C$_{1-40}$ haloalkyl group, —(OCH$_2$CH$_2$)$_t$OR$^e$, —(OCF$_2$CF$_2$)$_t$ OR$^e$, —(OCH$_2$CF$_2$)$_t$OR$^e$, —(OCF$_2$CH$_2$)$_t$OR$^e$, —(CH$_2$CH$_2$O)$_t$—R$^e$, —(CF$_2$CF$_2$O)$_t$R$^e$, —(CH$_2$CF$_2$O)$_t$R$^e$, or —(CF$_2$CH$_2$O)$_t$R$^e$; where t is 1, 2, 3, 4, 5, 6, 7, 8, 9 or 10; and R$^e$ is a C$_{1-20}$ alkyl group or a C$_{1-20}$ haloalkyl group In certain embodiments, π-2 can include two or more (e.g., 2-4) fused rings where each ring can be a five-, six-, or seven-membered ring optionally substituted with 1-6 R$^d$ groups, wherein R$^d$ is as defined herein. For example, in the various embodiments described herein, R$^d$ can be an electron-withdrawing group such as a halogen, —CN, oxo, =C(R$^f$)$_2$, a C$_{1-20}$ alkoxy group, a C$_{1-20}$ alkylthio group, or a C$_{1-20}$ haloalkyl group. In certain embodiments, R$^d$ can be a halogen (e.g., F, Cl, Br, or I), —CN, a C$_{1-6}$ alkoxy group, —OCF$_3$, or —CF$_3$. In particular embodiments, R$^d$ can be =O, —CN, =C(CN)$_2$, F, Cl, Br, or I.

In some embodiments, π-2 can include a monocyclic ring (e.g., a 1,3-dioxolane group or a derivative thereof including optional substituents and/or ring heteroatoms) covalently bonded to a second monocyclic ring or a polycyclic system via a spiroatom (e.g., a spiro carbon atom).

In certain embodiments, π-2 can be selected from:

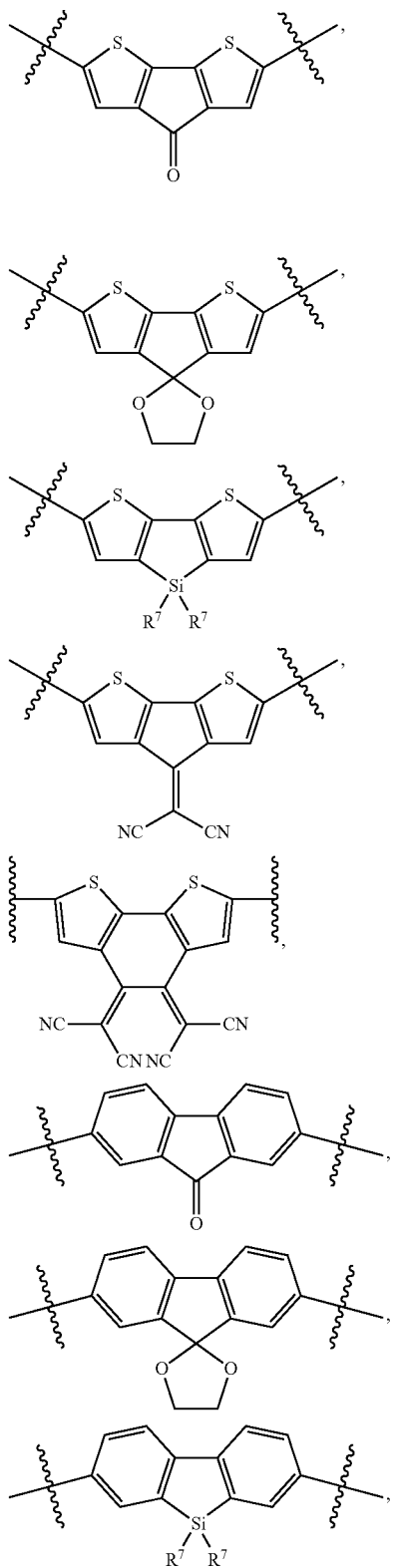

35
-continued
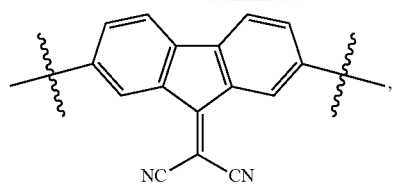
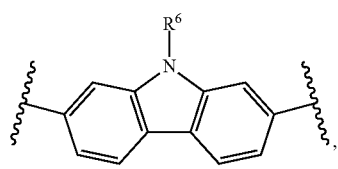
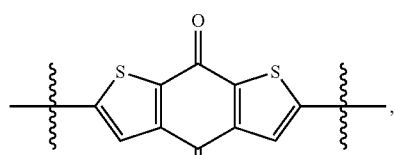
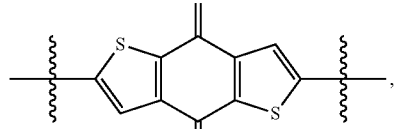
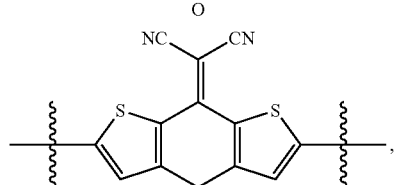
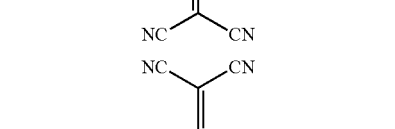
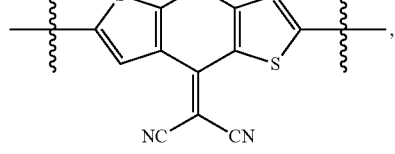
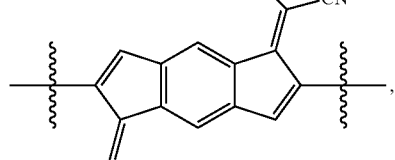
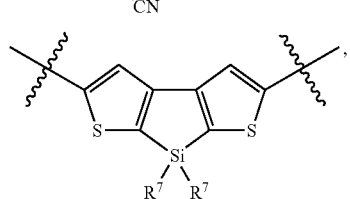
36
-continued
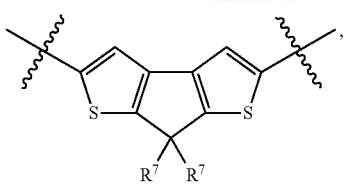
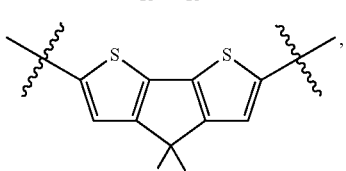
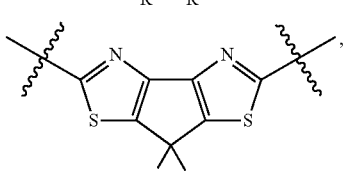
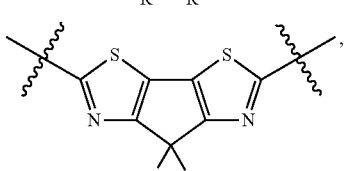
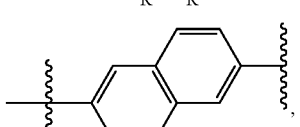
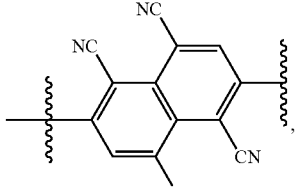
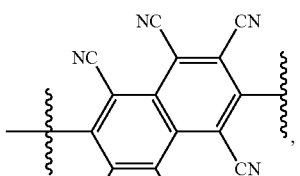
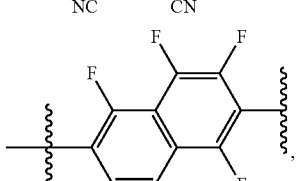
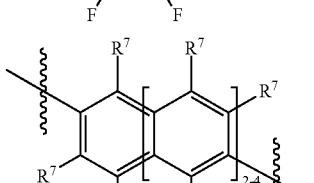

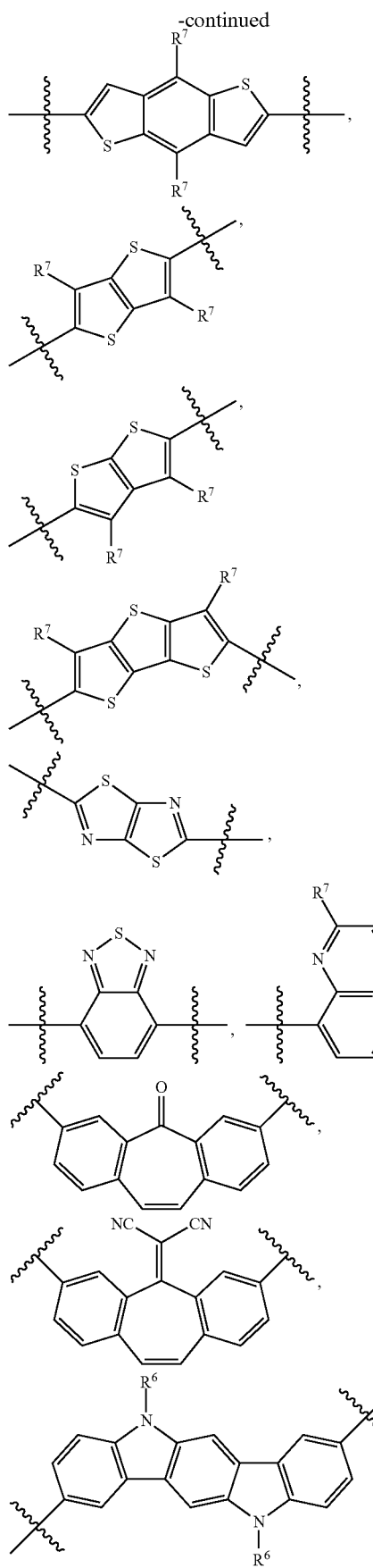
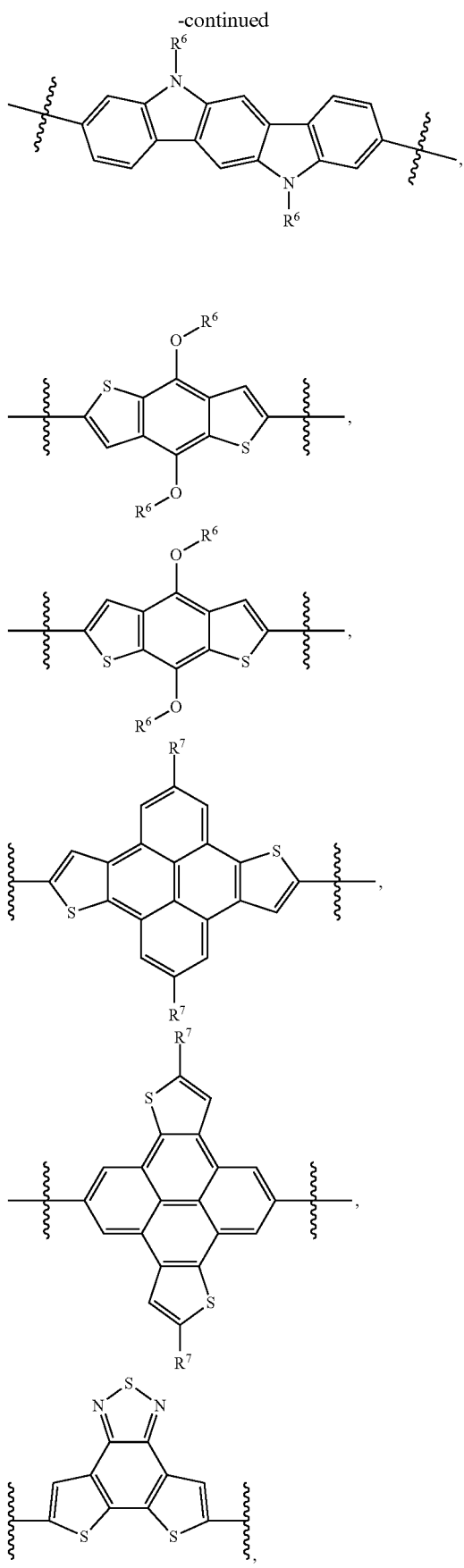

-continued

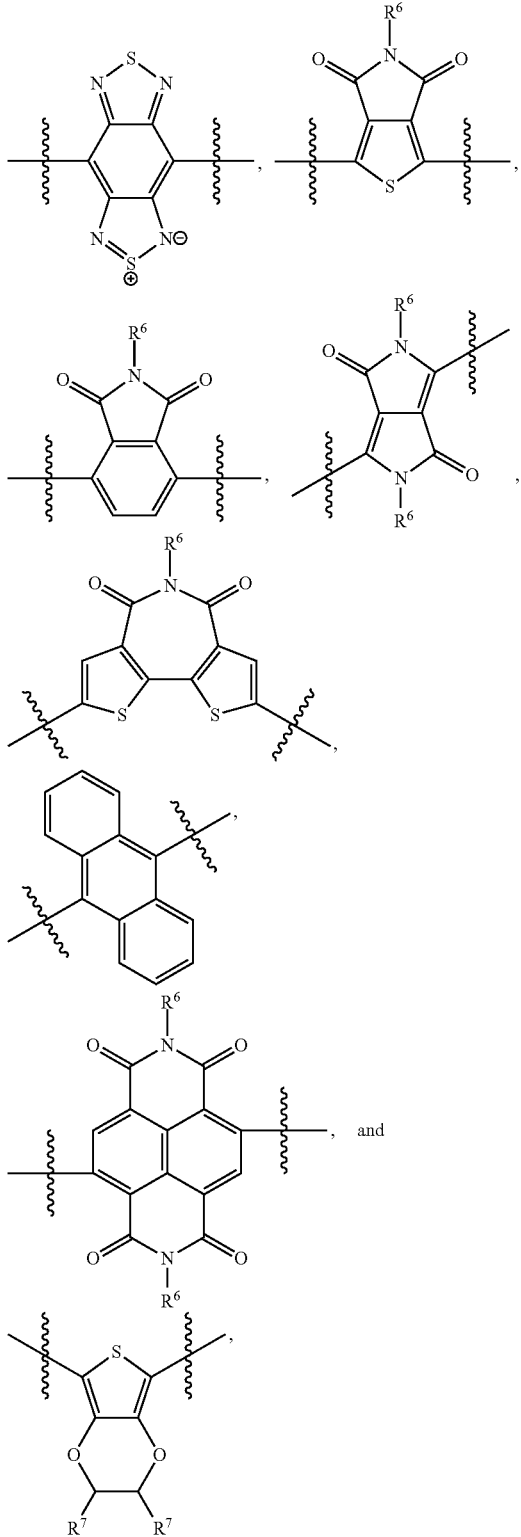

wherein R⁶, at each occurrence, independently is H, a $C_{1-40}$ alkyl group, a $C_{1-40}$ haloalkyl group, —(CH₂CH₂O)$_t$—R$^e$, —(CF₂CF₂O)$_t$R$^e$, —(CH₂CF₂O)$_t$R$^e$, or —(CF₂CH₂O)$_t$R$^e$; and R⁷, at each occurrence, independently is H, halogen, CN, a $C_{1-40}$ alkyl group, a $C_{1-40}$ alkoxy group, a $C_{1-40}$ alkylthio group, a $C_{1-40}$ haloalkyl group, —(OCH₂CH₂)$_t$OR$^e$, —(OCF₂CF₂)$_t$OR$^e$, —(OCH₂CF₂)$_t$OR$^e$, —(OCF₂CH₂)$_t$OR$^e$, —(CH₂CH₂O)$_t$—R$^e$, —(CF₂CF₂O)$_t$R$^e$, —(CH₂CF₂O)$_t$R$^e$, or —(CF₂CH₂O)$_t$R$^e$; wherein t is 1, 2, 3, 4, 5, 6, 7, 8, 9 or 10; and R$^e$ is a $C_{1-20}$ alkyl group or a $C_{1-20}$ haloalkyl group.

In embodiments where M² includes one or more (for example, one to four) Ar groups, Ar, at each occurrence, independently can be an optionally substituted monocyclic moiety selected from:

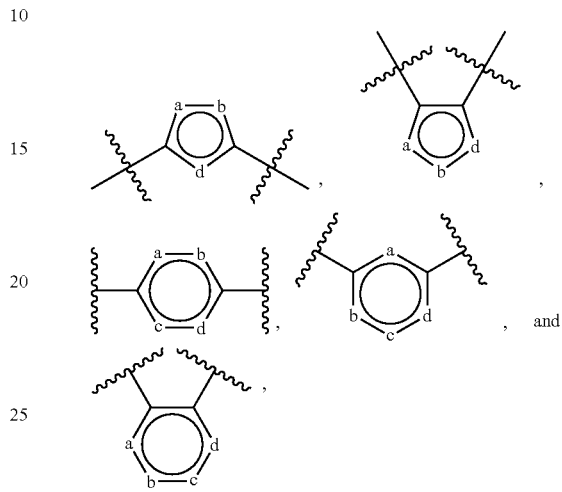

wherein:
a, b, c and d independently are selected from —O—, —S—, —Se—, —CH=, =CH—, —CR³=, =CR³—, —C(O)—, —C(C(CN)₂), —N=, —N—, —NH— and —NR³—;

R³, at each occurrence, independently is selected from a) halogen, b) —CN, c) —NO₂, d) —N(R$^e$)₂, e) —OH, f) —SH, g) —(OCH₂CH₂)$_t$OR$^e$, h) —C(O)Re, i) —C(O)OR$^e$, j) —C(O)N(R$^e$)₂, a $C_{1-40}$ alkyl group, l) a $C_{2-40}$ alkenyl group, m) a $C_{2-40}$ alkynyl group, n) a $C_{1-40}$ alkoxy group, o) a $C_{1-40}$ alkylthio group, p) a $C_{1-40}$ haloalkyl group, q) a —Y—$C_{3-14}$ cycloalkyl group, r) a —Y—$C_{6-14}$ aryl group, s) a —Y—3-14 membered cycloheteroalkyl group, and t) a —Y—5-14 membered heteroaryl group, wherein each of the $C_{1-40}$ alkyl group, the $C_{2-40}$ alkenyl group, the $C_{2-40}$ alkynyl group, the $C_{1-40}$ alkoxy group, the $C_{1-40}$ alkylthio group, the $C_{1-40}$ haloalkyl group, the $C_{3-14}$ cycloalkyl group, the $C_{6-14}$ aryl group, the 3-14 membered cycloheteroalkyl group, and the 5-14 membered heteroaryl group optionally is substituted with 1-5 R$^f$ groups; wherein R$^e$, R$^f$, Y and t are as defined herein.

In certain embodiments, each Ar independently can be an optionally substituted 5- or 6-membered aryl or heteroaryl group. For example, each Ar can be selected from a phenyl group, a thienyl group, a furyl group, a pyrrolyl group, an isothiazolyl group, a thiazolyl group, a 1,2,4-thiadiazolyl group, a 1,3,4-thiadiazolyl group, and a 1,2,5-thiadiazolyl group, wherein each group can be divalent or monovalent, and optionally can be substituted with 1-4 substituents independently selected from a halogen, —CN, an oxo group, a $C_{1-6}$ alkyl group, a $C_{1-6}$ alkoxy group, a $C_{1-6}$ haloalkyl group, NH₂, NH($C_{1-6}$ alkyl) and N($C_{1-6}$alkyl)₂. In particular embodiments, each Ar can be selected from a thienyl group, an isothiazolyl group, a thiazolyl group, a 1,2,4-thiadiazolyl group, a 1,3,4-thiadiazolyl group, a 1,2,5-thiadiazolyl group, a phenyl group, and a pyrrolyl group, wherein each group optionally can be substituted with 1-2 substituents independently selected from a halogen, —CN, an oxo group, a $C_{1-6}$ alkyl group, a $C_{1-6}$ alkoxy group, a $C_{1-6}$ haloalkyl group, $NH_2$, $NH(C_{1-6}$ alkyl) and $N(C_{1-6}$ alkyl$)_2$. In some embodiments, Ar can be unsubstituted. In some embodiments, Ar can be a thienyl group, an isothiazolyl group, a thiazolyl group, a 1,2,4-thiadiazolyl group, a 1,3,4-thiadiazolyl group, and a 1,2,5-thiadiazolyl group, wherein each optionally is substituted with 1-2 $C_{1-6}$ alkyl groups.

By way of example, $(Ar)_m$, $(Ar)_m'$, and $(Ar)_m''$ can be selected from:

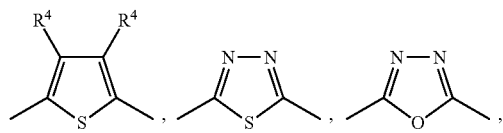

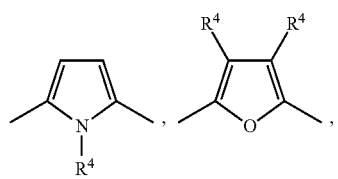

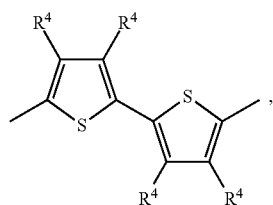

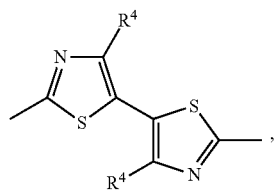

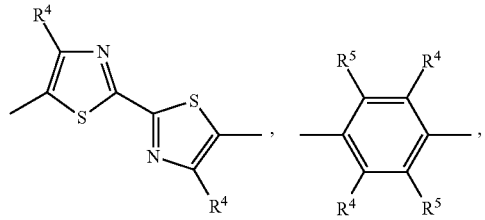

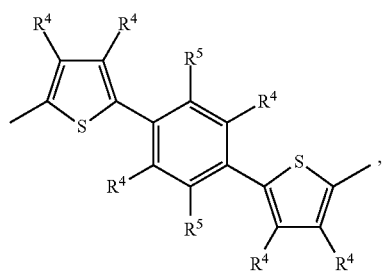

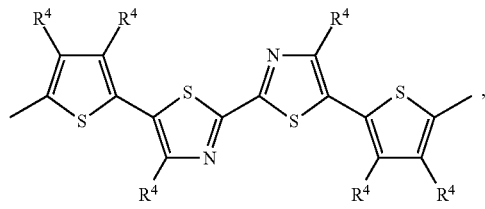

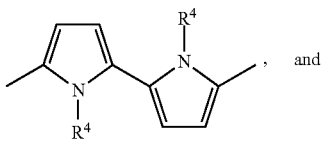, and

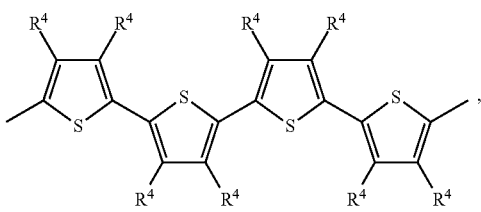

wherein $R^4$, at each occurrence, independently is H or $R^3$; and $R^5$, at each occurrence, independently is H, oxo, $=C(CN)_2$, or $R^3$, wherein $R^3$ is as defined herein. In particular embodiments,

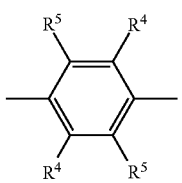

by itself or as part of

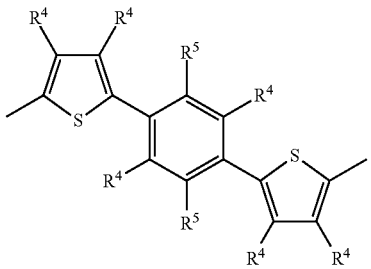

can be selected from:

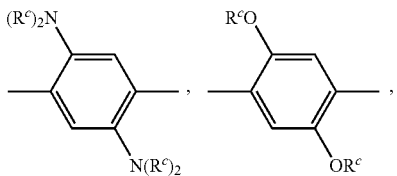

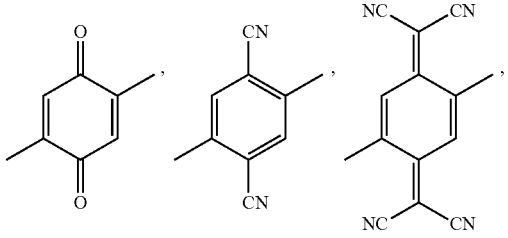

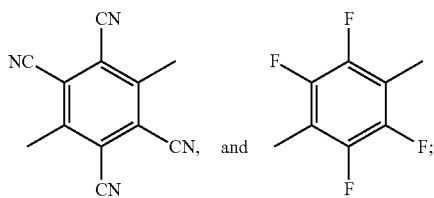

where Rc is a $C_{1-10}$ alkyl group.

In various embodiments, $M^2$ can include one or more conjugated linear linkers Z, where Z can be a conjugated system by itself (e.g., including two or more double or triple bonds) or can form a conjugated system with its neighboring components. For example, Z, at each occurrence, independently can be a divalent ethenyl group (i.e., having one double bond), a divalent ethynyl group (i.e., having one tripe bond), a $C_{4-40}$ alkenyl or alkynyl group that includes two or more conjugated double or triple bonds, or some other non-cyclic conjugated systems that can include heteroatoms such as Si, N, P, and the like. For example, Z, at each occurrence, independently can be selected from:

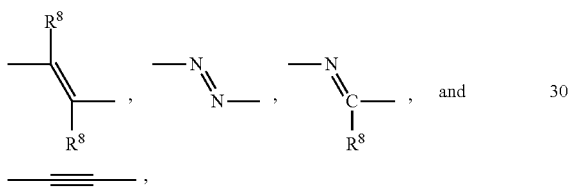

wherein $R^8$, at each occurrence, independently can be selected from H, a halogen, and CN. In certain embodiments, Z can be selected from:

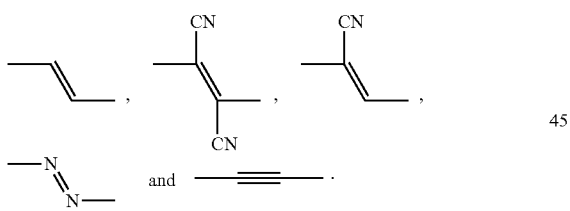

In some embodiments, $M^2$ can be $—(Ar)_{m''}—$, where m'' can be 1, 2, 3 or 4; and Ar, at each occurrence, independently can be a 5- or 6-membered aryl or heteroaryl group which optionally can be substituted with 1-2 $R^3$ groups, wherein $R^3$, at each occurrence, independently is selected from a halogen, —CN, —$(OCH_2CH_2)_tOCR^e$, a $C_{1-20}$ alkyl group, a $C_{1-20}$ alkoxy group, a $C_{1-20}$ alkylthio group, and a $C_{1-20}$ haloalkyl group, and $R^e$ and t are as defined herein. For example, $M^2$ can be selected from:

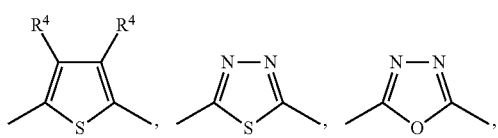

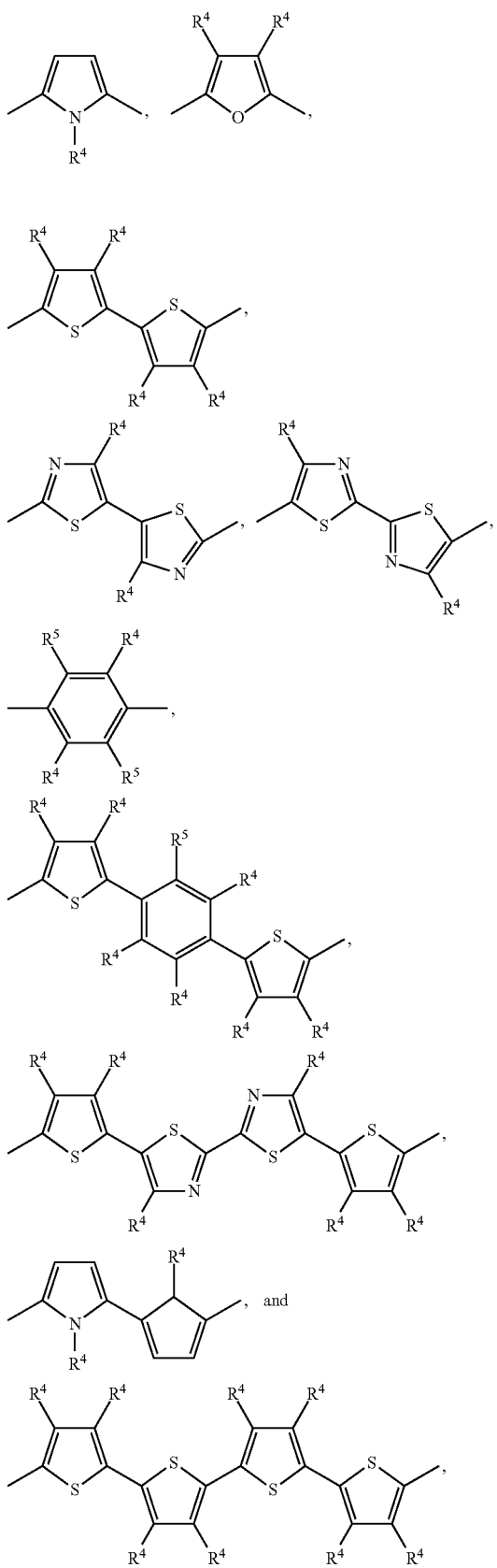

wherein $R^4$ and $R^5$ are as defined herein.

In some embodiments, $M^2$ can have the formula:

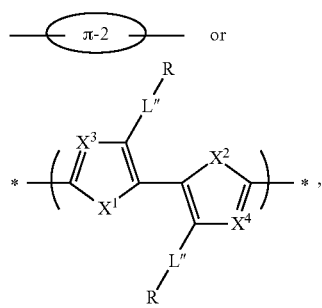

wherein:
L", at each occurrence, independently is selected from —CH$_2$— and —O—;
R, at each occurrence, independently is selected from a C$_{1-40}$ alkyl group, a C$_{2-40}$ alkenyl group, a C$_{2-40}$ alkynyl group, and a C$_{1-40}$ haloalkyl group, wherein one or more non-adjacent CH$_2$ groups independently are optionally replaced by —O—, provided that O atoms are not linked directly to one another;
$X^1$ and $X^2$, at each occurrence, independently are selected from S, O, and Se;
$X^3$ and $X^4$, at each occurrence, independently are selected from N, CH, and CF; and
π-2 is an optionally substituted C$_{8-24}$ aryl group or 8-24 membered heteroaryl group.

In some embodiments, $M^2$ can have the formula:

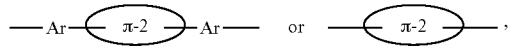

wherein Ar, at each occurrence, independently is a thienyl group optionally substituted with 1-2 $R^3$ groups, where $R^3$, at each occurrence, independently is selected from a halogen, a C$_{1-20}$ alkyl group, a C$_{1-20}$ haloalkyl group, a C$_{1-20}$ alkoxy group, and a C$_{1-20}$ alkylthio group; and π-2 is selected from:

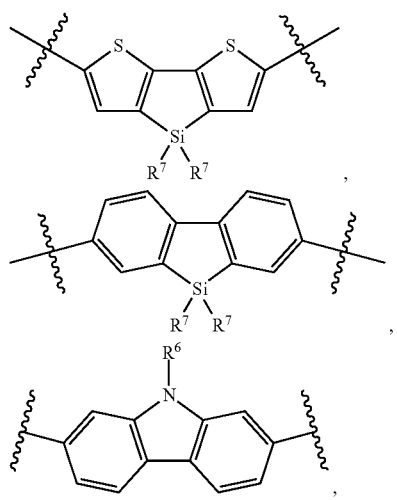

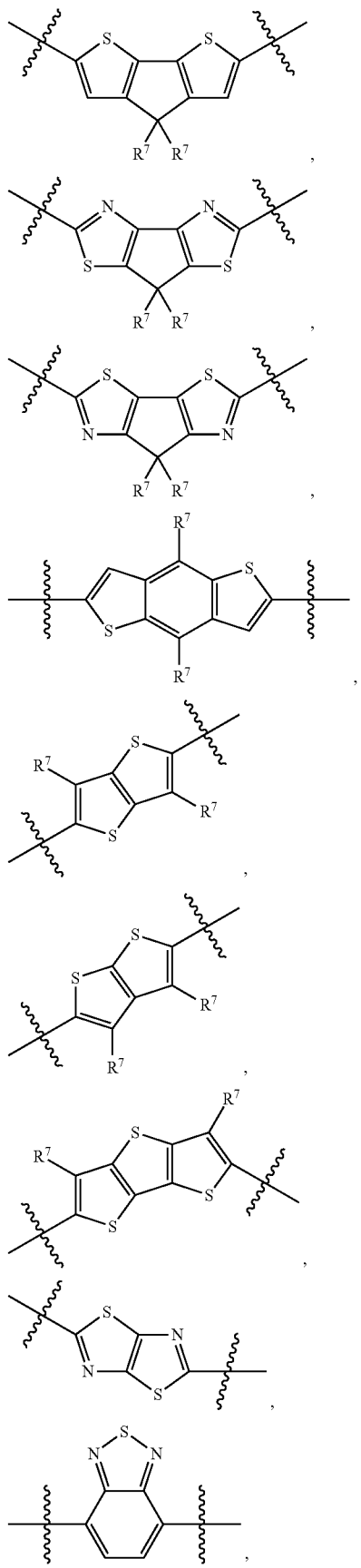

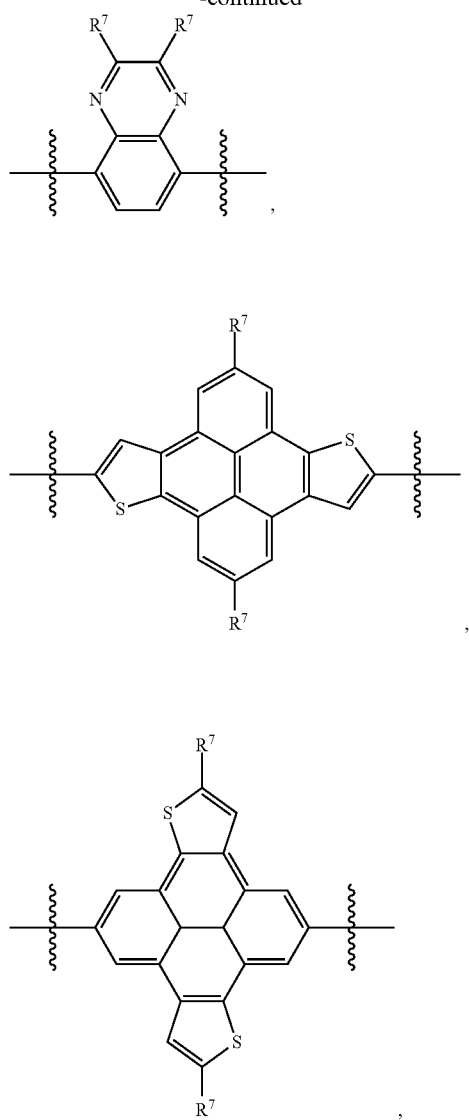

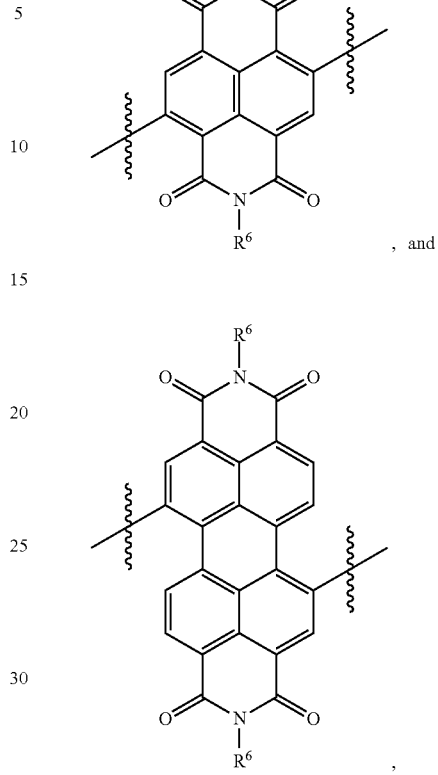

, and

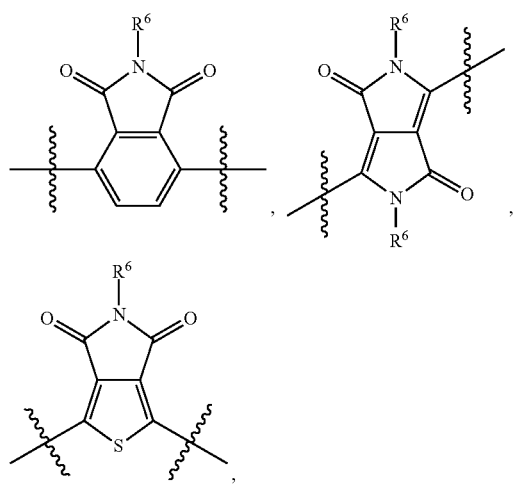

wherein $R^6$, at each occurrence, independently is H, a $C_{1-40}$ alkyl group, a $C_{1-40}$ haloalkyl group, —(CH$_2$CH$_2$O)$_t$—R$^e$, —(CF$_2$CF$_2$O)$_t$R$^e$, —(CH$_2$CF$_2$O)$_t$R$^e$, or —(CF$_2$CH$_2$O)$_t$R$^e$; and $R^7$, at each occurrence, independently is H, halogen, CN, a $C_{1-40}$ alkyl group, a $C_{1-40}$ alkoxy group, a $C_{1-40}$ alkylthio group, a $C_{1-40}$ haloalkyl group, —(OCH$_2$CH$_2$)$_t$OR$^e$, —(OCF$_2$CF$_2$)$_t$OR$^e$, —(OCH$_2$CF$_2$)$_t$OR$^e$, —(OCF$_2$CH$_2$)$_t$OR$^e$, —(CH$_2$CH$_2$O)$_t$—R$^e$, —(CF$_2$CF$_2$O)$_t$R$^e$, —(CH$_2$CF$_2$O)$_t$R$^e$, or —(CF$_2$CH$_2$O)$_t$R$^e$; wherein t is 1, 2, 3, 4, 5, 6, 7, 8, 9 or 10; and R$^e$ is a $C_{1-20}$ alkyl group, or a $C_{1-20}$ haloalkyl group.

In some embodiments, M$^2$ can have the formula:

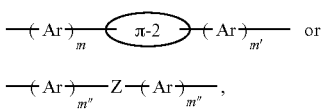

which can be selected from:

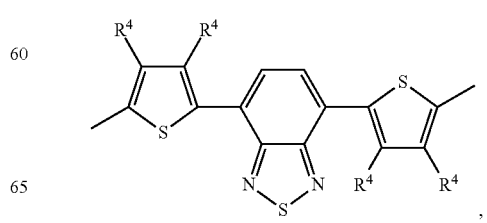

-continued

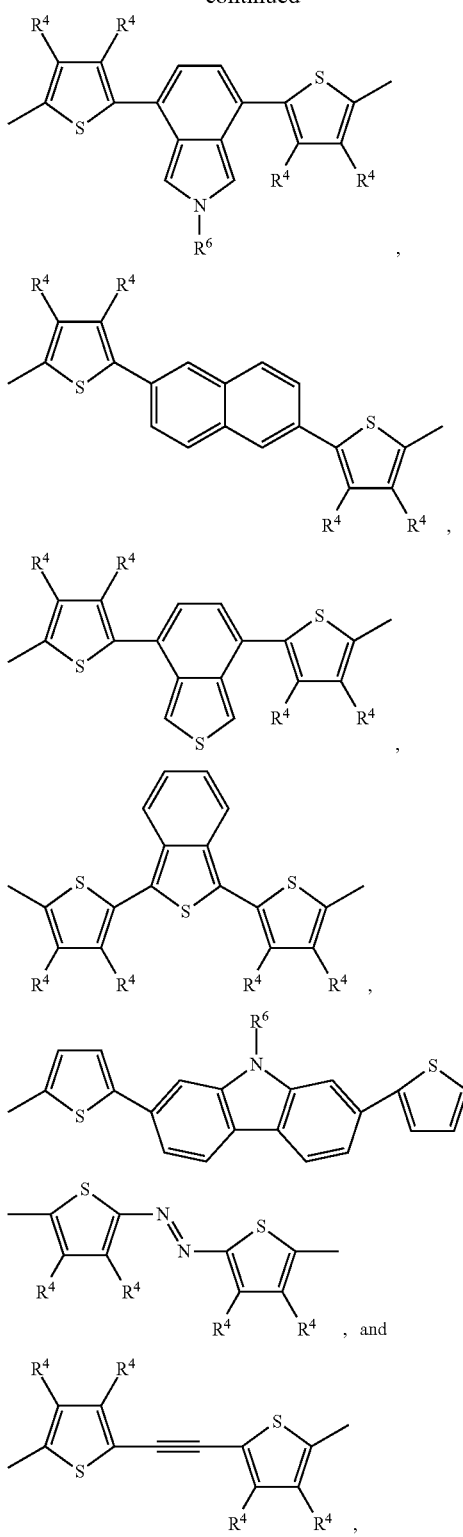

wherein:
R⁴, at each occurrence, independently can be selected from H, a halogen, —CN, a $C_{1-20}$ alkyl group, a $C_{1-20}$ alkoxy group, a $C_{1-20}$ alkylthio group, and a $C_{1-20}$ haloalkyl group; and R⁶, at each occurrence, independently can be selected from H, a $C_{1-20}$ alkyl group, and a $C_{1-20}$ haloalkyl group.

Exemplary compounds of the present teachings include polythiophenes such as:

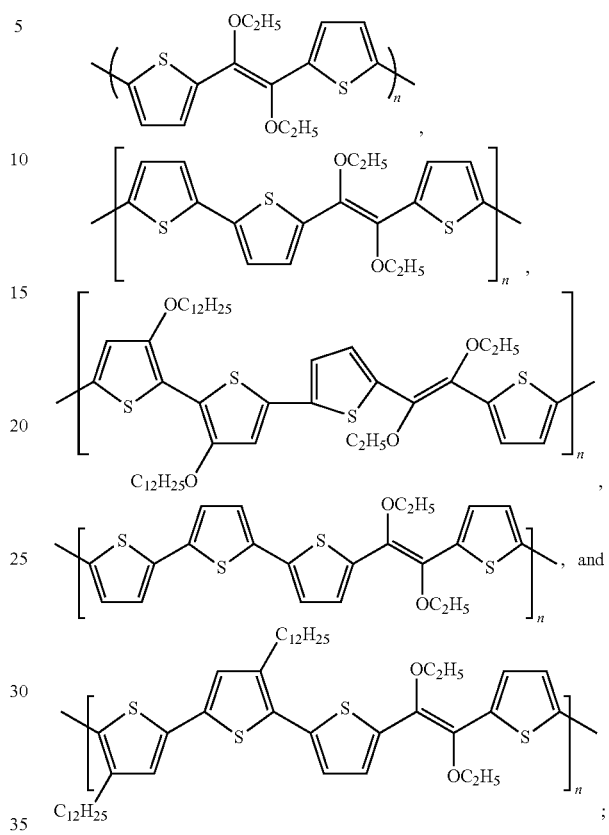

as well as copolymers such as:

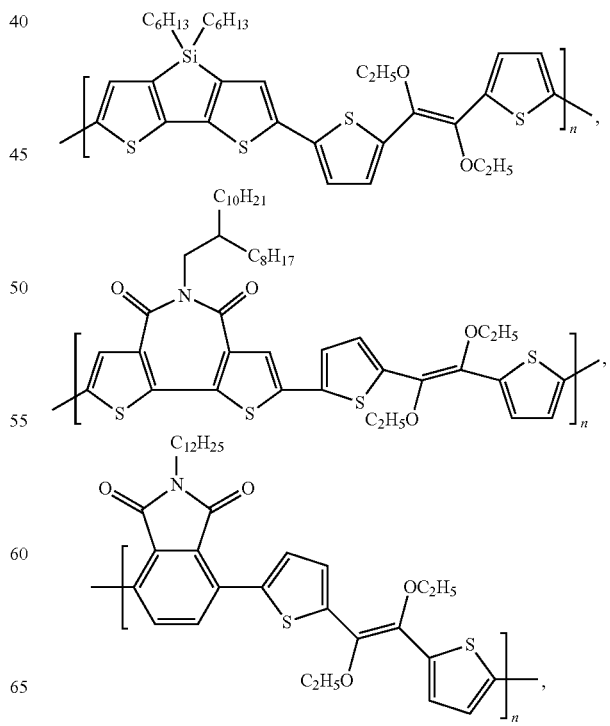

51
-continued

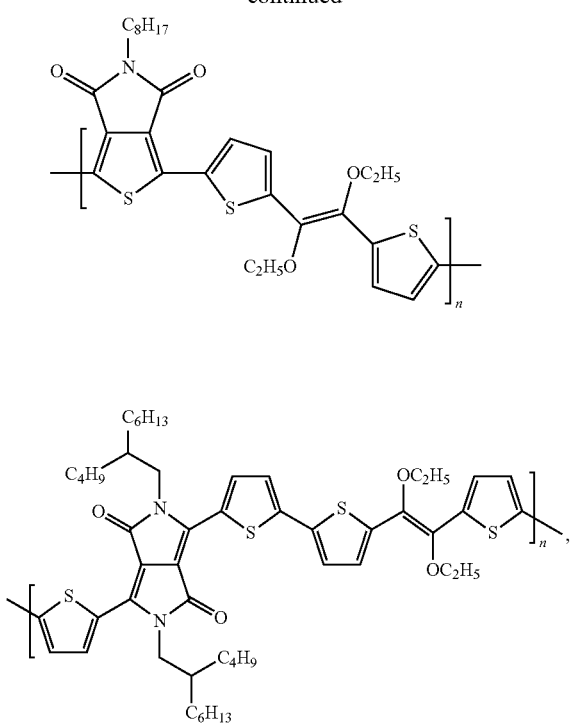

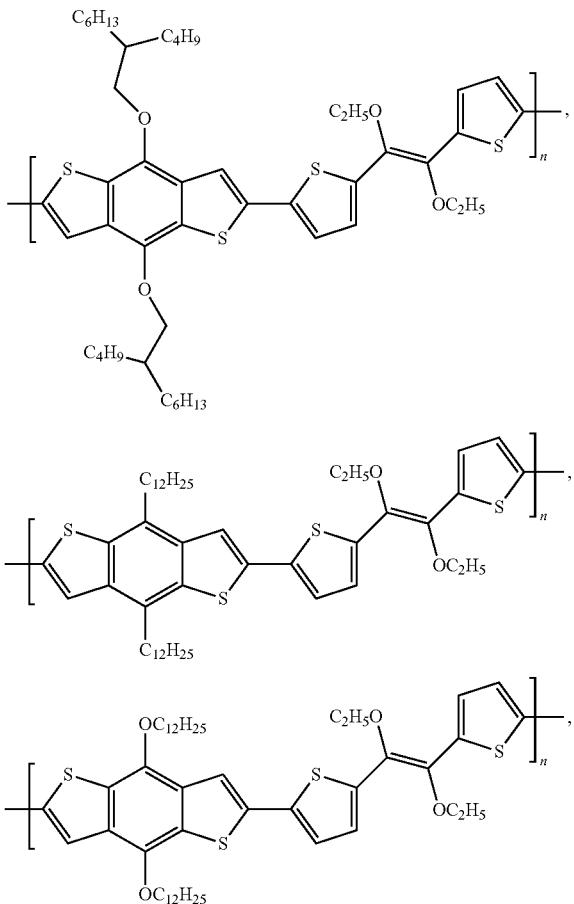

52
-continued

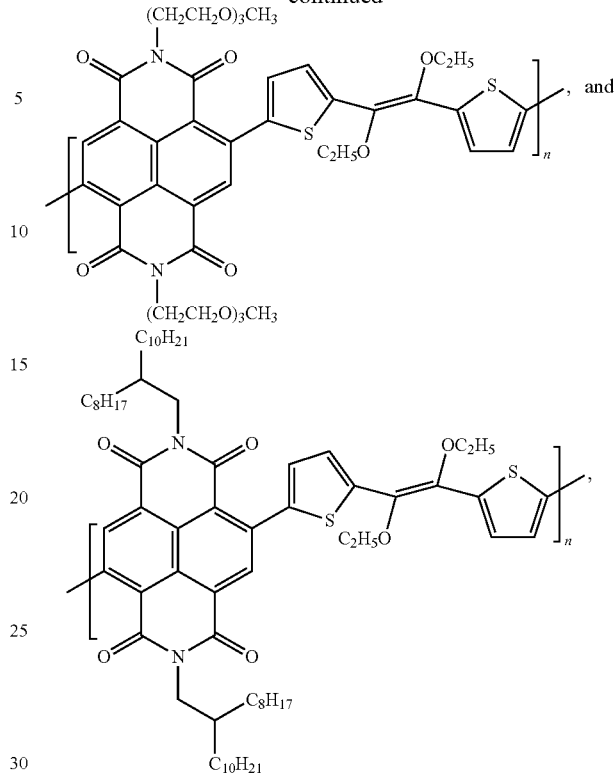

where n is an integer in the range of 3 to 10,000. Additional exemplary polymers include random copolymers of $M^1$ and a repeating unit $M^2$, where $M^2$ can include an optionally substituted (e.g., N,N'-dialkyl-substituted) naphthalene tetracarboxylic diimide moiety, an optionally substituted (e.g., 3,3'-dialkyl-substituted) silylene-2,2'-bithiophene moiety, an optionally substituted (e.g., N-alkyl-substituted) phthalimide moiety, or an optionally substituted (e.g., 2,5-dialkyl-substituted) pyrrolo[3,4-c]pyrrole-1,4-dione moiety such as those described above.

Compounds of the present teachings can be prepared according to procedures analogous to those described in the Examples. In particular, Stille coupling can be used to prepare co-polymeric compounds according to the present teachings with high molecular weight and in high yield (≥75%) and purity, as confirmed by $^1$H NMR spectra, elemental analysis, and GPC measurements.

Alternatively, the present compounds can be prepared from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), spectrophotometry (e.g., UV-visible), mass spectrometry (MS), or by chromatography such as high pressure liquid chromatograpy (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Certain embodiments disclosed herein can be stable under ambient conditions ("ambient stable"), soluble in common solvents, and in turn solution-processable into various articles, structures, or devices. As used herein, a compound can be considered "ambient stable" or "stable at ambient conditions" when the carrier mobility or the reduction-potential of the compound is maintained at about its initial measurement when the compound is exposed to ambient conditions, for example, air, ambient temperature, and humidity, over a period of time. For example, a polymer according to the present teachings can be described as ambient stable if its carrier mobility or reduction potential does not vary more than 20% or more than 10% from its initial value after exposure to ambient conditions, including, air, humidity and temperature, over a 3 day, 5 day, or 10 day period. Without wishing to be bound by any particular theory, it is believed that the strong electron-depleted electronic structure of the thienocoronene moiety, and in the case of the polymers, the regioregular highly π-conjugated polymeric backbone, can make the present compounds ambient-stable n-channel semiconductor materials without requiring additional π-core functionalization (i.e., core substitution of the thienocoronene moiety) with strong electron-withdrawing functionalities.

As used herein, a compound can be considered soluble in a solvent when at least 0.1 mg of the compound can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl) ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone.

As used herein, "solution-processable" refers to compounds (e.g., thienocoronene-imide copolymers), materials, or compositions that can be used in various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating.

The present teachings, therefore, further provide methods of preparing a semiconductor material. The methods can include preparing a composition that includes one or more compounds disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a thin film semiconductor) that includes a compound disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatiblizing agents, curing agents, initiators, humectants, antifoaming agents, wetting agents, pH modifiers, biocides, and bactereriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatiblizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone casting, dip coating, blade coating, or spraying.

Compounds of the present teachings can be used to prepare semiconductor materials (e.g., compositions and composites), which in turn can be used to fabricate various articles of manufacture, structures, and devices. In some embodiments, semiconductor materials incorporating one or more compounds of the present teachings can exhibit p-type semiconductor activity, ambipolar activity, light absorption, and/or light emission.

The present teachings, therefore, further provide methods of preparing a semiconductor material. The methods can include preparing a composition that includes one or more compounds disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a thin film semiconductor) that includes a compound disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatiblizing agents, curing agents, initiators, humectants, antifoaming agents, wetting agents, pH modifiers, biocides, and bactereriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatiblizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone casting, dip coating, blade coating, or spraying.

Various articles of manufacture including electronic devices, optical devices, and optoelectronic devices, such as thin film semiconductors, field effect transistors (e.g., thin film transistors), photovoltaics, photodetectors, organic light emitting devices such as organic light emitting diodes (OLEDs) and organic light emitting transistors (OLETs), complementary metal oxide semiconductors (CMOSs), complementary inverters, diodes, capacitors, sensors, D flip-flops, rectifiers, and ring oscillators, that make use of the compounds disclosed herein are within the scope of the present teachings as are methods of making the same. The present compounds can offer processing and operation advantages in the fabrication and/or the use of these devices.

For example, articles of manufacture such as the various devices described herein can be an electronic or optoelectronic device including a first electrode, a second electrode, and a semiconducting component in contact with the first electrode and the electrode, where the semiconducting component includes a compound of the present teachings. These devices can include a composite having a semiconducting component (or semiconductor material) of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials (e.g., as described in Yoon, M-H. et al., *PNAS*, 102 (13): 4678-4682 (2005), the entire disclosure of which is incorporated by reference herein), as well as hybrid organic/inorganic dielectric materials (e.g., described in U.S. patent application Ser. No. 11/642,504, the entire disclosure of which is incorporated by reference herein). In some embodiments, the dielectric component can include the crosslinked polymer blends described in U.S. patent application Ser. Nos. 11/315,076, 60/816,952, and 60/861,308, the entire disclosure of each of which is incorporated by reference herein. The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene) poly(styrenesulfonate) (PEDOT:PSS), polyaniline (PANI), polypyrrole (PPy)). One or more of the composites described herein can be embodied within various organic electronic, optical, and optoelectronic devices such as organic thin film transistors (OTFTs), specifically, organic field effect transistors (OFETs), as well as sensors, capacitors, unipolar circuits, complementary circuits (e.g., inverter circuits), and the like.

Accordingly, an aspect of the present teachings relates to methods of fabricating an organic field effect transistor that incorporates a semiconductor material of the present teachings. The semiconductor materials of the present teachings can be used to fabricate various types of organic field effect transistors including top-gate top-contact capacitor structures, top-gate bottom-contact capacitor structures, bottom-gate top-contact capacitor structures, and bottom-gate bottom-contact capacitor structures.

FIG. 1 illustrates the four common types of OFET structures: (*a*) bottom-gate top-contact structure, (*b*) bottom-gate bottom-contact structure, (*c*) top-gate bottom-contact structure, and (*d*) top-gate top-contact structure. As shown in FIG. 1, an OFET can include a gate dielectric component (e.g., shown as 8, 8', 8", and 8'''), a semiconducting component or semiconductor layer (e.g., shown as 6, 6', 6", and 6'''), a gate electrode or contact (e.g., shown as 10, 10', 10", and 10'''), a substrate (e.g., shown as 12, 12', 12", and 12'''), and source and drain electrodes or contacts (e.g., shown as 2, 2', 2", 2''', 4, 4', 4", and 4'''). As shown, in each of the configurations, the semiconducting component is in contact with the source and drain electrodes and the gate dielectric component.

In certain embodiments, OTFT devices can be fabricated with the present compounds on doped silicon substrates, using $SiO_2$ as the dielectric, in top-contact geometries. In particular embodiments, the active semiconductor layer which incorporates at least a compound of the present teachings can be deposited at room temperature or at an elevated temperature. In other embodiments, the active semiconductor layer which incorporates at least one compound of the present teachings can be applied by spin-coating or printing as described herein. For top-contact devices, metallic contacts can be patterned on top of the films using shadow masks.

In certain embodiments, OTFT devices can be fabricated with the present compounds on plastic foils, using polymers as the dielectric, in top-gate bottom-contact geometries. In particular embodiments, the active semiconducting layer which incorporates at least a compound of the present teachings can be deposited at room temperature or at an elevated temperature. In other embodiments, the active semiconducting layer which incorporates at least a compound of the present teachings can be applied by spin-coating or printing as described herein. Gate and source/drain contacts can be made of Au, other metals, or conducting polymers and deposited by vapor-deposition and/or printing.

In various embodiments, a semiconducting component incorporating compounds of the present teachings can exhibit semiconducting activity, for example, a carrier mobility of $10^{-4}$ $cm^2$/V-sec or greater and/or a current on/off ratio ($I_{on}/I_{off}$) of $10^3$ or greater.

Other articles of manufacture in which compounds of the present teachings are useful are photovoltaics or solar cells. Compounds of the present teachings can exhibit broad optical absorption and/or a tuned redox properties and bulk carrier mobilities, making them desirable for such applications. Accordingly, the compounds described herein can be used as a donor (p-type) semiconductor material in a photovoltaic design, which includes an adjacent n-type semiconductor material that forms a p-n junction. The compounds can be in the form of a thin film semiconductor, which can be deposited on a substrate to form a composite. Exploitation of compounds of the present teachings in such devices is within the knowledge of a skilled artisan.

In various embodiments, a semiconducting component incorporating compounds of the present teachings can enable photovoltaic cells with power conversion efficiency of about 1% or greater.

Figure 2:
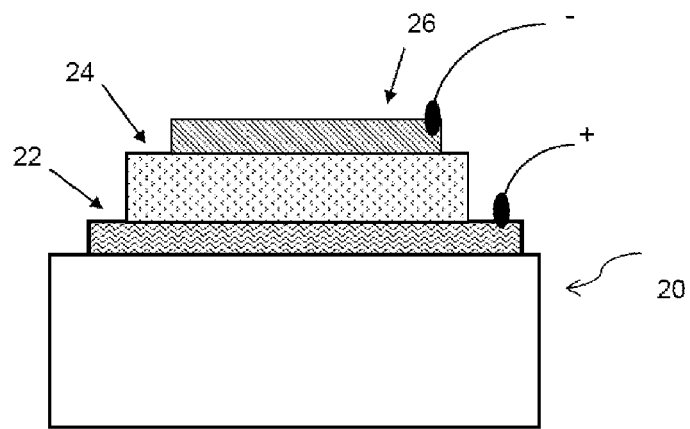
FIG. 2 illustrates a representative structure of a bulk-heterojunction organic photovoltaic device (also known as solar cell), which can incorporate one or more compounds of the present teachings as the donor and/or acceptor materials.
Figure 3:
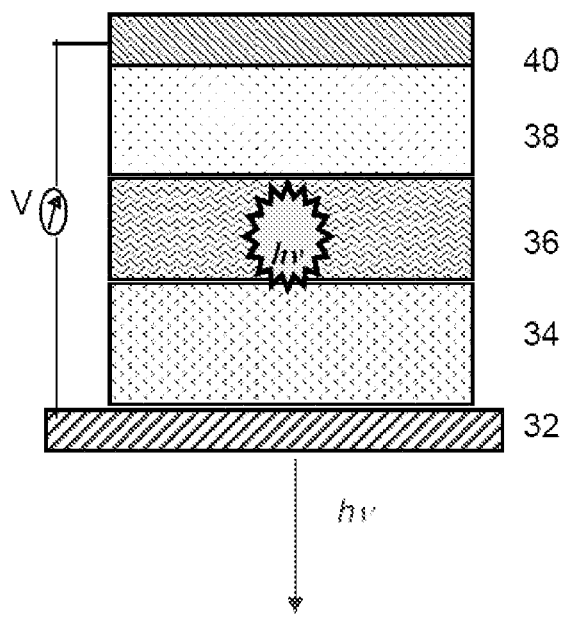
FIG. 3 illustrates a representative structure of an organic light-emitting device, which can incorporate one or more compounds of the present teachings as electron-transporting and/or emissive and/or hole-transporting materials.

Accordingly, another aspect of the present teachings relates to methods of fabricating an organic light-emitting transistor, an organic light-emitting diode (OLED), or an organic photovoltaic device that incorporates one or more semiconductor materials of the present teachings. FIG. 2 illustrates a representative structure of a bulk-heterojunction organic photovoltaic device (also known as solar cell) which can incorporate one or more compounds of the present teachings as the donor and/or acceptor materials. As shown, a representative solar cell generally includes a substrate 20 (e.g., glass), an anode 22 (e.g., ITO), a cathode 26 (e.g., aluminium or calcium), and a photoactive layer 24 between the anode and the cathode which can incorporate one or more compounds of the present teachings as the electron donor (p-channel) and/or electron acceptor (n-channel) materials. FIG. 3 illustrates a representative structure of an OLED which can incorporate one or more compounds of the present teachings as electron-transporting and/or emissive and/or hole-transporting materials. As shown, an OLED generally includes a substrate 30 (not shown), a transparent anode 32 (e.g., ITO), a cathode 40 (e.g., metal), and one or more organic layers which can incorporate one or more compounds of the present teachings as hole-transporting (n-channel) (layer 34 as shown) and/or emissive (layer 36 as shown) and/or electron-transporting (p-channel) materials (layer 38 as shown). In embodiments where the present compounds only have one or two of the properties of hole transport, electron transport, and emission, the present compounds can be blended with one or more further organic compounds having the remaining required property or properties.

The following examples are provided to illustrate further and to facilitate the understanding of the present teachings and are not in any way intended to limit the invention.

EXAMPLE 1

Compound Synthesis

Anhydrous tetrahydrofuran (THF), acetonitrile and toluene were distilled from appropriate drying agents and stored over molecular sieves under argon. Regioregular poly(3-hexylthiophene) (rr-P3HT) was purchased from American Dye Source, Inc. (Quebec, Canada). 5,5'-Bis(tributylstannyl)-3,3'-bis(dodecyloxy)-2,2'-bithiophene was synthesized via procedures as described in Guo and Watson, *Org. Lett.*, 10: 5333-5336 (2008). All other reagents were used as received except where noted. Unless otherwise stated, all manipulations and reactions were carried out under argon atmosphere using standard Schlenk techniques. $^1$H and $^{13}$C spectra were recorded on a Varian NOVA 400 MHz spectrometer. Chemical shifts were referenced to residual protio-solvent signals. GC-MS data were collected from an Agilent technologies 6890N GC with 5973 MSD. Relative molecular weights of polymers were measured using a Waters 600E HPLC system, driven by Waters Empower Software and equipped with two linear mixed-bed GPC columns (American Polymer Standards Corporation, AM Gel Linear/15) in series. Eluting polymers were detected with both refractive index and photodiode array detectors and the system was calibrated with 11 narrow PDI polystyrene samples in the range of 580 Da to 2×10$^6$ Da with THF at a flow rate of 1 mL/min. UV-Vis data were recorded on a Varian Cary 1 UV-Visible spectrophotometer. Elemental analysis and ICP were performed by Robertson Microlit Laboratories.

EXAMPLE 1A

Synthesis of Chromium-Carbene Complex [(C$_4$H$_3$S)C(OC$_2$H$_5$)]Cr(CO)$_5$ (7)

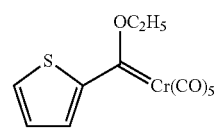

(7)

A hexane solution of n-BuLi (10 mL, 25 mmol) was added dropwise to a THF solution (40 mL) of thiophene (2.1 g, 25 mmol) over 5 minutes at −78° C. The mixture was warmed to room temperature slowly and stirred for 30 minutes at room temperature. Then, the solution was cooled to −78° C., and chromium hexacarbonyl (Cr(CO)$_6$, 5.5 g, 25 mmol) was added portionwise. The mixture was warmed to room temperature again, and the color of the mixture changed gradually to a dark brown. After 30 minutes at room temperature, the solvent was removed under vacuum and CH$_2$Cl$_2$ (40 mL) was added. The solution was cooled to −78° C., and a CH$_2$Cl$_2$ solution (20 mL) of Et$_3$OBF$_4$ (6.0 g, 31.6 mmol) was added dropwise by syringe. The solvent was removed overnight to give a dark red solid. The solid was employed for column chromatography with hexane as an eluent. Three bands (yellow, red, and purple) were observed in the column. The red band was collected and the solvent was removed to give a dark red crystalline solid (5.8 g, 70% yield).

$^1$H NMR(CHCl$_3$, 500 M, 25° C.) δ 8.27 (H, d, J=4 Hz, Th-H); 7.71 (H, d, J=5 Hz, Th-H); 7.23 (H, t, J=4 Hz, J=5 Hz, Th-H); 5.19 (2H, q, J=7 Hz, CH$_2$) 1.69 (2H, t, J=7 Hz, CH$_3$). $^{13}$C NMR (CHCl$_3$, 125.7 M, 25° C.) δ 217.1; 211.6; 155.3; 141.2; 134.9; 129.0; 76.1; 15.2.

EXAMPLE 1B

Synthesis of (E)-1,2-diethoxy-1,2-di(thiophen-2-yl)ethene (8)

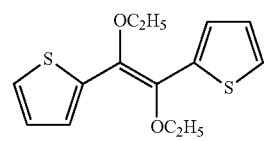

(8)

A THF solution (40 mL) of compound 7 (1.0 g, 3.0 mmol) and Pd(PPh$_3$)$_4$ (350 mg, 0.30 mmol) was heated to reflux for 3-4 hours. The reaction was cooled to room temperature. The reaction was quenched with water (50 mL) and extracted with ethyl ether (100 mL×3). The solvent was removed to give an off-white solid, which was employed for column chromatography with a 1:8 mixture of ethyl acetate:hexane as eluent to give a colorless solution. The solvent was removed to give a colorless crystalline solid (250 mg, 60% yield).

C$_{14}$H$_{16}$O$_2$S$_2$; Anal. Calc: C, 59.97; H, 5.75; Found: C, 60.05; H, 5.78. $^1$H NMR(CHCl$_3$, 500 M, 25° C.) δ 7.36 (H, dd, J=1 Hz, J=5 Hz, Th-H); 7.33 (H, dd, J=1 Hz, J=4 Hz, Th-H); 7.08 (H, dd, J=4 Hz, J=5 Hz, Th-H); 3.88 (2H, q, J=7 Hz, CH$_2$): 1.43 (3H, t, J=7 Hz, CH$_3$). $^{13}$C NMR (CHCl$_3$, 125.7 M, 25° C.) δ 140.5; 136.2; 125.5; 67.5; 15.5.

EXAMPLE 1C

Synthesis of bistrimethyltin-2 (9)

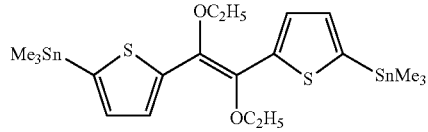

(9)

A hexane solution of n-BuLi (0.45 mL, 1.1 mmol) was added dropwise to an ethyl ether solution (20 mL) of compound 8 (120 mg, 0.42 mmol) at −78° C. The mixture was stirred at −78° C. for 30 minutes. The mixture was warmed to room temperature slowly and stirred for 1 hour to give a brown mixture, which was cooled to −78° C. Trimethyltin chloride (Me$_3$SnCl, 1.1 mL, 1.1 mmol) was added dropwise and the mixture was stirred overnight to give a brownish yellow mixture. A saturated aqueous NH$_4$Cl was added to quenche the reaction, which was extracted with ethyl ether (100 mL×3). The organic part was washed with water (100 mL×3), and dried over MgSO$_4$. The mixture was filtered and the solvent was removed to give a light yellow crystalline solid (220 mg, 88% yield).

C$_{20}$H$_{32}$O$_2$S$_2$Sn$_2$; Anal. Calc: C, 40.90; H, 5.15; Found: C, 39.64; H, 5.32. $^1$H NMR(CHCl$_3$, 500 M, 25° C.) δ 7.44 (H, d, J=4 Hz, Th-H); 7.17 (H, d, J=4 Hz, Th-H); 3.88 (2H, q, J=7 Hz, CH$_2$); 1.45 (3H, t, J=7 Hz, CH$_3$); 0.47 (9H, s). $^{13}$C NMR (CHCl$_3$, 125.7 M, 25° C.) δ 142.2; 140.6; 134.6; 126.4; 67.6; 15.6; 8.2.

EXAMPLE 1D

Synthesis of oligomer 2T-2-2T (10)

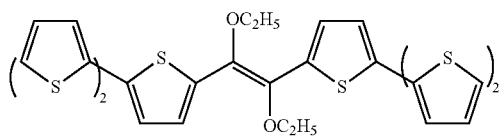

(10)

A DMF solution (3 mL) of bromobithiophene (82 mg, 0.33 mmol) and compound 9 (101 mg, 0.17 mmol) was heated at 110° C. for 2 days to give a dark red solution, which was cooled to room temperature to give a red solid. The mixture was filtered and washed with hexane. The red solid was collected and dried (60 mg, 60% yield).

C$_{30}$H$_{24}$O$_2$S$_6$; Anal. Calc: C, 59.18; H, 3.97; Found: C, 58.41; H, 4.27. $^1$H NMR(CHCl$_3$, 500 M, 25° C.) δ 7.25 (2H, m, Th-H); 7.21 (H, d, J=4 Hz, Th-H); 7.17 (H, d, J=4 Hz, Th-H); 7.13 (2H, m, Th-H); 7.05 (H, q, J=4 Hz, J=5 Hz); 3.95 (2H, q, J=4 Hz, CH$_2$); 1.51 (3H, t, J=4 Hz, CH$_3$). $^{13}$C NMR (CHCl$_3$, 125.7 M, 25° C.) δ 140.6, 137.9; 137.2; 136.3; 136.3; 134.9; 127.9; 126.4; 124.5; 124.4; 124.2; 123.7; 123.3; 68.0; 15.6.

EXAMPLE 1E

Synthesis of homopolymer of 8 (11)

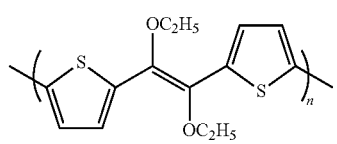

(11)

A dry CHCl$_3$ (10 mL) solution of compound 8 (180 mg, 6.4 mmol) was added dropwise into a CHCl$_3$ (20 mL) suspension of FeCl$_3$ (200 mg, 1.2 mmol). The mixture was warmed to 50° C. and stirred for 2 days. The mixture was cooled to room temperature and washed with water (200 mL). The organic layer was stirred with an aqueous solution of ammonia for 1 hour to give a dark red solution, which was washed with water (200 mL x 3) and dried over MgSO$_4$. The mixture was filtered and concentrated. The solution was added dropwise into methanol (200 mL) to give a large amount of precipitate, which was filtered and collected, and dried in air (35 mg, 20% yield).

C$_{14}$H$_{14}$O$_2$S$_2$; Anal. Calc: C, 60.47; H, 5.08; Found: C, 59.90; H, 4.81. $^1$H NMR(CHCl$_3$, 500 M, 25° C.) δ 7.26-7.12 (2H, mbr); 3.88-3.81 (2H, mbr); 1.42-1.39 (3H, mbr). Mn=3.0 K; PDI=1.14.

EXAMPLE 1F

Synthesis of copolymer P(NDI2OD-EtOTVT)

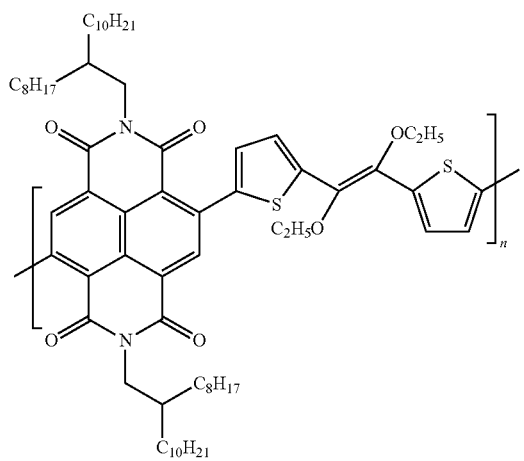

Under argon, a mixture of NDI$_2$OD-Br$_2$ (91.2 mg, 0.093 mmol), 5,5'-bis(trimethylstannyl)-(1,2-bis(2'-thienyl)-1,2-diethoxyvinyl (51.6 mg, 0.085 mmol), and Pd(PPh$_3$)$_2$Cl$_2$ (3.0 mg, 0.004 mmol) in anhydrous toluene (10 mL) was stirred at 90° C. for 21 hours. Bromobenzene (0.5 mL) was then added and the resulting mixture was stirred for 10 hours. After cooling to room temperature, a solution of potassium fluoride (1.5 g) in water (3 mL) was added. This mixture was stirred and shaken at room temperature for 1 hour, before it was diluted with chloroform (100 mL). The resulting mixture was washed with water (60 mL×3), dried over anhydrous $Na_2SO_4$, and concentrated on a rotary evaporator. The residue was taken with chloroform (10 mL) and precipitated in methanol (100 mL). The precipitate was collected by filtration and redissolved in chloroform (10 mL). This chloroform solution was precipitated again in acetone (100 mL), leading to a dark blue solid as the crude product. This crude product was purified by Soxhlet extraction with methanol and acetone for 48 hours. The isolated solid was dissolved in chloroform (30 mL) and then heated to boil. Upon cooling to room temperature, the chloroform solution was passed through a syringe filter (5 μm), and the filtrate was precipitated in methanol (60 mL). The precipitate was collected by filtration, washed with methanol, and dried in vacuum, leading to a dark blue solid (85.0 mg, 90.5% yield).

$^1$H NMR ($CDCl_2CDCl_2$, 500 MHz): δ: 8.83 (s, br, 2H), 7.44 (s, br, 2H), 7.39 (s, br, 4H), 4.10 (br, 8H), 2.00 (br, 2H), 1.54 (pseudo-t, br, 6H), 1.18-1.46 (m, br, 64H), 0.82-0.89 (m, br, 12H). GPC: $M_n$=14.8 K Da, $M_w$=46.5 K Da, PDI=3.1. Elemental Analysis (calc. C, 74.00; H, 8.95; N, 2.54): found C, 74.30; H, 8.98; N, 2.68.

EXAMPLE 1G

Synthesis of copolymer P(TS6-EtOTVT)

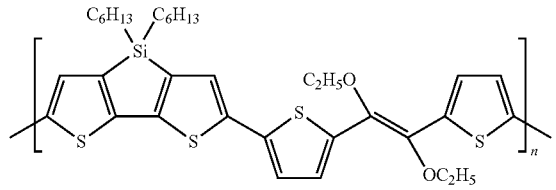

Under argon, a mixture of 5,5'-dibromo-3,3'-di-n-hexylsilylene-2,2'-bithiophene (56.6 mg, 0.11 mmol), 5,5'-bis(trimethylstannyl)-(1,2-bis(2'-thienyl)-1,2-diethoxyvinyl (65.9 mg, 0.11 mmol), and $Pd(PPh_3)_2Cl_2$ (5.8 mg, 0.008 mmol) in anhydrous THF (8 mL) was stirred at reflux for 8.5 hours. Bromobenzene (0.5 mL) was then added, and this mixture was stirred at reflux overnight. After cooling to room temperature, the reaction mixture was poured into methanol (100 mL). The precipitate was collected by filtration, washed with methanol, and precipitated in methanol again. The isolated solid was subjected to Soxhlet extraction with methanol for 24 hours, before it was precipitated in methanol, leading to a dark solid as the product (59.0 mg, 84.9%).

$^1$H NMR ($CDCl_3$, 500 MHz): δ: 7.10-7.30 (m, br, 6H), 3.96 (br, 4H), 1.15-1.51 (m, br, 22H), 0.96 (m, br, 4H), 0.87 (m, br, 6H). GPC: $M_n$=308.1 K Da, $M_w$=1350 K Da, PDI =4.4. Elemental Analysis (calc. C, 63.90; H, 6.62; N, 0.00): found C, 63.35; H, 6.62; N, 0.00.

EXAMPLE 1H

Synthesis of copolymer P(PH12-EtOTVT)

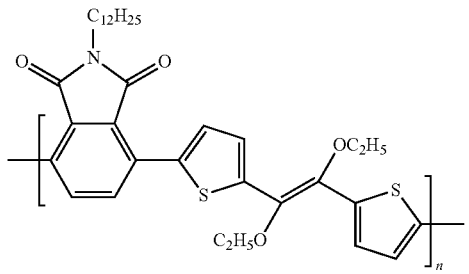

Under argon, a mixture of N-dodecyl-3,6-dibromophthalimide (37.6 mg, 0.079 mmol), 5,5'-bis(trimethylstannyl)-(1,2-bis(2'-thienyl)-1,2-diethoxyvinyl (48.2 mg, 0.079 mmol), and $Pd(PPh_3)_2Cl_2$ (2.8 mg, 0.004 mmol) in anhydrous toluene (5 mL) was stirred at reflux for 43 hours. Bromobenzene (0.3 mL) was then added, and this mixture was stirred at reflux overnight. After cooling to room temperature, the reaction mixture was poured into a mixture of methanol (100 mL) and concentrated HCl solution (5 mL). The precipitate was collected by filtration, washed with methanol, and precipitated in methanol again. The isolated solid was subjected to Soxhlet extraction with methanol for 24 hours, before it was precipitated in methanol, leading to an orange/red solid as the product (39.1 mg, 83.2%).

$^1$H NMR ($CDCl_3$, 500 MHz): δ: 7.90 (d, br, 2H), 7.87 (s, br, 2H), 7.42 (d, br, 2H), 4.02 (m, br, 4H), 3.71 (m, br, 2H), 1.70 (br, 2H), 1.54 (m, br, 6H), 1.21-1.40 (m, br, 18H), 0.86(t, br, 3H). GPC: $M_n$=5.7 K Da, $M_w$=8.4 K Da, PDI =1.5. Elemental Analysis (calc. C, 69.00; H, 6.98; N, 2.37): found C, 68.66; H, 7.07; N, 2.41.

EXAMPLE 1I

Synthesis of copolymer P(DPP2BO-EtOTVT)

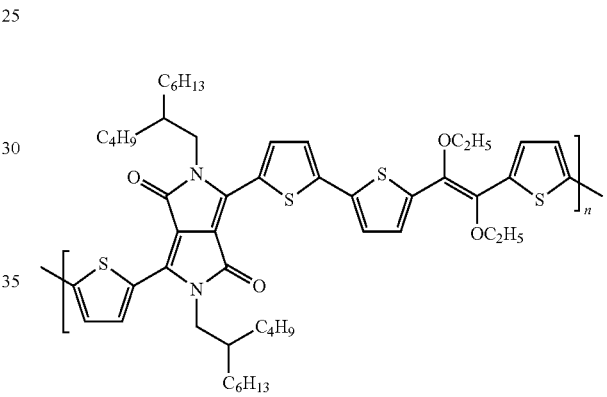

Under nitrogen, a mixture of 3,6-di(2-bromothien-5-yl)-2,5-di(2-butyloctyl)-pyrrolo[3,4-c]pyrrole-1,4-dione (65.1 mg, 0.082 mmol), 5,5'-bis(trimethylstannyl)-(1,2-bis(2'-thienyl)-1,2-diethoxyvinyl (50.7 mg, 0.084 mmol), tri(o-tolyl)phosphine (8.45 mg, 0.027 mmol), and tris(dibenzylideneacetone)dipalladium(O) (3.1 mg, 0.0033 mmol) in anhydrous chlorobenzene (15 mL) was stirred at 130° C. for 18 hours. After cooling to room temperature, the reaction mixture was poured into methanol, and the precipitate was collected by filtration. This isolated crude product was then subjected to Soxhlet extraction with methanol (5 hours), ethyl acetate (3 hours), and dichloromethane (24 hours). Finally, the product was extracted with chloroform (5 hours), followed by chlorobenzene (5 hours). Both the chloroform and chlorobenzene extracts were precipitated in methanol, leading to two portions of dark solid as the final product (4 mg for chloroform extract, and 26 mg for chlorobenzene extract).

EXAMPLE 1J

Synthesis of copolymer P(C12T2-EtOTVT)

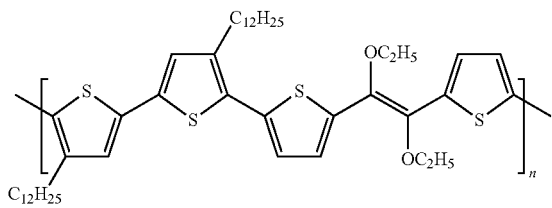

Under argon, a mixture of 2,2'-dibromo-3,3'-bisdodecyl-5,5'-bithiophene (68.1 mg, 0.10 mmol), 5,5'-bis(trimethylstannyl)-(1,2-bis(2'-thienyl)-1,2-diethoxyvinyl (62.5 mg, 0.10 mmol), tri(o-tolyl)phosphine (5.0 mg, 0.016 mmol), and tris(dibenzylideneacetone)dipalladium(O) (3.8 mg, 0.004 mmol) in anhydrous toluene (15 mL) was stirred at reflux for 48 hours. Bromobenzene (0.3 mL) was then added, and this mixture was heated to reflux for 10 hours. After cooling to room temperature, the reaction mixture was poured into a mixture of methanol (100 mL) and concentrated HCl solution (5 mL), and the precipitate was collected by filtration. This isolated crude product was then subjected to Soxhlet extraction with methanol, acetone, and hexane for 24 hours each. Finally, the product was extracted with chloroform, and the extract was concentrated before it was precipitated in methanol (100 mL) again, leading to a dark red solid as the product (63.0 mg, 78.5%).

$^1$H NMR (CDCl$_3$, 500 MHz): δ: 7.28 (s, br, 2H), 7.13 (s, br, 2H), 7.04 (s, br, 2H), 3.97 (m, br, 4H), 2.82 (m, br, 4H), 1.73 (m, br, 4H), 1.51 (m, br, 6H), 1.44 (m, br, 4H), 1.22-1.38 (m, br, 32H), 0.85-0.91 (t, J=7.0 Hz, 6H). GPC: $M_n$=34.3 K Da, $M_w$=78.0 K Da, PDI=2.3. Elemental Analysis (calc. C, 70.90; H, 8.54; N, 0.00): found C, 70.55; H, 8.39; N, 0.00.

EXAMPLE 1K

Synthesis of copolymer P(2BOOTBT-EtOTVT)

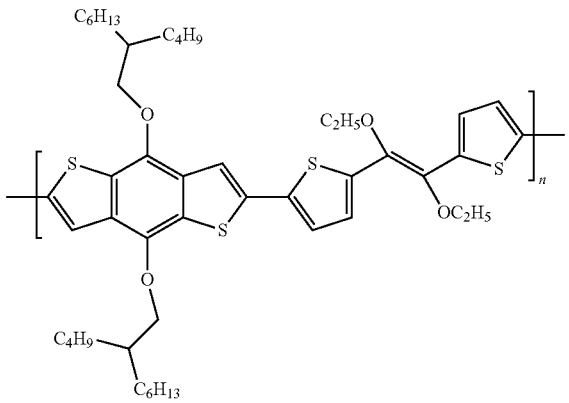

Under argon, a mixture of 2,6-diiodo-4,8-bis(2-butyloctyloxy)benzo[1,2-b;3,4-b]dithiophene (109.3 mg, 0.14 mmol), 5,5'-bis(trimethylstannyl)-(1,2-bis(2'-thienyl)-1,2-diethoxyvinyl (81.7 mg, 0.14 mmol), tri(o-tolyl)phosphine (4.9 mg, 0.016 mmol), and tris(dibenzylideneacetone)dipalladium(O) (3.7 mg, 0.004 mmol) in anhydrous toluene (15 mL) was stirred at refluxing for 48 hours. Bromobenzene (0.4 mL) was then added, and this mixture was heated to reflux for 12 hours. After cooling to room temperature, the reaction mixture was poured into a mixture of methanol (100 mL) and concentrated HCl solution (5 mL), and the precipitate was collected by filtration. The isolated crude product was then subjected to Soxhlet extraction with methanol, acetone, and hexane for 24 hours each. Finally, the product was extracted with chloroform, and the extract was concentrated before it was precipitated in methanol (100 mL) again, leading to a dark red solid as the product (71.0 mg, 63.1%).

$^1$H NMR (CDCl$_3$, 500 MHz): δ: 7.55 (s, br, 2H), 7.32 (s, br, 4H), 4.21 (s, br, 4H), 3.99 (s, br, 4H), 1.92 (s, br, 2H), 1.69 (s, br, 4H), 1.20-1.60 (m, br, 34H), 1.00 (m, br, 6H), 0.92 (m, br, 6H). GPC: $M_n$=13.5 K Da, $M_w$=72.1 K Da, PDI =5.3. Elemental Analysis (calc. C, 69.02; H, 7.96; N, 0.00): found C, 68.84; H, 7.88; N, 0.00.

EXAMPLE 1L

Synthesis of copolymer P(C12TBT-ETOTVT)

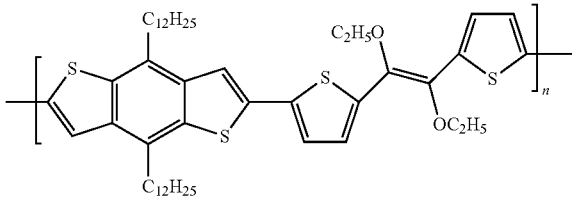

Under argon, a mixture of 2,6-dibromo-4,8-bisdodecylbenzo[1,2-b;3,4-b]dithiophene (214.6 mg, 0.313 mmol), 5,5'-bis(trimethylstannyl)-(1,2-bis(2'-thienyl)-1,2-diethoxyvinyl (189.9 mg, 0.313 mmol), and PdCl$_2$(PPh$_3$)$_2$ (9.0 mg, 0.0128 mmol) in anhydrous toluene (20 mL) was stirred at refluxing for 2 days. Bromobenzene (0.5 mL) was then added, and this mixture was refluxed for additional 7 hours. After cooling to room temperature, the reaction mixture was poured into methanol (150 mL). This mixture was stirred at room temperature for 30 minutes, and the precipitate was collected by filtration. The isolated crude product was then subjected to Soxhlet extraction with methanol, acetone, and hexane. Finally, the product was extracted with chloroform and chlorobenzene in sequence. Both of the extracts were concentrated to about 50 mL, and the resulting mixtures were precipitated in methanol (150 mL), leading to a dark red solid as the product (portion A from chloroform extract: 113.5 mg, 45.1%; portion B from chlorobenzene extract: 100.0 mg, 39.8%.).

$^1$H NMR (Portion A) (CDCl$_3$, 500 MHz): δ: 7.54 (s, br, 2H), 7.34 (s, br, 4H), 4.02 (s, br, 4H), 3.16 (s, br, 4H), 1.86 (s, br, 4H), 1.20-1.60 (m, br, 42H), 0.84-0.91 (m, br, 6H). GPC (portion A): $M_n$=12.4 K Da, $M_w$=25.0 K Da, PDI =2.02. Elemental Analysis (Portion A) (calc. C, 71.77; H, 8.28; N,

EXAMPLE 1M

Synthesis of copolymer P(C8TPD-ETOTVT)

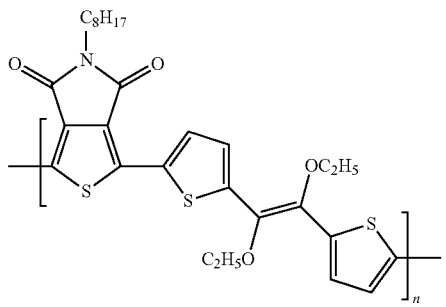

Under argon, a mixture of 1,3-dibromo-5-octylthieno[3,4-c]pyrrole-4,6-dione (92.2 mg, 0.22 mmol), 5,5'-bis(trimethylstannyl)-(1,2-bis(2'-thienyl)-1,2-diethoxyvinyl (132.0 mg, 0.22 mmol), and $PdCl_2(PPh_3)_2$ (6.1 mg, 0.0087 mmol) in anhydrous toluene (15 mL) was stirred at 90° C. for 1 hour. Bromobenzene (0.5 mL) was then added, and this mixture was stirred at 90° C. for 14 hours. After cooling to room temperature, the reaction mixture was poured into methanol (100 mL). This mixture was stirred at room temperature for 30 minutes, and the precipitate was collected by filtration, and washed with methanol and acetone. The isolated crude product was then subjected to Soxhlet extraction with methanol, acetone, and hexane. Finally, the product was extracted with chloroform. And, the extract was concentrated to about 10 mL, and the resulting mixtures were precipitated in methanol (100 mL), leading to a dark red solid (36.2 mg, 30.7%.).

EXAMPLE 1N

Synthesis of copolymer P(NDIEG3-ETOTVT)

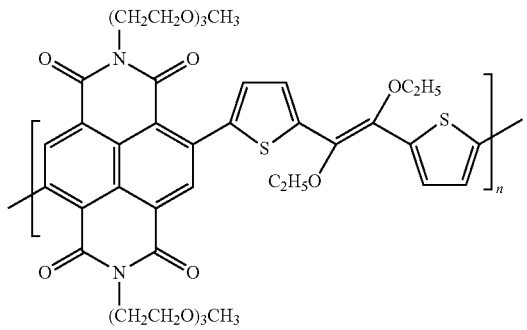

Under argon, a mixture of N,N'-bis(2-1-ethoxy-2-(2-methoxyethoxy)ethyl)-1,4,5,8-naphthalenedicarboximide (90 mg, 0.12 mmol), 5,5'-bis(trimethylstannyl)-(1,2-bis(2'-thienyl)-1,2-diethoxyvinyl (69.8 mg, 0.12 mmol), and $Pd(PPh_3)_2Cl_2$ (4.0 mg, 0.0057 mmol) in anhydrous toluene (15 mL) was stirred at 90° C. for 20 hours. Bromobenzene (0.5 mL) was then added and the resulting mixture was stirred at 90° C. for 16 hours. After cooling to room temperature, a solution of potassium fluoride (1.0 g) in water (2 mL) was added. This mixture was stirred and shaken at room temperature for 1 hour, before it was diluted with chloroform (100 mL). The resulting mixture was washed with water (80 mL), dried over anhydrous $Na_2SO_4$, and concentrated on a rotary evaporator. The residue was taken with chloroform (30 mL) and precipitated in methanol (100 mL). The precipitate was collected by filtration and redissolved in chloroform (30 mL). This chloroform solution was precipitated again in acetone (100 mL), leading to a dark blue solid as the crude product, which was purified by Soxhlet extraction with methanol and acetone. The isolated solid was dissolved in chloroform (40 mL), and this solution was heated to boil. Upon cooling to room temperature, the chloroform solution was passed through a syringe filter (5 µm), and the filtrate was precipitated in methanol (100 mL). The precipitate was collected by filtration, washed with methanol, and dried in vacuum, leading to dark blue solid (100 mg, 82%).

EXAMPLE 1O

Synthesis of copolymer P(BTI2OD-ETOTVT)

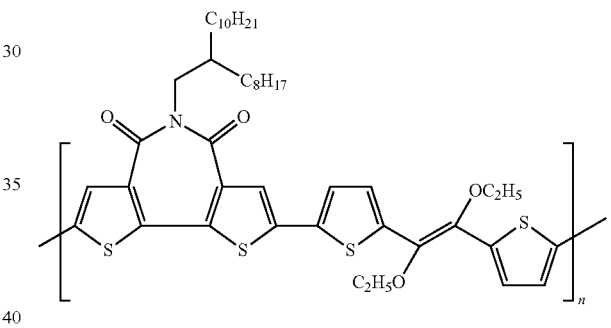

Under argon, a mixture of 2,8-dibromo-5-icosyl-4H-dithieno[3,2-c:2',3'-e]azepine-4,6(5H)-dione (85 mg, 0.12 mmol), 5,5'-bis(trimethylstannyl)-(1,2-bis(2'-thienyl)-1,2-diethoxyvinyl (69.8 mg, 0.12 mmol), and $Pd(PPh_3)_2Cl_2$ (4.0 mg, 0.0057 mmol) in anhydrous toluene (15 mL) was stirred at 90° C. for 20 hours. Bromobenzene (0.5 mL) was then added and the resulting mixture was stirred at 90° C. for 16 hours. After cooling to room temperature, a solution of potassium fluoride (1.0 g) in water (2 mL) was added. This mixture was stirred and shaken at room temperature for 1 hour, before it was diluted with chloroform (100 mL). The resulting mixture was washed with water (80 mL), dried over anhydrous $Na_2SO_4$, and concentrated on rotary evaporator. The residue was taken with chloroform (30 mL) and precipitated in methanol (100 mL). The precipitate was collected by filtration and redissolved in chloroform (30 mL). This chloroform solution was precipitated again in acetone (100 mL), leading to a dark purple solid as the crude product, which was purified by Soxhlet extraction with methanol and acetone. The isolated solid was dissolved in chloroform (40 mL), and this solution was heated to boil. Upon cooling to room temperature, the chloroform solution was passed through a syringe filter, and the filtrate was precipitated in methanol (100 mL).

The precipitate was collected by filtration, washed with methanol, and dried in vacuum, leading to a dark purple solid (85 mg, 80.0%).

EXAMPLE 1P

Synthesis of copolymer P(C12OT2-ETOTVT)

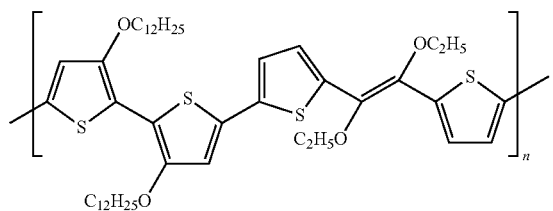

Under argon, a mixture of 5,5'-dibromo-3,3'-bis(dodecyloxy)-2,2'-bithiophene (84 mg, 0.12 mmol), 5,5'-bis(trimethylstannyl)-(1,2-bis(2'-thienyl)-1,2-diethoxyvinyl (69.8 mg, 0.12 mmol), and Pd(PPh$_3$)$_2$Cl$_2$ (4.0 mg, 0.0057 mmol) in anhydrous toluene (15 mL) was stirred at 90° C. for 20 hours. Bromobenzene (0.5 mL) was then added and the resulting mixture was stirred at 90° C. for 16 hours. After cooling to room temperature, a solution of potassium fluoride (1.0 g) in water (2 mL) was added. This mixture was stirred and shaken at room temperature for 1 hour, before it was diluted with chloroform (100 mL). The resulting mixture was washed with water (80 mL), dried over anhydrous Na$_2$SO$_4$, and concentrated on rotary evaporator. The residue was taken with chloroform (30 mL) and precipitated in methanol (100 mL). The precipitate was collected by filtration and redissolved in chloroform (30 mL). This chloroform solution was precipitated again in acetone (100 mL), leading to a dark purple solid as the crude product, which was purified by Soxhlet extraction with methanol and acetone. The isolated solid was dissolved in chloroform (40 mL), and this solution was heated to boil. Upon cooling to room temperature, the chloroform solution was passed through a syringe filter, and the filtrate was precipitated in methanol (100 mL). The precipitate was collected by filtration, washed with methanol, and dried in vacuum, leading to a dark purple solid (80 mg, 78%).

EXAMPLE 1Q

Synthesis of copolymer P(C12OTBT-ETOTVT)

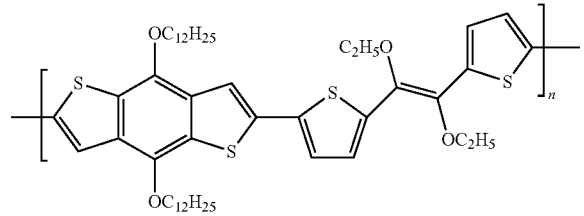

Under argon, a mixture of 2,6-dibromo-4,8-bisdodecyoxybenzo[1,2-b;3,4-b]dithiophene (214.6 mg, 0.31 mmol), 5,5'-bis(trimethylstannyl)-(1,2-bis(2'-thienyl)-1,2-diethoxyvinyl (189.9 mg, 0.31 mmol), and PdCl$_2$(PPh$_3$)$_2$ (9.0 mg, 0.013 mmol) in anhydrous toluene (20 mL) was stirred at refluxing for 2 days. Bromobenzene (0.5 mL) was then added, and this mixture was heated to reflux for 7 hours. After cooling to room temperature, the reaction mixture was poured into methanol (150 mL). This mixture was stirred at room temperature for 30 minutes, before the precipitate was collected by filtration. The isolated crude product was then subjected to Soxhlet extraction with methanol, acetone, and hexane. Finally, the product was extracted with chloroform. The extract was concentrated to about 50 mL, and this solution was precipitated in methanol (150 mL), leading to a dark red solid as the product (113.5 mg, 45.1%).

EXAMPLE 2

Polymer Characterization

EXAMPLE 2A

Optical Properties

Optical absorption measurements of embodiments of the present polymers were carried out using a Cary model spectrophotometer in chloroform solutions or as thin films. The optical data were used to estimate the bandgaps of the polymers, which are summarized in Table 1 below.

TABLE 1

| UV-Vis and CV characterization of polymers | | | |
|---|---|---|---|
| Polymer | HOMO (eV) | LUMO (eV) | E$_g$ (eV)* |
| P(NDI2OD-EtOTVT) | −5.30 | −3.88 | 1.42 |
| P(TS6-EtOTVT) | −5.21 | −3.27 | 1.94 |
| P(PH12-EtOTVT) | −5.45 | −3.32 | 2.13 |

*Optical bandgaps determined from the onset of absorption.

Figure 4:
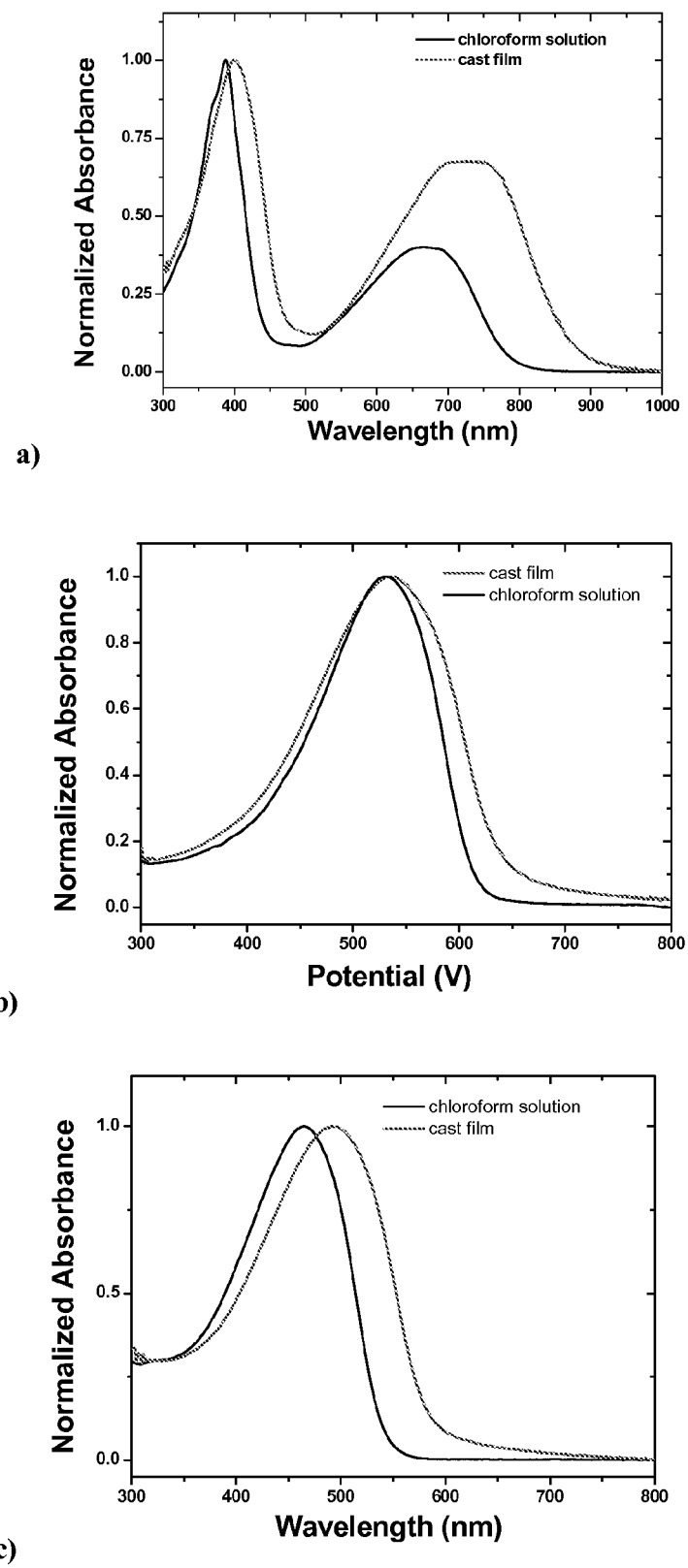
FIG. 4 shows representative optical absorption spectra of three exemplary compounds of the present teachings dissolved in $CHCl_3$ and as cast films.

FIG. 4 shows optical absorption spectra of (a) P(NDI2OD-EtOTVT), (b) P(TS6-EtOTVT), and (c) P(PH12-EtOTVT).

EXAMPLE 2B

Electronic Properties

Cyclic voltammetry measurements of certain polymers were carried out under nitrogen using a BAS-CV-50W voltammetric analyzer with 0.1 M tetra-n-butylammonium hexafluorophosphate in actonitrile as the supporting electrolyte. A platinum disk working electrode, a platinum wire counter electrode and a silver wire reference electrode were employed and Fc/Fc was used as reference for all measurements. The scan rate was 50 mV/S. Polymer films were produced by drop casting from 0.2% (w/w) toluene solutions. The supporting electrolyte solution was thoroughly purged with N$_2$ before all CV measurements.

Figure 5:
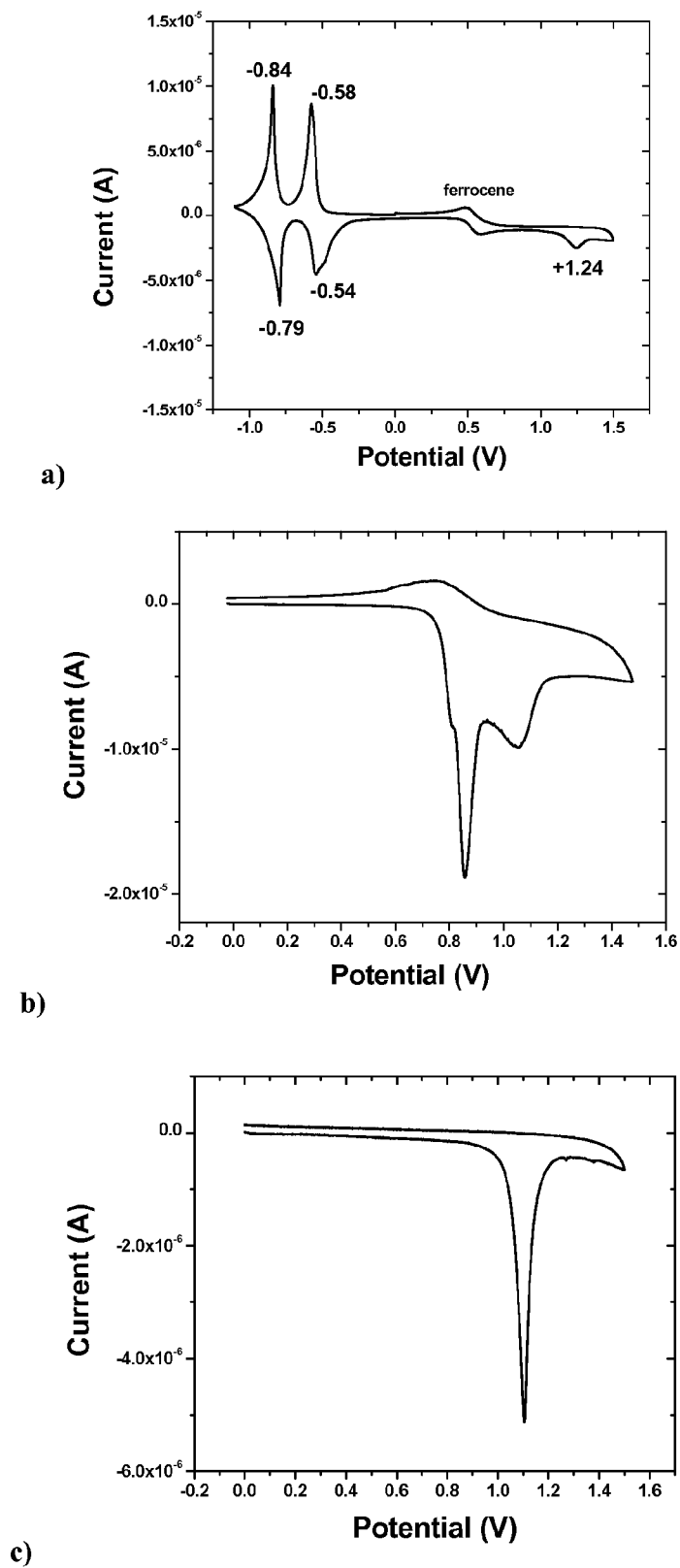
FIG. 5 shows representative cyclic voltammograms of three exemplary compounds of the present teachings. Conditions: 0.1 M $(n-Bu)_4N \cdot PF_6$ in acetonitrile; working electrode, Pt; counter electrode, Pt wire; reference electrode, Ag/AgCl; Scanning rate, 50 mV/s. Each voltammogram is overlaid with that of $Fc/Fc^+$.

FIG. 5 shows cyclic voltammograms of (a) P(NDI2OD-EtOTVT), (b) P(TS6-EtOTVT), and (c) P(PH12-EtOTVT).

EXAMPLE 3

Device Fabrication

Top-gate bottom-contact TFTs were fabricated on glass (PGO glass or other sources). The glass substrates were planarized, followed by thermal evaporation of Au source-drain contacts (30 nm thick). Channel lengths and widths are about 25-75 mm and about 0.5-1.5 mm, respectively. These substrates were then coated with the semiconductor layer deposited by spin-coating (concentration about 5-10 mg/ml in solvent). Typical semiconductor film thicknesses are about 40-120 nm. Next, a polymeric dielectric layer was spin-coated using the following conditions: PMMA (concentration about 60-80 mg/ml in EtOAc or PrOAc, 1,000-2,000 r.p.m.). The semiconductor and dielectric films were dried at 110° C. overnight in a vacuum oven (5 mtorr). The device structure was completed by vapor deposition of patterned Au gate contacts (30nm thick) through a shadow mask.

OTFT Characterization: I-V plots of device performance were measured under vacuum, and transfer and output plots were recorded for each device. The current-voltage (I-V) characteristics of the devices were measured using Keithley 6430 subfemtoammeter and a Keithly 2400 source meter, operated by a local Labview program and GPIB communication. Key device parameters, such as charge carrier mobility (ρ) and on-to-off current ratio ($I_{on}/I_{off}$), were extracted from the source-drain current ($I_{SD}$) versus source-gate voltage ($V_{SG}$) characteristics employing standard procedures. Mobilities were obtained from the formula defined by the saturation regime in transfer plots, $\mu=2I_{SD}L/[C_iW(V_{SG}-V_T)^2$ ], where $I_{se}$ is the source-drain current, $V_{SG}$ is source-gate voltage, $V_T$ is the threshold voltage. Threshold voltage was obtained from x intercept of $V_{SG}$ vs $I_{SD}^{1/2}$ plots. AFM measurements were performed by using a JEOL-Microscope (JEOL Ltd. Japan) in the tapping mode.

Figure 6:
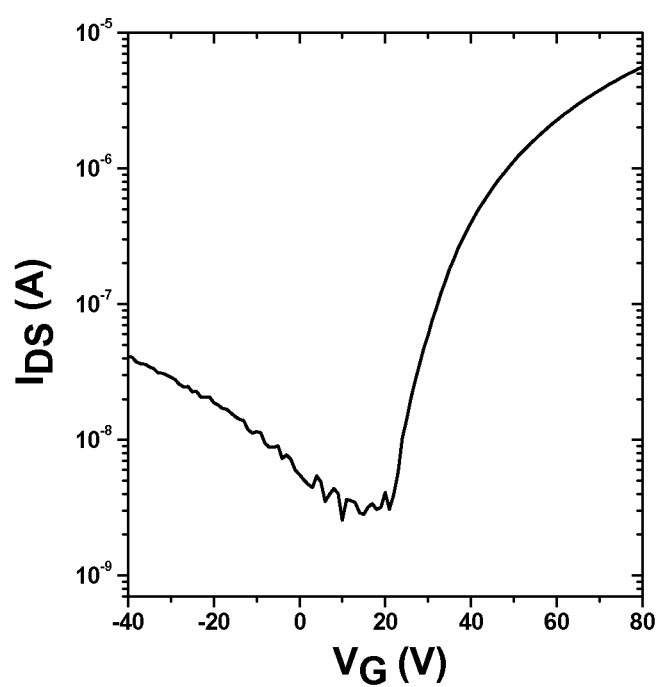
FIG. 6 shows a representative current-voltage (I-V) plot of an exemplary organic thin film transistor which incorporates a spin-coated thin film semiconductor layer prepared from a compound of the present teachings.

FIG. 6 shows a representative transfer plot of a top gate device that incorporates P(NDI2OD-EtOTVT) as the semiconductor material. The averaged mobility was observed to be about 0.15 cm²/Vs.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. An optical, electronic, or optoelectronic device comprising a semiconducting component, the semiconducting component comprising a polymer represented by the formula:

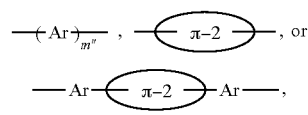

wherein:
$M^1$ has the formula:

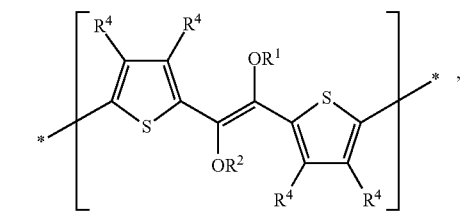

wherein:
$R^1$ and $R^2$ independently are a $C_{1-20}$ alkyl group or a $C_{1-20}$ haloalkyl group; and $R^4$, at each occurrence, independently is selected from H, a halogen, a $C_{1-20}$ alkyl group, a $C_{1-20}$ haloalkyl group, a $C_{1-20}$ alkoxy group, and a $C_{1-20}$ alkylthio group;

$M^2$ has the formula:

$$-(Ar)_{m''}-, \quad -\pi\text{-}2-, \quad \text{or}$$
$$-Ar-\pi\text{-}2-Ar-,$$

wherein:
each Ar independently is an optionally substituted 5-membered heteroaryl group;

π-2 is an optionally substituted 8-24 membered polycyclic heteroaryl group; and m" is 1, 2, 3, or 4;

n is an integer in the range of 5 to 10,000;

$0 < x < 1$, $0 < y < 1$, and the sum of x and y is about 1.

2. The device of claim 1, wherein $M^1$ is selected from:

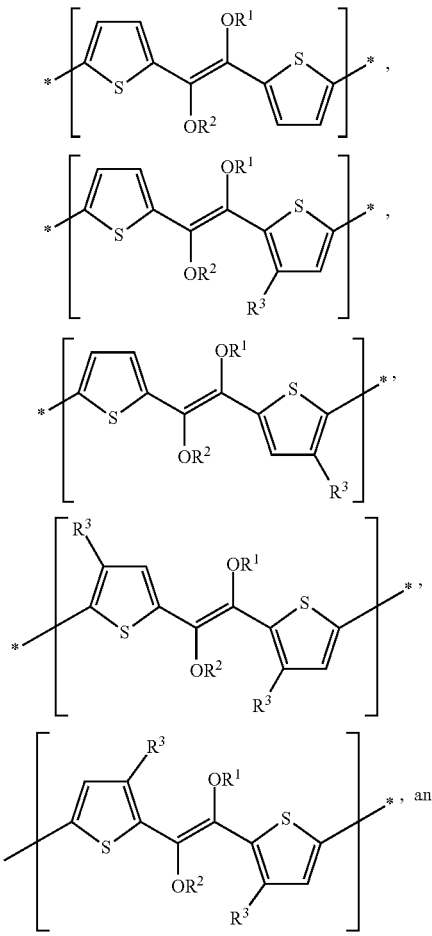

-continued

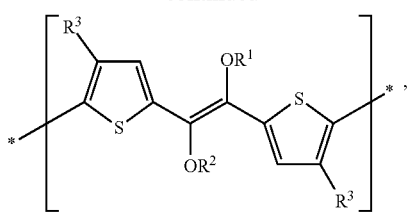

wherein $R^3$, at each occurrence, independently is selected from a halogen, a $C_{1-20}$ alkyl group, a $C_{1-20}$ haloalkyl group, a $C_{1-20}$ alkoxy group, and a $C_{1-20}$ alkylthio group.

3. The device of claim 1, wherein each of $R^1$ and $R^2$ is a $C_{1-10}$ alkyl group.

4. The device of claim 1, wherein each of $R^1$ and $R^2$ is $C_pH_{2p+1-q}F_q$, wherein;
   p is 1, 2, 3, 4, 5, 6, 7, 8, 9 or 10; and
   q is an integer in the range of 1 to 21, provided that q is less than or equal to 2p+1.

5. The device of claim 1, wherein $M^1$ is

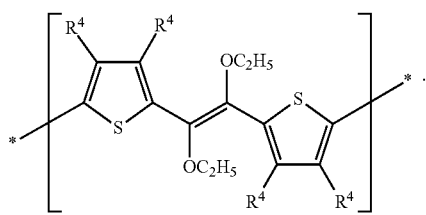

6. The device of claim 5, wherein $M^1$ is selected from:

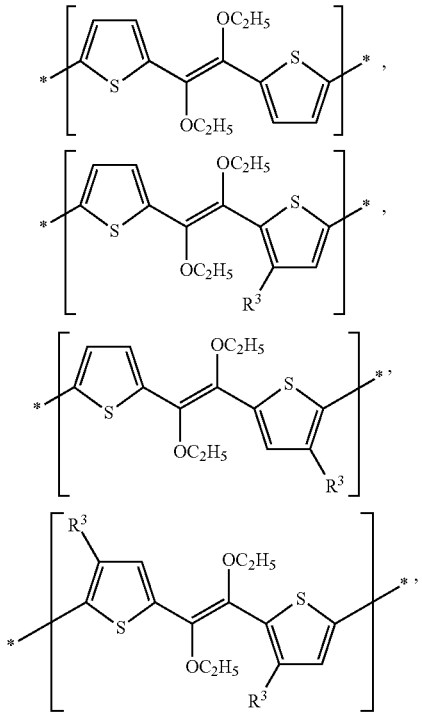

-continued

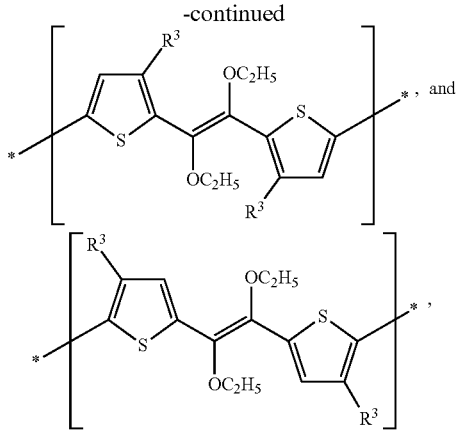

wherein $R^3$, at each occurrence, independently is selected from a halogen, a $C_{1-20}$ alkyl group, a $C_{1-20}$ haloalkyl group, a $C_{1-20}$ alkoxy group, and a $C_{1-20}$ alkylthio group.

7. The device of claim 1, wherein the polymer is an alternating copolymer represented by the formula:

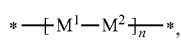

8. The device of claim 1, wherein the polymer is selected from:

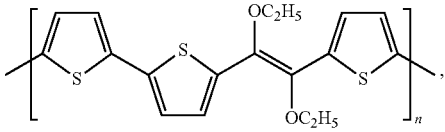

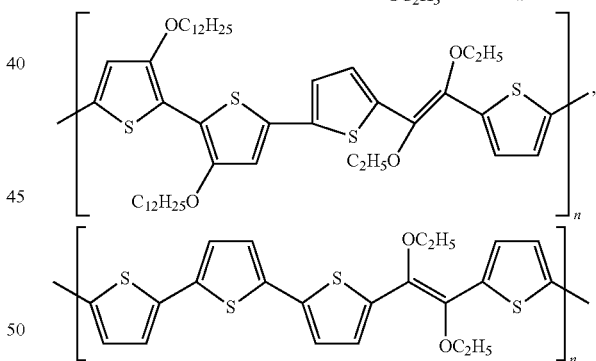

and

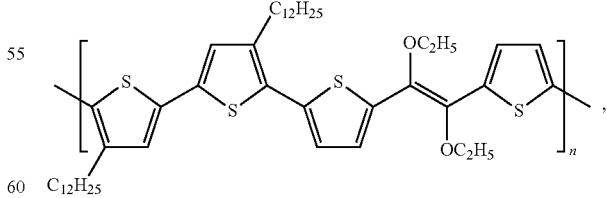

wherein n is an integer in the range of 5 to 10,000.

9. The device of claim 1 configured as a thin film transistor, wherein the semiconducting component is in contact with a dielectric component, a source electrode, and a drain electrode.

10. The device of claim 1 configured as a photovoltaic cell, wherein the semiconducting component is disposed between an anode and a cathode.

11. The device of claim 1, wherein the semiconducting component is provided as a single layer or a laminate comprising multiple layers.

12. The device of claim 1 configured as a light emitting transistor, wherein the semiconducting component is in contact with a dielectric component, a source electrode, and a drain electrode.

13. The device of claim 1, wherein the semiconducting component is capable of exhibiting a charge carrier mobility ($\mu$) of about $10^{-4}$ cm$^2$/V-sec or greater and/or a current on/off ratio ($I_{on}/I_{off}$) of about $10^3$ or greater.

14. The device of claim 1, wherein each Ar independently is a thienyl group optionally substituted with 1-2 R$^3$ groups, wherein R$^3$, at each occurrence, independently is selected from a halogen, a C$_{1-20}$ alkyl group, a C$_{1-20}$ haloalkyl group, a C$_{1-20}$ alkoxy group, and a C$_{1-20}$ alkylthio group.

15. The device of claim 1, wherein M$^2$ is

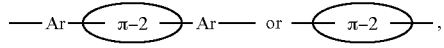

wherein:

each Ar independently is a thienyl group optionally substituted with 1-2 R$^3$ groups, wherein R$^3$, at each occurrence, independently is selected from a halogen, a C$_{1-20}$ alkyl group, a C$_{1-20}$ haloalkyl group, a C$_{1-20}$ alkoxy group, and a C$_{1-20}$ alkylthio group; and π-2 is selected from:

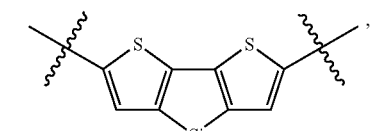

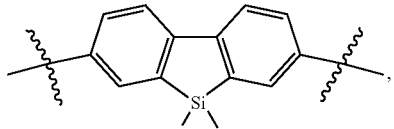

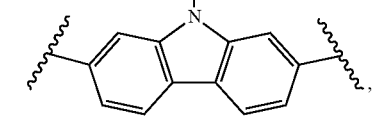

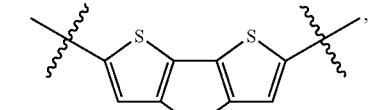

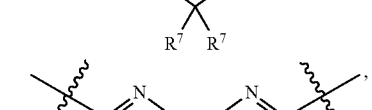

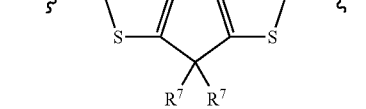

-continued

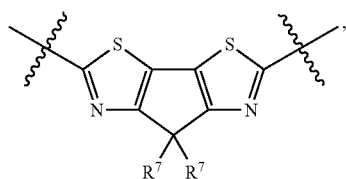

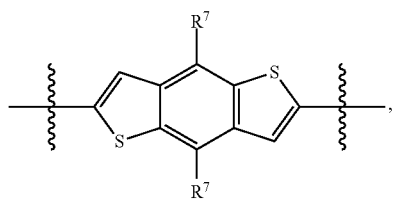

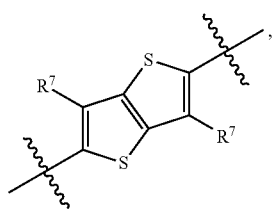

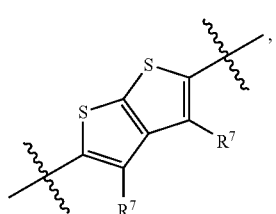

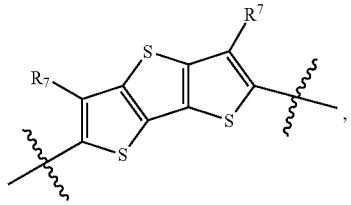

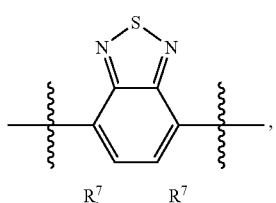

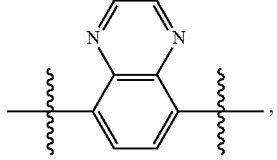

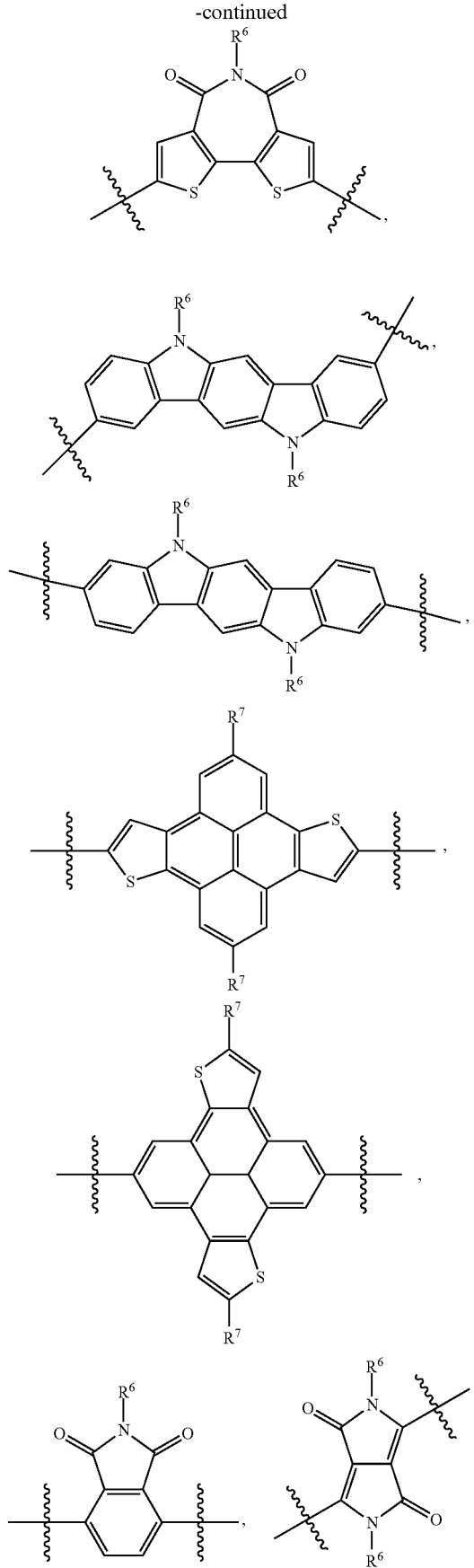

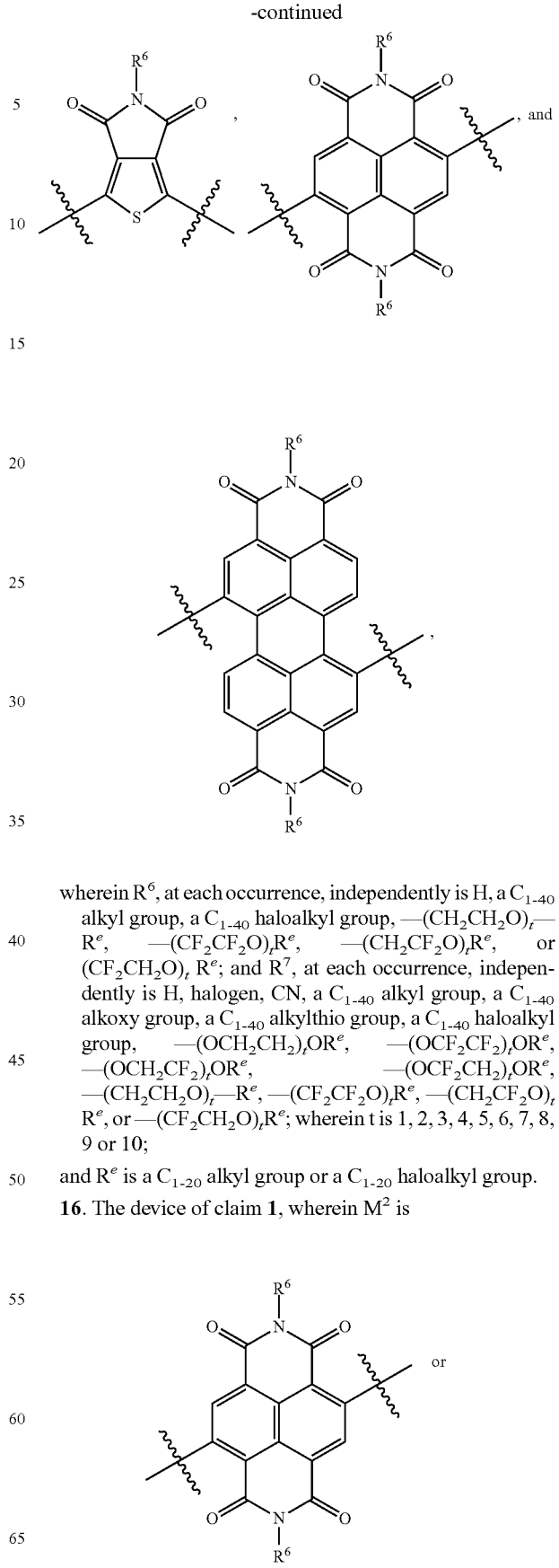

wherein R⁶, at each occurrence, independently is H, a $C_{1-40}$ alkyl group, a $C_{1-40}$ haloalkyl group, $-(CH_2CH_2O)_t-R^e$, $-(CF_2CF_2O)_tR^e$, $-(CH_2CF_2O)_tR^e$, or $(CF_2CH_2O)_tR^e$; and R⁷, at each occurrence, independently is H, halogen, CN, a $C_{1-40}$ alkyl group, a $C_{1-40}$ alkoxy group, a $C_{1-40}$ alkylthio group, a $C_{1-40}$ haloalkyl group, $-(OCH_2CH_2)_tOR^e$, $-(OCF_2CF_2)_tOR^e$, $-(OCH_2CF_2)_tOR^e$, $-(OCF_2CH_2)_tOR^e$, $-(CH_2CH_2O)_t-R^e$, $-(CF_2CF_2O)_tR^e$, $-(CH_2CF_2O)_tR^e$, or $-(CF_2CH_2O)_tR^e$; wherein t is 1, 2, 3, 4, 5, 6, 7, 8, 9 or 10;

and $R^e$ is a $C_{1-20}$ alkyl group or a $C_{1-20}$ haloalkyl group.

16. The device of claim 1, wherein M² is

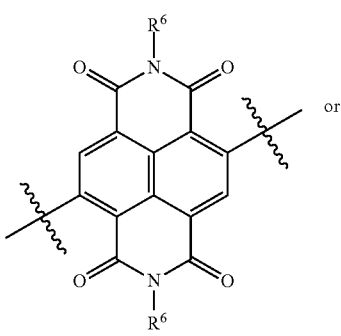

-continued
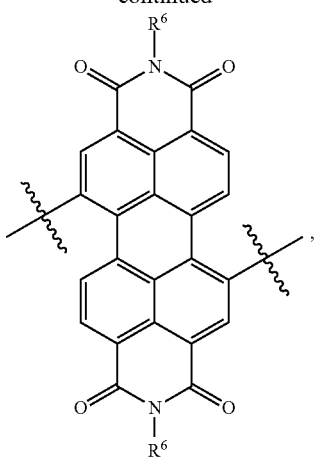
wherein R⁶ is a C₁₋₄₀ alkyl group.
17. The device of claim 1, wherein the polymer is selected from:
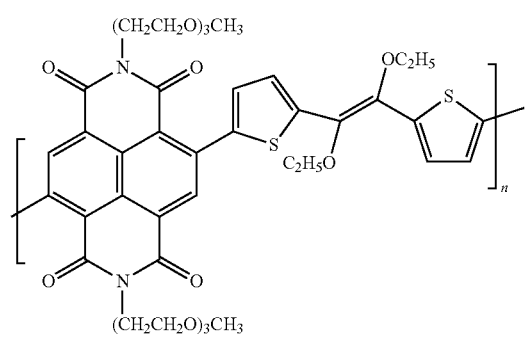
and
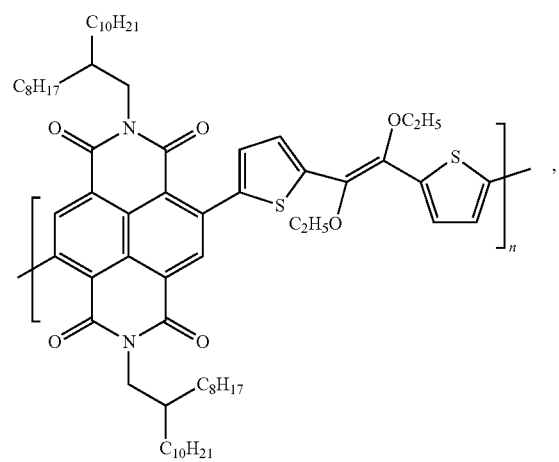
wherein n is an integer in the range of 5 to 10,000.
18. The device of claim 1, wherein the polymer is selected from:
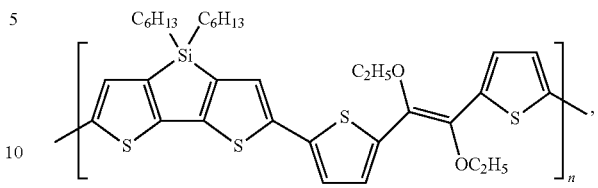
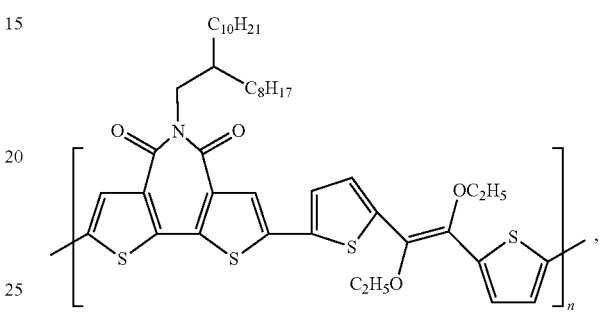
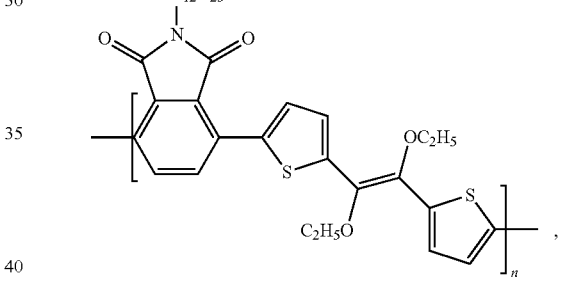
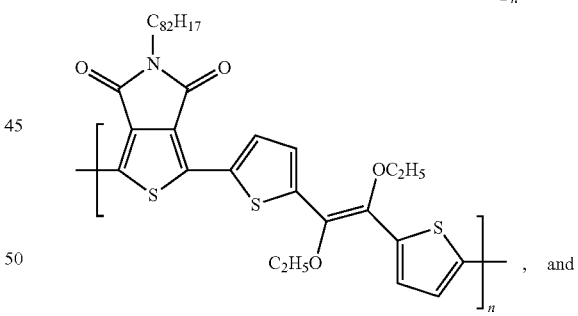
, and
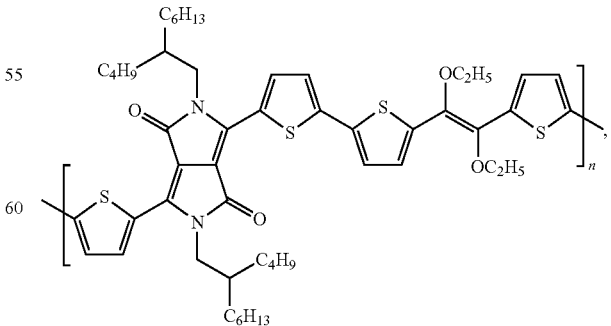
wherein n is an integer in the range of 5 to 10,000.

19. The device of claim 1, wherein the polymer is selected from:

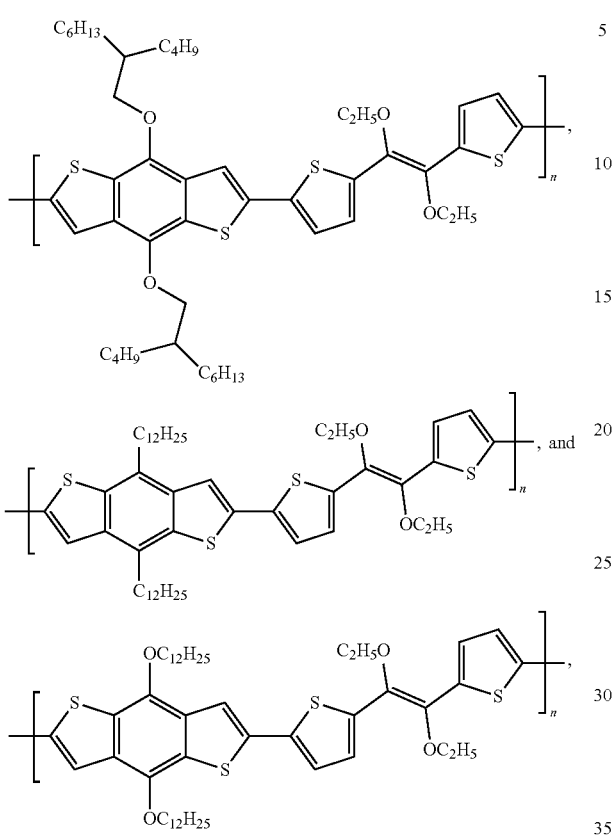

wherein n is an integer in the range of 5 to 10,000.

20. The device of claim 1, wherein $M^2$ is

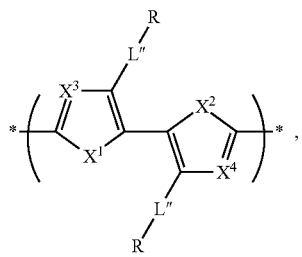

wherein:

L″, at each occurrence, independently is selected from —$CH_2$— and —O—;

R, at each occurrence, independently is selected from a $C_{1-40}$ alkyl group, a $C_{2-40}$ alkenyl group, a $C_{2-40}$ alkynyl group, and a $C_{1-40}$ haloalkyl group, wherein one or more non-adjacent $CH_2$ groups independently are optionally replaced by —O—, provided that O atoms are not linked directly to one another;

$X^1$ and $X^2$, at each occurrence, independently are selected from S, O, and Se; and $X^3$ and $X^4$, at each occurrence, independently are selected from N, CH, and CF.

* * * * *